United States Patent
Yoshikawa

(10) Patent No.: US 6,632,714 B2
(45) Date of Patent: Oct. 14, 2003

(54) METHOD FOR MANUFACTURING SEMICONDUCTOR MEMORY

(75) Inventor: Kuniyoshi Yoshikawa, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/858,459

(22) Filed: May 17, 2001

(65) Prior Publication Data

US 2003/0034518 A1 Feb. 20, 2003

Related U.S. Application Data

(62) Division of application No. 09/521,101, filed on Mar. 7, 2000, now Pat. No. 6,335,554.

(30) Foreign Application Priority Data

Mar. 8, 1999 (JP) .......................................... P11-060751
Sep. 16, 1999 (JP) .......................................... P11-262717
Mar. 2, 2000 (JP) ...................................... 2000-057642

(51) Int. Cl.$^7$ ............................................ H01L 21/336
(52) U.S. Cl. ....................... 438/258; 438/257; 438/261; 438/266; 438/267; 438/275; 438/300
(58) Field of Search ................................ 438/258, 257, 438/261, 266, 267, 275, 300, 981; 257/324, 314, 315, 316, 319, 326, 321, 637, 640, 900, 347, 57, 59; 365/182, 185, 218, 900

(56) References Cited

U.S. PATENT DOCUMENTS

| 4,881,108 A | | 11/1989 | Yoshikawa |
| 5,215,933 A | * | 6/1993 | Araki ........................ 438/143 |
| 5,312,518 A | * | 5/1994 | Kadomura .................. 438/723 |
| 5,378,910 A | * | 1/1995 | Yoshikawa ................. 257/319 |
| 5,408,115 A | | 4/1995 | Chang |
| 5,422,504 A | | 6/1995 | Chang et al. |
| 5,424,979 A | | 6/1995 | Morii |
| 5,768,192 A | | 6/1998 | Eitan |
| 5,780,341 A | | 7/1998 | Ogura |
| 5,969,383 A | | 10/1999 | Chang |
| 5,985,712 A | * | 11/1999 | Ooishi ........................ 438/231 |
| 6,030,869 A | | 2/2000 | Odake et al. |
| 6,040,995 A | | 3/2000 | Reisinger et al. |
| 6,087,698 A | * | 7/2000 | Saito et al. .................. 257/347 |
| 6,093,605 A | | 7/2000 | Mang et al. |
| 6,242,773 B1 | * | 6/2001 | Thomas ....................... 257/315 |
| 6,429,073 B1 | * | 8/2002 | Furuhata et al. ............. 438/258 |

FOREIGN PATENT DOCUMENTS

| JP | 03-188677 | 8/1991 |
| JP | 05-267679 | 10/1993 |
| JP | 07-226449 | 8/1995 |
| JP | 09-116032 | 5/1997 |
| JP | 10-261727 | 9/1998 |
| JP | 11-74389 | 3/1999 |

OTHER PUBLICATIONS

Ogura et al., "Low Voltage, Low Current, High Speed Program Step Split Gate Cell with Ballistic Direct Injection for EEPROM/Flash," IEDM, pp. 987–990 (1988).

(List continued on next page.)

Primary Examiner—Matthew Smith
Assistant Examiner—Victor V Yevsikov
(74) Attorney, Agent, or Firm—Finnegan, Henderson, Farabow, Garrett & Dunner, L.L.P.

(57) ABSTRACT

The present invention discloses the new structure with regard to a nonvolatile semiconductor memory which can store therein an information corresponding to a plurality of bits. The nonvolatile semiconductor memory according to the present invention has a charge trapping layer 4 for accumulating electrons, in an end of a gate electrode. In the nonvolatile semiconductor memory according to the present invention, the electrons are stored in this charge trapping layer 4 to thereby store the information corresponding to the plurality of bits.

26 Claims, 70 Drawing Sheets

OTHER PUBLICATIONS

Wann et al., "High Endurance Ultra–Thin Tunnel Oxide for Dynamic Memory Application," IDEM, pp. 867–870 (1995).

Bauer et al., "A Multilevel–Cell 32Mb Flash Memory," IEEE International Solid–State Circuits Conference, pp. 132–133 (Feb. 1995).

Ghani et al., "100 nm Gates Length High Performance/Low Power CMOS Transistor Structure," IEDM, pp. 415–418 (Dec. 1999).

Yoshikawa, K., *Embedded Flash Memories—Technology assessment and future—*, Proceedings of Technical Papers, 1999 International Symposium on VLSI Technology, Systems, and Applications, pp. 183–186, (Jun. 1999).

Yoon–Bae Kim, *Office Action, Korean Intellectual Property Office*, Notification of Submission of Argument(s) (Notification of Reason(s) for Refusal), 5 pages (Jan. 31, 2002) (Korean, Japanese and English).

* cited by examiner

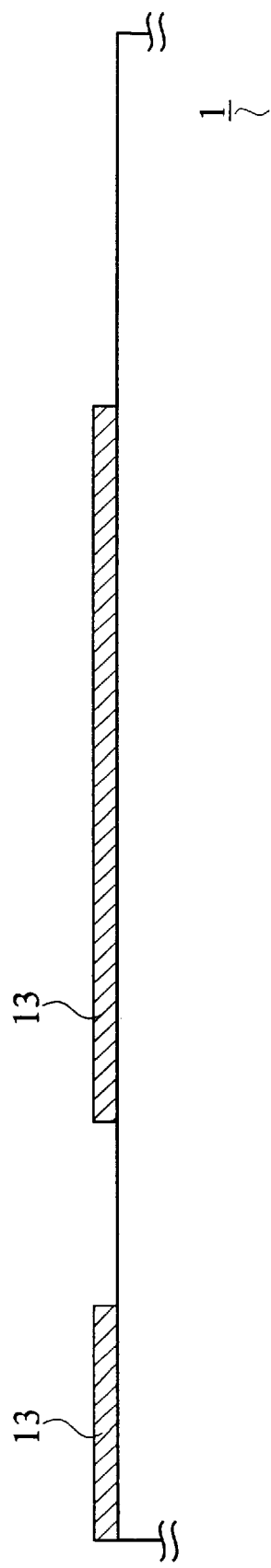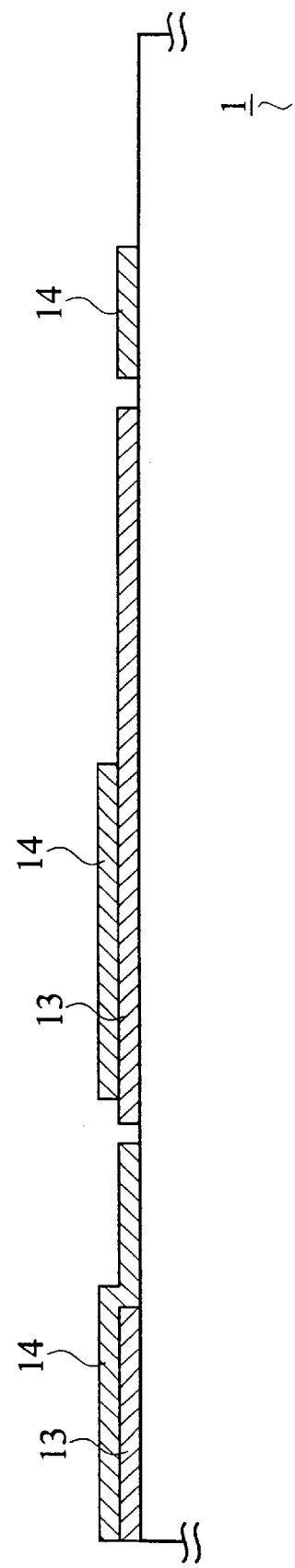

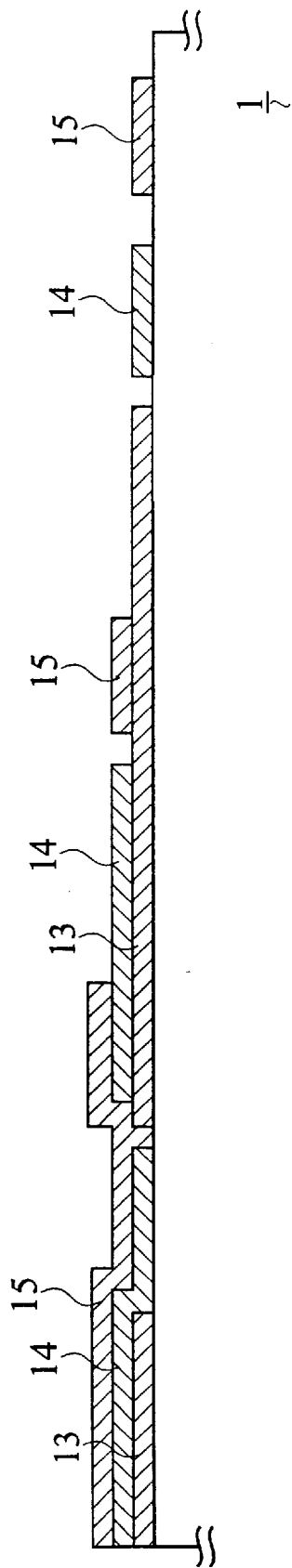
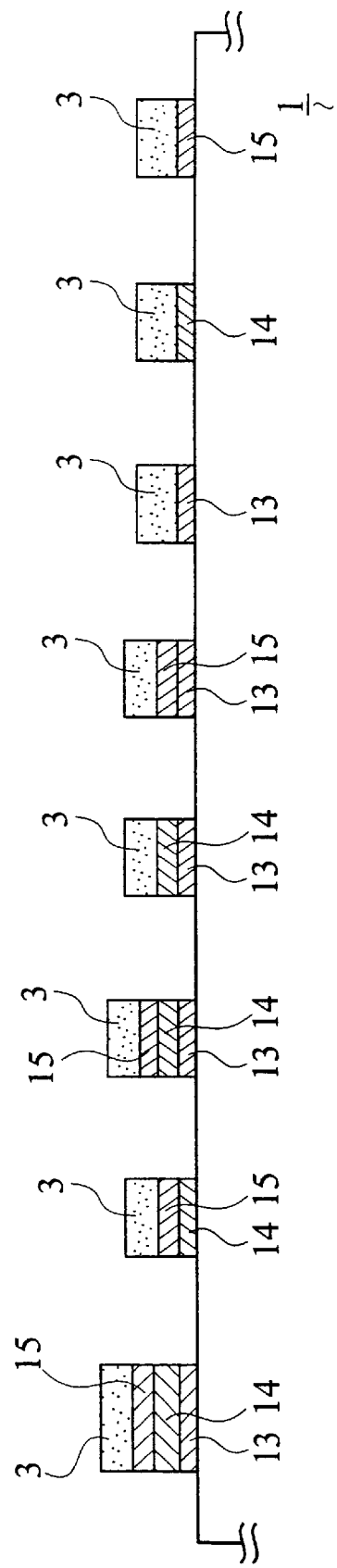

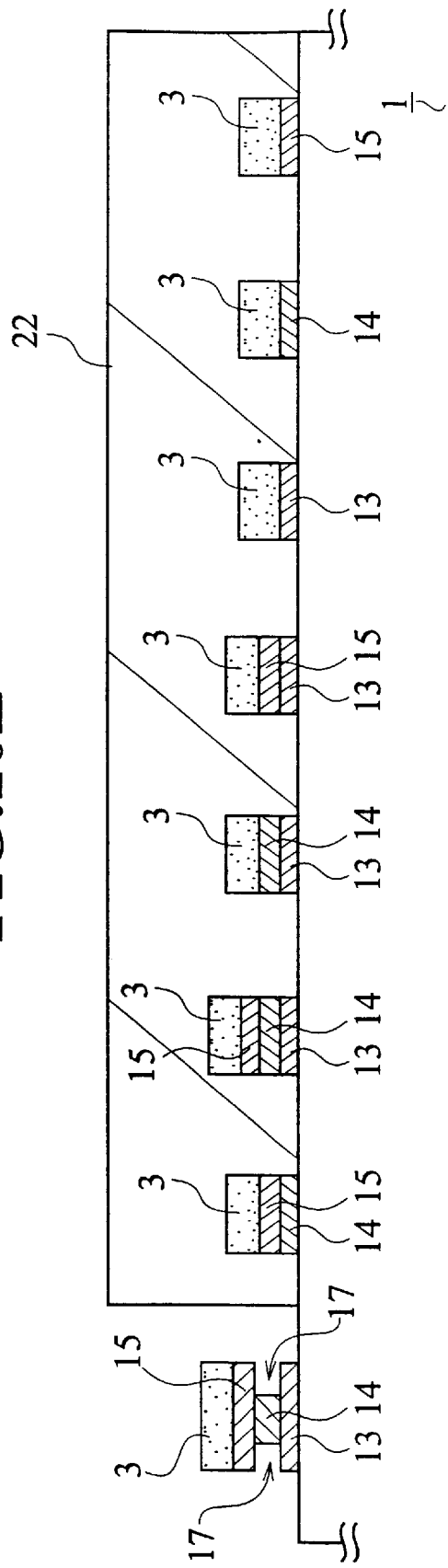
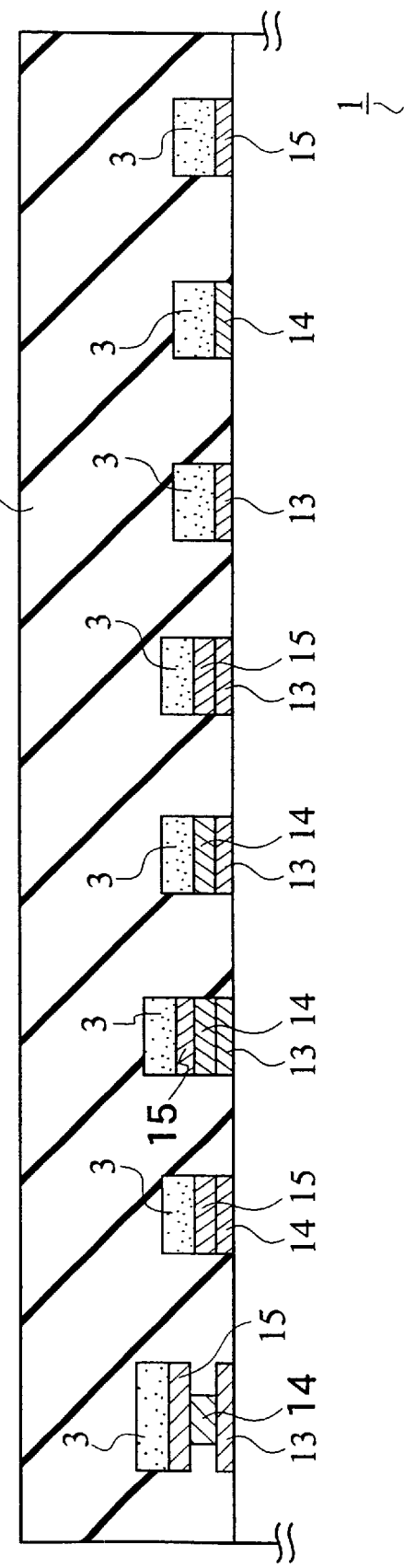

METHOD FOR MANUFACTURING SEMICONDUCTOR MEMORY

This is a division of application Ser. No. 09/521,101, filed Mar. 7, 2000 which is incorporated herein by reference and now U.S. Pat. No. 6,335,554.

BACKGROUND OF THE INVENTION

1. Field of the Invention

The present invention relates to an electrically writable and erasable nonvolatile semiconductor memory and a method for manufacturing the same, a rapidly writable and readable volatile semiconductor memory and a method for manufacturing the same, and a semiconductor memory in which a nonvolatile semiconductor memory and a volatile semiconductor memory are mixed on the same chip and a method for manufacturing the semiconductor memory.

2. Description of the Related Art

In a conventional nonvolatile memory such as EEPROM (Electrically Erasable and Programmable Read Only Memory) and the like, an information corresponding to one bit is stored in one cell by attaining two thresholds in one cell. On the contrary, in order to make a memory density higher, a technique in which four or more thresholds are assigned to one cell to then store an information corresponding to two or more bits in the one cell is proposed (M. Bauer et al., ISSCC95, p.132). However, the achievement of this technique requires the accurate control of a threshold voltage, the accurate detection of a minute change of a threshold voltage, and the reliability of charge maintenance which is more excellent than that of the conventional technique. Thus, in this technique, it is actually impossible to always obtain the performance equal to that of the conventional technique. Also, this technique has a problem that a manufacture yield is poor. For this reason, a cell structure in which charges are trapped in a plurality of positions that are physically different from each other to then store an information corresponding to a plurality of bits is newly proposed. (B. Eitan et al, IEDM96, p169, FIG. 6). Also, as the similar cell structure, a structure in which a charge trapping layer is formed on a side wall of a gate electrode is proposed by this inventor (U.S. Patent Publication No. 4881108). However, they have problems that the steps of manufacturing those cell structures are very complex and that the control of channel area is not sufficient.

On the other hand, a request of a recent system-on-chip increases a need that an electrically writable and erasable nonvolatile memory and a rapidly writable and readable volatile memory are formed on the same chip. Especially, a request of VLSI is suddenly increased in which a nonvolatile memory having a floating gate structure, such as the EEPROM, a flash memory and the like, and a rapidly operable dynamic RAM are mixed. However, a memory cell of a recent dynamic RAM has a three-dimension structure, which is very complex, such as a trench structure or a stack structure. For this reason, if the floating gate type nonvolatile memory and the dynamic RAM are mixed, the difference between their memory cell structures causes the manufacturing process to be complex and also causes the number of mask steps to be larger. Hence, the manufacturing cost of the mix chip becomes very expensive.

If the memory cell structure of the floating gate type nonvolatile memory is used to attain the memory cell of the dynamic RAM, the commonness with regard to the cell structures enables the manufacturing process to be simplified, which accordingly enables the drop of the manufacturing cost. However, it is difficult that the common memory cell attains the rapidly writing operation which is the feature of the dynamic RAM.

SUMMARY OF THE INVENTION

The present invention is proposed in view of the above mentioned circumstances. It is therefore an object of the present invention to provide a structure of a nonvolatile semiconductor memory which can store an information corresponding to a plurality of bits in a simple cell structure.

Another object of the present invention is to provide a method for manufacturing a nonvolatile semiconductor memory to manufacture a nonvolatile semiconductor memory for storing an information corresponding to a plurality of bits in a simple cell structure.

Still another object of the present invention is to provide a structure of a semiconductor memory in which an electrically writable and erasable nonvolatile memory and a rapidly writable and readable volatile memory are mixed, in a simply cell structure.

Still another object of the present invention is to provide a method for manufacturing a semiconductor memory in which an electrically writable and erasable nonvolatile memory and a rapidly writable and readable volatile memory are mixed, in a simply manufacturing process.

From the viewpoints of the above-mentioned objects, the first feature of the present invention lies in a nonvolatile semiconductor memory which at least comprises a first gate electrode formed on a main surface of a semiconductor substrate through a gate insulation film, a charge trapping layer formed on a side of the first gate electrode, a second gate electrode formed on the side of the first gate electrode through the charge trapping layer, and a conductive layer through which the first gate electrode and the second gate electrode are electrically connected.

The second feature of the present invention lies in a nonvolatile semiconductor memory which at least comprises a gate insulation film which is formed on a main surface of a semiconductor substrate and made of first, second and third insulation films, a charge trapping layer formed on an end of the second insulation film, and a gate electrode formed on the gate insulation film.

The third feature of the present invention lies in a semiconductor memory in which a nonvolatile semiconductor memory and a volatile semiconductor memory are mixed. Then, the nonvolatile semiconductor memory at least contains a first lower insulation film formed on a main surface of a semiconductor substrate, a first middle insulation film formed on an upper portion of a center in the first lower insulation film, a first charge trapping layer formed on an upper portion of an end of the first lower insulation film, a first upper insulation film formed on upper portions of the first middle insulation film and the first charge trapping layer, and a first gate electrode formed on an upper portion of the first upper insulation film. And, the volatile semiconductor memory at least contains a second lower insulation film which is formed on the main surface of the semiconductor substrate and made of the same material as the first middle insulation film, extremely thin insulation films formed on the main surface of the semiconductor substrate and both ends of the second lower insulation film, a second charge trapping layer which is formed on an upper portion of the extremely thin insulation film and made of the same material as the first charge trapping layer, a second upper insulation film which is formed on upper portions of the second lower insulation film and the second charge trapping layer and made of the same material as the first upper insulation film, and a second gate electrode formed on an upper portion of the second upper insulation film.

The fourth feature of the present invention lies in a semiconductor memory in which a nonvolatile semiconductor memory and a volatile semiconductor memory are mixed. Then, the nonvolatile semiconductor memory at least contains a first lower insulation film formed on a main surface of a semiconductor substrate, a first middle insulation film formed on an upper portion of a center in the first lower insulation film, a first charge trapping layer formed on an upper portion of an end of the first lower insulation film, a first upper insulation film formed on upper portions of the first middle insulation film and the first charge trapping layer, and a first gate electrode formed on an upper portion of the first upper insulation film. And, the volatile semiconductor memory at least contains an extremely thin insulation film formed on the main surface of the semiconductor substrate, a second charge trapping layer which is formed on the extremely thin insulation film and made of the same material as the first charge trapping layer, a second upper insulation film formed on the second charge trapping, and a second gate electrode formed on the second upper insulation film.

The fifth feature of the present invention lies in a nonvolatile semiconductor memory which at least comprises a convex portion or a concave portion formed on a main surface of a semiconductor substrate, a gate insulation film which is formed on the main surface of the semiconductor substrate containing the convex portion or the concave portion and composed of first, second and third insulation films, a charge trapping layer formed on an end of the second insulation film, and a gate electrode formed on the gate insulation film.

The sixth feature of the present invention lies in a nonvolatile semiconductor memory which at least comprises a convex portion or a concave portion formed on a main surface of a semiconductor substrate, a gate insulation film which is formed on the main surface of the semiconductor substrate containing the convex portion or the concave portion and composed of first and second insulation films, a charge trapping layer formed between the first and second insulation films, and a gate electrode formed on the gate insulation film.

The seventh feature of the present invention lies in a nonvolatile semiconductor memory which at least comprises a gate electrode formed on a main surface of a semiconductor substrate through a gate insulation film, a concave portion formed on an end of the gate electrode, and a charge trapping layer formed in the concave portion through an insulation film, wherein the charge trapping layers are formed on both upper portions in a channel area and a source drain area.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIGS. 10A to 10G are sectional views showing the steps of manufacturing the MOS transistor of FIG. 9;

DESCRIPTION OF THE PREFERRED EMBODIMENTS

Figure 1:
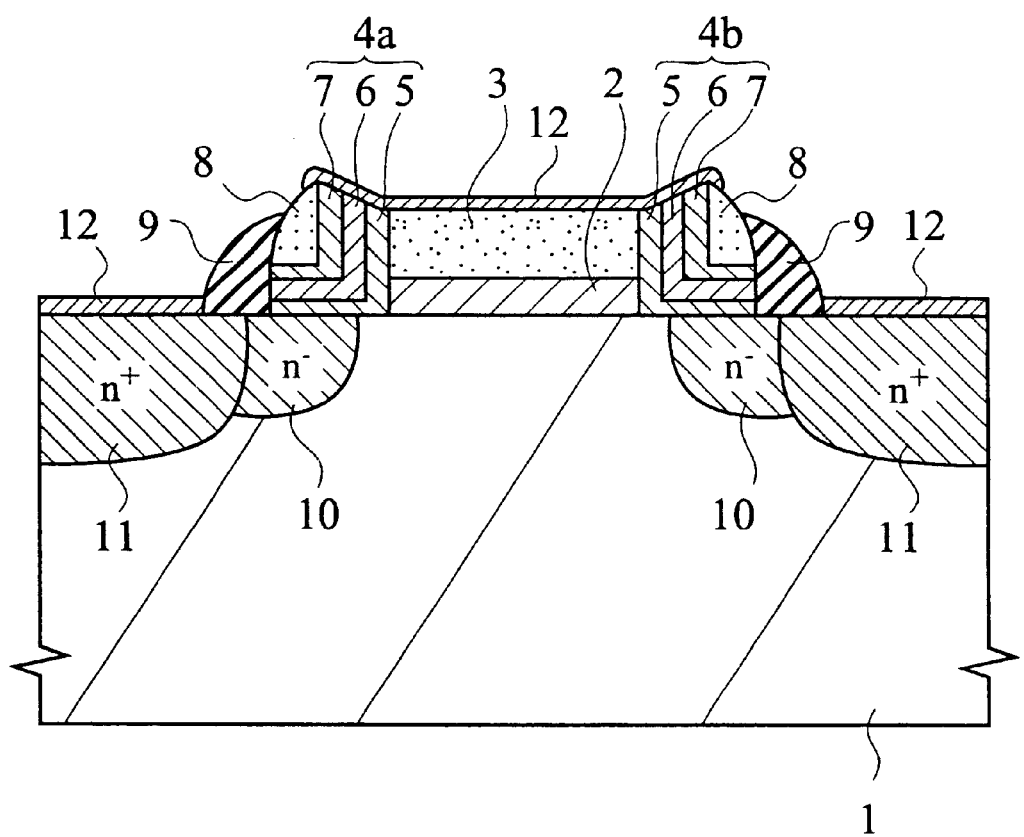
FIG. 1 is a sectional view showing a memory cell structure of a nonvolatile semiconductor memory according to a first embodiment of the present invention.

Various embodiments of the present invention will be described with reference to the accompanying drawings. In the drawings, the same or similar reference numerals are applied to the same or similar parts and elements. However, it is to be noted that the drawings are only diagrammatic and the relation between thicknesses and plane dimensions, a ratio of thickness of each layer and the like are different from those of actual cases. Thus, the actual thickness and dimension should be judged by considering the following explanations. Also, it is natural that the portions in which the ratio and the relation between the respective dimensions are different between the respective drawings are included First Embodiment FIG. 1 is a sectional view showing a memory cell structure of a nonvolatile semiconductor memory according to a first embodiment of the present invention. This memory cell is provided with an n-type MOS transistor. In the memory cell structure of the nonvolatile semiconductor memory according to the first embodiment of the present invention, a first gate electrode 3 is formed on a surface of a p-type semiconductor substrate 1 through a gate insulation film 2, and charge trapping layers 4 (4a, 4b) are formed on both sides of the first gate electrode 3. This charge trapping layer 4 has stacked structure. A first layer is composed of a first oxide film 5, a second layer is composed of a nitride film 6, and a third layer is composed of a second oxide film 7. Moreover, a second gate electrode 8 is formed on an upper portion of the charge trapping layer 4. A side wall spacer 9 is formed on a side of the charge trapping layer 4. An $n^-$-type diffusion layer 10 of a low impurity concentration adjacent to a channel area and an $n^+$-type diffusion layer 11 of a high impurity concentration located outside this $n^-$-type diffusion layer 10 are formed in the p-type semiconductor substrate 1 below this side wall spacer 9. Conductive layers 12 are formed on respective surfaces of the first gate electrode 3, the charge trapping layer 4, the second gate electrode 8 and the $n^+$-type diffusion layer 11. The first gate electrode 3 and the second gate electrode 8 are electrically connected to each other through the conductive layer 12.

The memory cell of the nonvolatile semiconductor memory according to the first embodiment of the present invention has LDD (Lightly Doped Drain) structure in which a source area and a drain area are constituted by the $n^-$-type diffusion layers 10 of the low impurity concentration and the $n^+$-type diffusion layers 11 of the high impurity concentration. Then, the charge trapping layers 4 are formed on both the sides of the first gate electrode 3. The change amounts of a threshold voltage caused by the presence or absence of electrons held in the nitride films 6 of the two charge trapping layers 4 are correlated with "00", "01", "10" and "11" of a memory information, respectively. Moreover, the second gate electrode 8 is formed on the upper portion of the charge trapping layer 4, and then the second gate electrode 8 is electrically connected to the first gate electrode 3, which accordingly improves the control performance of the channel area and also enables the change of the threshold voltage to be easily detected.

Figure 2A:
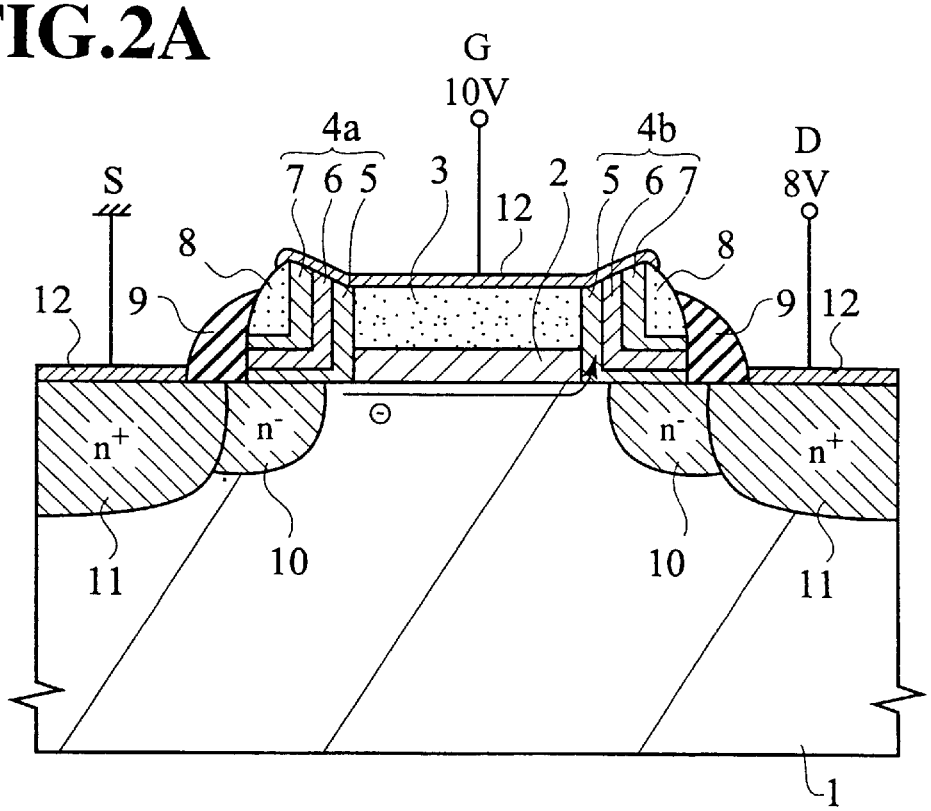
FIG. 2A is a sectional view describing the operation of the nonvolatile semiconductor memory according to the first embodiment of the present invention.
Figure 2B:
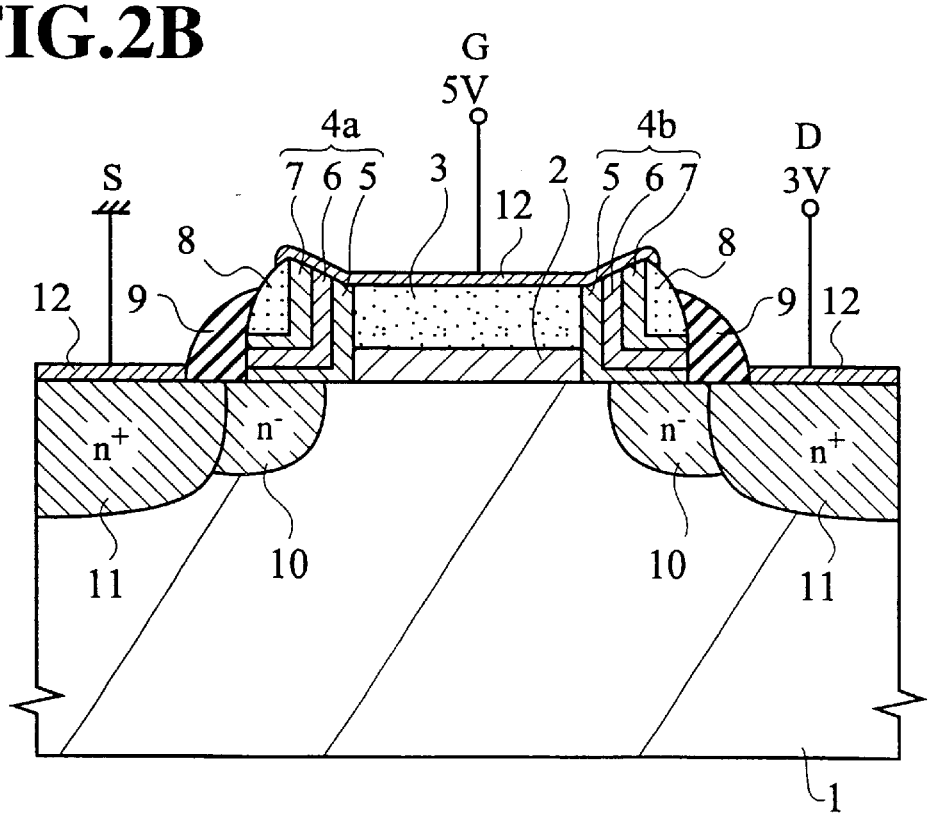
FIG. 2B is a sectional view describing the operation of the nonvolatile semiconductor memory according to the first embodiment of the present invention.
Figure 2C:
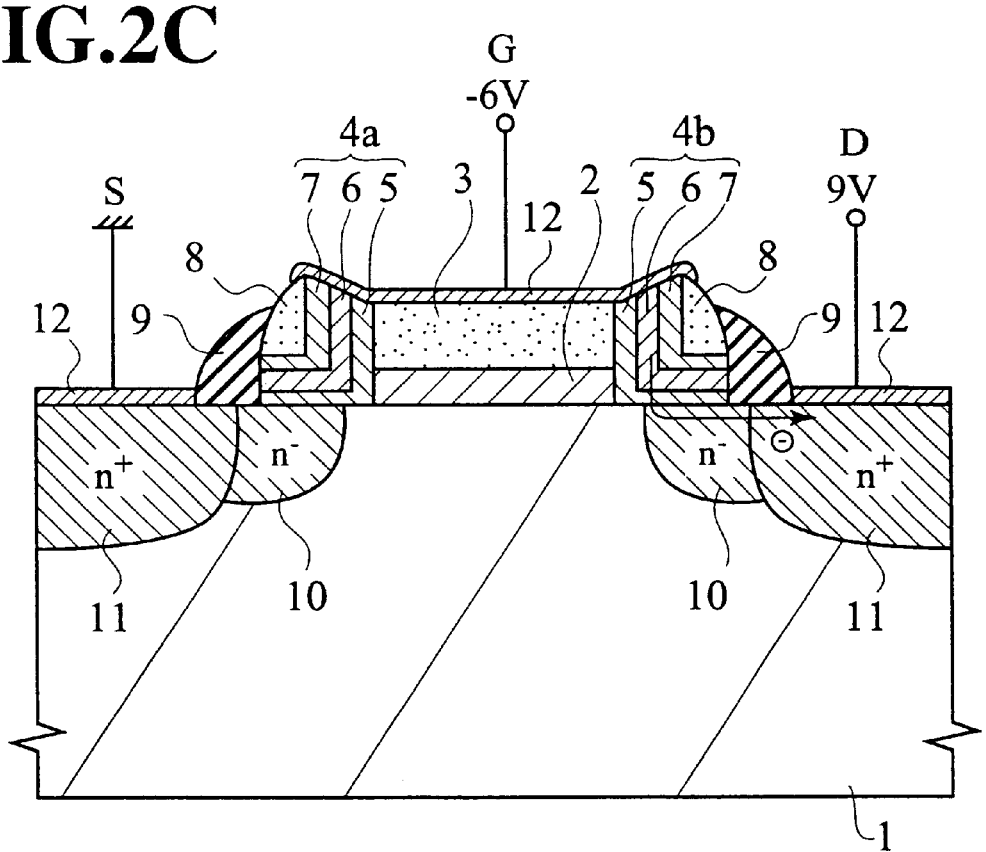
FIG. 2C is a sectional view describing the operation of the nonvolatile semiconductor memory according to the first embodiment of the present invention.

The operation of the nonvolatile memory according to the first embodiment of the present invention will be described below with reference to FIGS. 2A to 2C. FIG. 2A is a sectional view of the nonvolatile memory describing a writing operation. FIG. 2B is a sectional view of the nonvolatile memory describing a reading operation. And, FIG. 2C is a sectional view of the nonvolatile memory describing an erasing operation. As shown in FIG. 2A, when the memory cell is written, a high voltage (~10V) is applied to a gate G, a high voltage (~8V) is simultaneously applied to a drain D close to the charge trapping layer 4b for accumulating the electrons, and a source S which is not close is grounded. Such application of the voltage causes a channel hot electron to be generated. This channel hot electron is captured in the nitride film 6 of the charge trapping layer 4b. The capture of the electron in the charge trapping layer 4b causes a threshold voltage of a cell transistor to be changed. The memory cell is read out by detecting the change of the threshold voltage. Actually, as shown in FIG. 2B, a voltage of 5V is applied to the gate G, a voltage of 3V is simultaneously applied to the drain D, and a difference between currents is detected by a sense amplifier. Also, as shown in FIG. 2C, the memory cell is erased by applying a negative voltage (~-6V) to the gate G, applying a positive voltage (~9V) to a drain D close to the charge trapping layer 4b to be erased, and emitting the electron captured in the charge trapping layer 4b. In addition, as well known, the source S and the drain D of the MOS transistor are configured in symmetry. Typically, the source S and the drain D can be interchanged. Thus, the source S and the drain D can be interchanged also in the above-mentioned explanation.

Figure 3A:
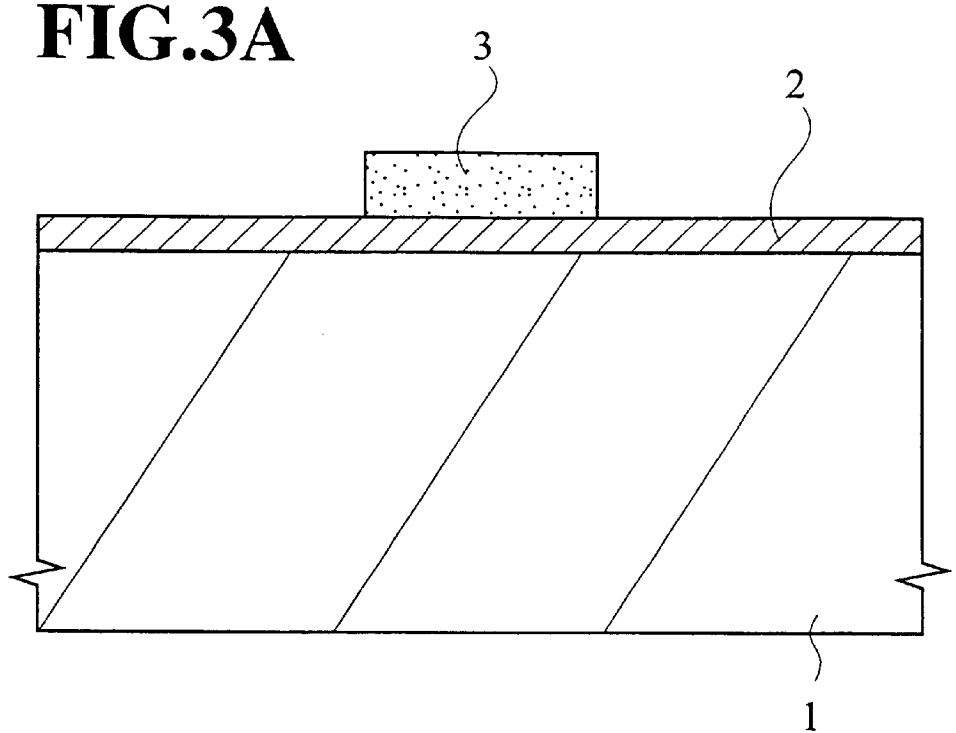
FIGS. 3A to 3E are sectional views showing the steps of manufacturing the memory cell of the nonvolatile semiconductor memory according to the first embodiment of the present invention.

The method for manufacturing the memory cell of the nonvolatile semiconductor memory according to the first embodiment of the present invention will be described below with reference to FIGS. 3A to 3E. As shown in FIG. 3A, a gate insulation film 2 of 25 nm is firstly formed on a p-type semiconductor substrate 1 by using thermal oxidation. In succession, polysilicon film of 300 nm doped with n-type or p-type impurity is deposited on the whole surface of the p-type semiconductor substrate 1 by using an LPCVD (Low Pressure Chemical Vapor Deposition) method. After that, it is patterned by using the well known exposure and etching techniques to accordingly form the first gate electrode 3.

Figure 3B:
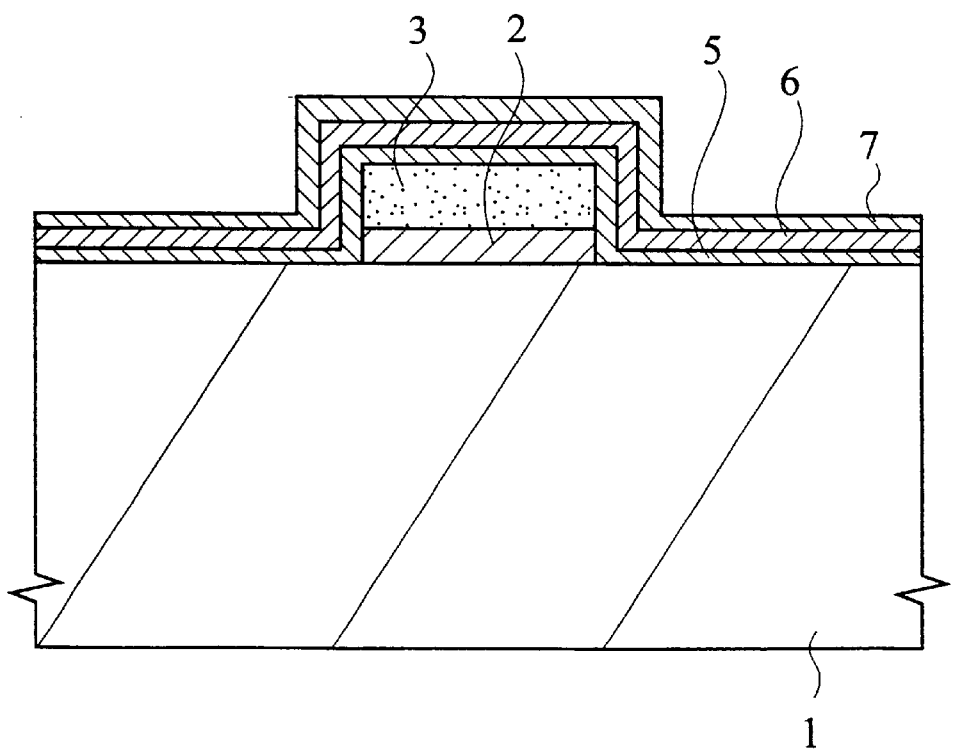

Next, as shown in FIG. 3B, after the removal of the gate insulation film 2 on the surface of the p-type semiconductor substrate 1 in the area in which the source and drain areas are formed, the p-type semiconductor substrate 1 is thermally oxidized in oxidation atmosphere at 900° C. to 1200° C. to accordingly form a first oxide film 5 of 10 nm. Then, a nitride film 6 of 10 nm to 100 nm is deposited on the first oxide film 5 by using the LPCVD method. After that, a second oxide film 7 of about 5 nm is formed on the surface of the nitride film 6 by using hydrogen combustion oxidation of 900° C. or a CVD method.

Figure 3C:
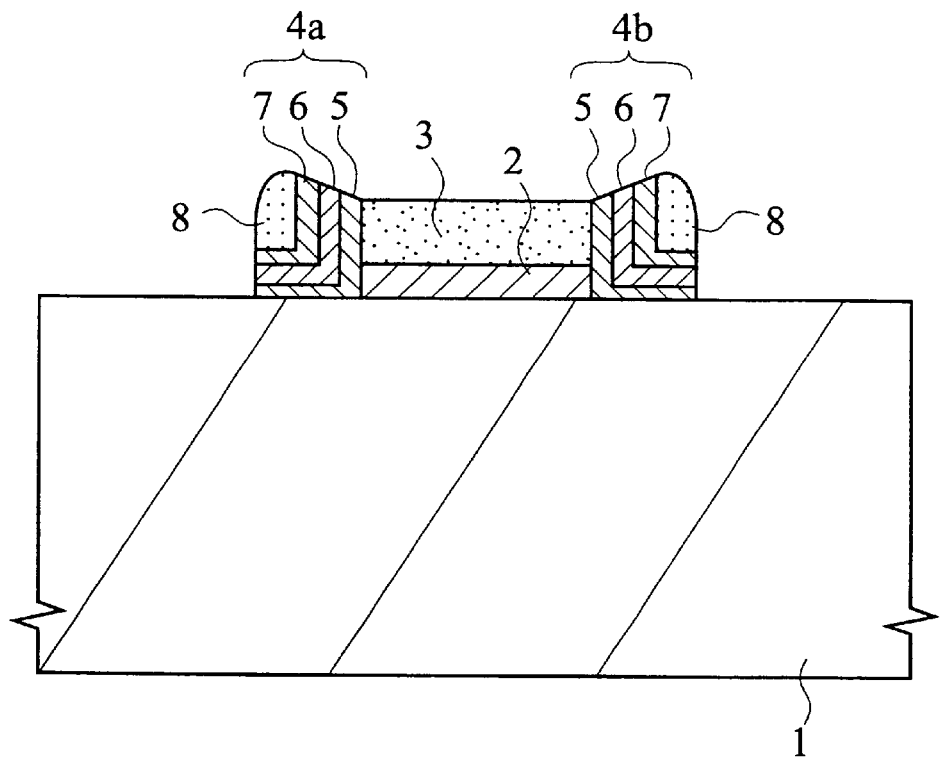

Next, as shown in FIG. 3C, after polysilicon of about 25 to 250 nm is deposited on the second oxide film 7 by using, for example, the LPCVD method, anisotropic etching is carried out by using an RIE (Reactive Ion Etching) method. Then, the polysilicon film, the first oxide film 5, the nitride film 6 and the second oxide film 7 are removed by the amounts corresponding to their film thicknesses, respectively. Accordingly, the charge trapping layer 4 having the second gate electrode 8 on the upper portion is formed on the side of the first gate electrode.

Figure 3D:
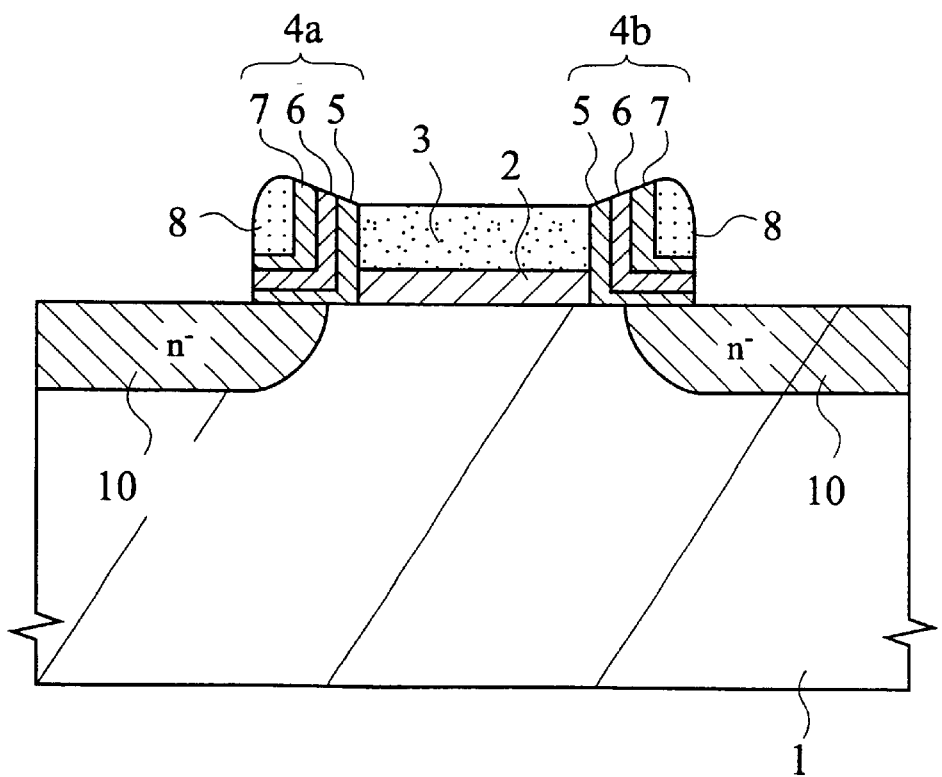

Next, as shown in FIG. 3D, an n⁻-type diffusion layer 10 of a low impurity concentration is formed. The n⁻-type diffusion layer 10 is formed by implanting n-type impurity, with the first gate electrode 3 and the charge trapping layer 4 as mask, by using an ion implantation technique and, then activating impurity implanted by a thermal treatment after the ion implantation.

Figure 3E:
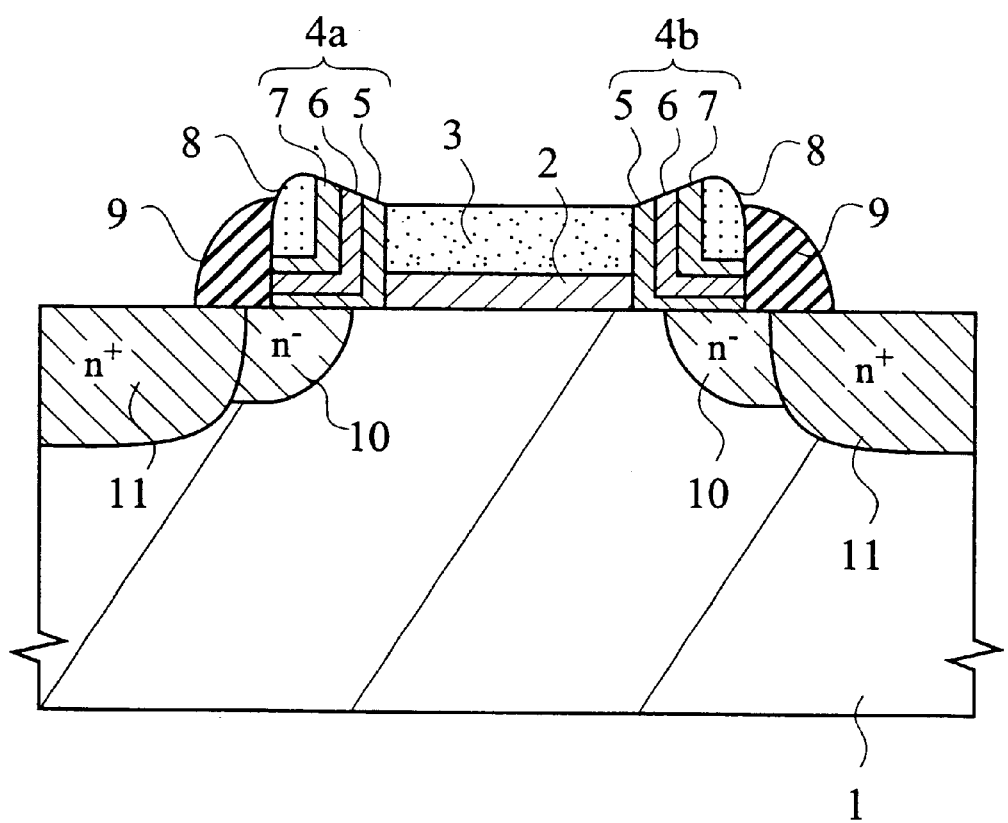

Next, as shown in FIG. 3E, an n⁺-type diffusion layer 11 of a high impurity concentration is formed after a side wall spacer 9 is formed on a side wall of the charge trapping layer 4. The n⁺-type diffusion layer 11 is formed by implanting n-type impurity, with the first gate electrode 3, the charge trapping layer 4 and the side wall spacer 9 as mask, by using the ion implantation technique, and then activating impurity implanted by the thermal treatment after the ion implantation.

Next, high melting point metallic film, such as tungsten, titanium, cobalt and the like, is deposited on the whole surface of the p-type semiconductor substrate 1 by using the CVD method or a sputtering method. In succession, thermal treatment in inactive atmosphere is performed on the p-type semiconductor substrate 1. Accordingly, conductive layers 12 made of high melting point metallic silicide are formed on the respective surfaces of the first gate electrode 3, the charge trapping layer 4, the second gate electrode 8 and the n⁺-type diffusion layer 11. At this time, the film thicknesses of the first oxide film 5, the nitride film 6 and the second oxide film 7, especially the film thickness of the nitride film 6, need to be set such that the high melting point metallic silicide layers on the first gate electrode 3 and the second gate electrode 8 are bridged. The memory cell structure shown in FIG. 1 is completed if the non-reacted high melting point metal which remains in areas other than the above-mentioned areas is removed after the formation of the conductive layers 12.

In addition, although not shown, the final nonvolatile memory cell is completed through the normal steps of manufacturing CMOS, such as a step of forming an inter-layer insulation film, a step of forming a contact hole, a step of forming a wiring, a step of forming a passivation film and the like, in succession, after the completion of the memory cell structure in FIG. 1.

According to the first embodiment of the present invention, the second gate electrode 8 is also formed on the upper portion of the charge trapping layer 4 to thereby improve the control performance of the threshold voltage. Incidentally, the case that the memory cell is constituted by the n-type MOS transistor is described in the first embodiment of the present invention. However, the similar effect can be obtained even in the case that the memory cell is constituted by the p-type MOS transistor. In addition, although the memory cell has the LDD structure, it may have a single-drain structure or a double-drain structure.

Second Embodiment

Figure 4:
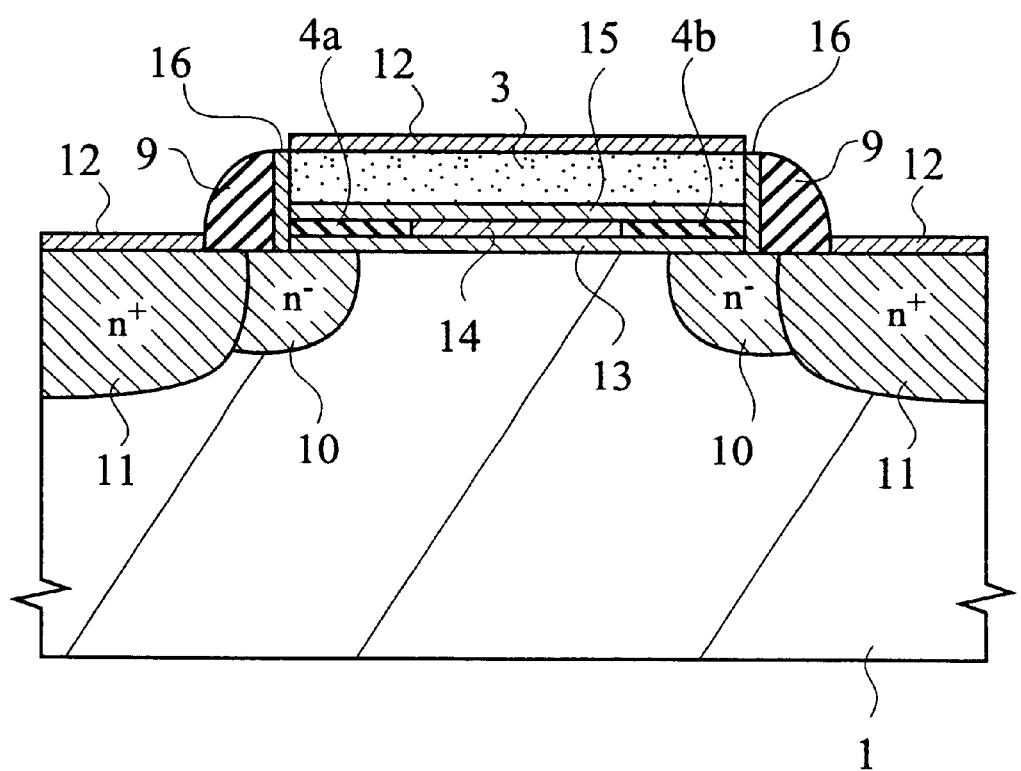
FIG. 4 is a sectional view showing a memory cell structure of a nonvolatile semiconductor memory according to a second embodiment of the present invention.

A second embodiment of the present invention will be described below. FIG. 4 is a sectional view showing a memory cell structure of a nonvolatile semiconductor memory according to the second embodiment of the present invention. This memory cell is provided with the n-type MOS transistor. In the memory cell structure of the non-volatile memory according to the second embodiment of the present invention, a second gate insulation film 14 is formed on a surface of a p-type semiconductor substrate 1 through a first gate insulation film 13. And, charge trapping layers 4a, 4b are formed on both ends of the second gate insulation film 14. A gate electrode 3 is formed on the second gate insulation film 14 and the charge trapping layers 4a, 4b through a third gate insulation film 15. A side wall spacer 9 is formed on a side of the gate electrode 3 through an oxide film 16. An n⁻-type diffusion layer 10 of a low impurity concentration adjacent to a channel area and an n⁺-type diffusion layer 11 of a high impurity concentration located outside this n⁻-type diffusion layer 10 are formed in a p-type semiconductor substrate 1 below this side wall spacer 9. Conductive layers 12 are formed on the respective surfaces of the gate electrode 3 and the n⁺-type diffusion layer 11.

The memory sell of the nonvolatile semiconductor memory according to the second embodiment of the present invention has the LDD structure in which the source and drain areas are constituted by the n⁻-type diffusion layers 10 of the low impurity concentration and the n⁺-type diffusion layers 11 of the high impurity concentration. Then, the gate insulation film is constituted by the three-layer stacked film composed of the first gate insulation film 13 (bottom layer), the second gate insulation film 14 (middle layer) and the third gate insulation film 15 (top layer). The charge trapping layers 4a, 4b are formed on both the ends of the second gate insulation film 14. Electrons are trapped in those two charge trapping layers 4a, 4b. Its trapping state may include the following four states: (1) a state that the electrons are not trapped in any one of the charge trapping layers 4a, 4b; (2) a state that the electrons are trapped in only the charge trapping layer 4a; (3) a state that the electrons are trapped in only the charge trapping layer 4b; and (4) a state that the electrons are trapped in both the charge trapping layers 4a, 4b. The change amounts of the threshold voltage caused by the presence or absence of the electrons held in those two charge trapping layers 4a, 4b are correlated with "00", "01", "10" and "11" of a memory information, respectively. In this memory cell structure, the charge trapping layers 4a, 4b are positioned on the upper portion of the end of the channel area. Thus, a threshold voltage at a center of the channel area is determined only by an impurity concentration of the channel area, and does not depend on the trapping state of the electrons in the charge trapping layers 4a, 4b. Hence, the over-erasure caused by the excess or deficiency of the electrons in the charge trapping layers 4a, 4b can be protected so that a leakage trouble, a program defect, a read out error and the like are never induced because of the over-erasure. Also, a leakage current between the source and drain areas can be suppressed only by a gate voltage to thereby manufacture a nonvolatile semiconductor memory of high reliability. The charge trapping layers 4a, 4b may be made of silicon nitride film having a high charge trapping ability by using the CVD method. This is because the trapping of the electrons at a discrete charge capture level in the silicon nitride film enables the charge retention capability having little influence on film quality of the lower insulation film. Also, if it is made of silicon film or polysilicon film, it can be manufactured at a low cost. Moreover, if the first gate insulation film 13 and the third gate insulation film 15 are made of silicon nitride film ($Si_3N_4$ film) having a dielectric constant equal to about two times that of silicon oxide film ($SiO_2$ film), it is possible to stably form a very thin gate insulation film in which a film thickness calculated in terms of silicon oxide film is about 4 nm to 11 nm. For example, since a substantial film thickness of silicon nitride film with the equivalent silicon oxide thickness is 5 nm is about 10 nm, a direct tunnel (DT) injection is never induced. Therefore, a voltage at a time of an injection and ejection operation of electrons is made lower, which not only enables the memory cell to be hyperfine, but also enables a peripheral high voltage operation element to be hyperfine.

In the memory cell of the nonvolatile semiconductor memory according to the second embodiment of the present invention, the n⁻-type diffusion layer 10 is formed, and then the LDD structure is configured, in order to improve the breakdown voltages of the source and drain areas. However, the source and drain areas may be constituted by the single-drain structure or the double-drain structure. Although the second gate insulation film 14 avoids the leakage between the charge trapping layers 4a and 4b, it may be made of, for example, the silicon oxide film. The current transmission characteristic at a center of a channel can be improved if metallic oxide film having a high dielectric constant is used for the second gate insulation film 14. The metallic oxide film includes, for example, $TiO_2$, $Ta_2O_5$, $Al_2O_5$, PZT and SBT.

Figure 5A:
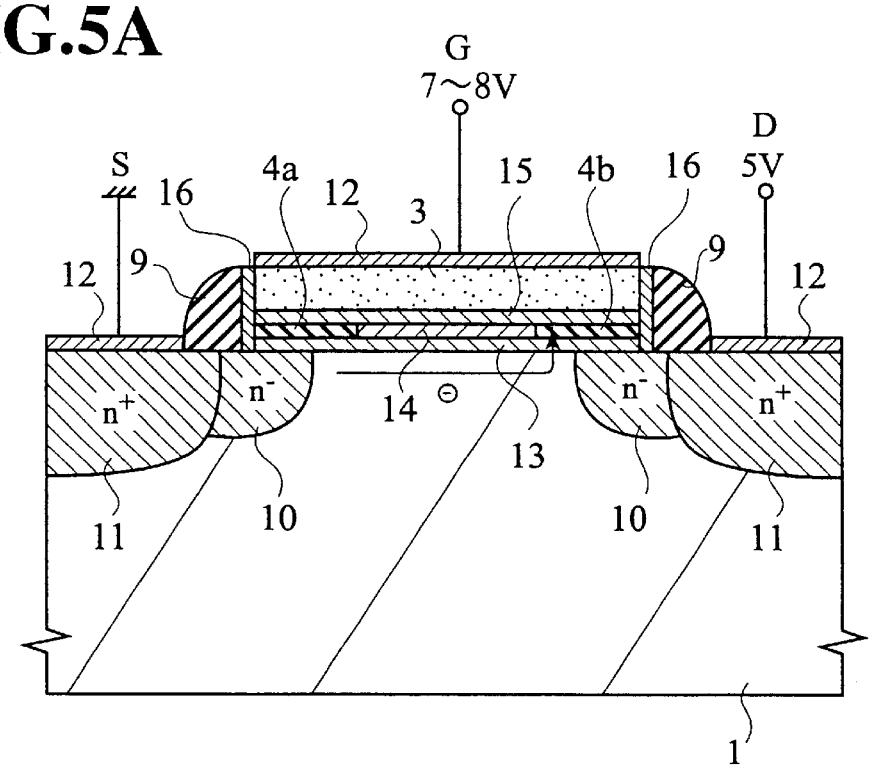
FIG. 5A is a sectional view describing the operation of the nonvolatile semiconductor memory according to the second embodiment of the present invention.
Figure 5B:
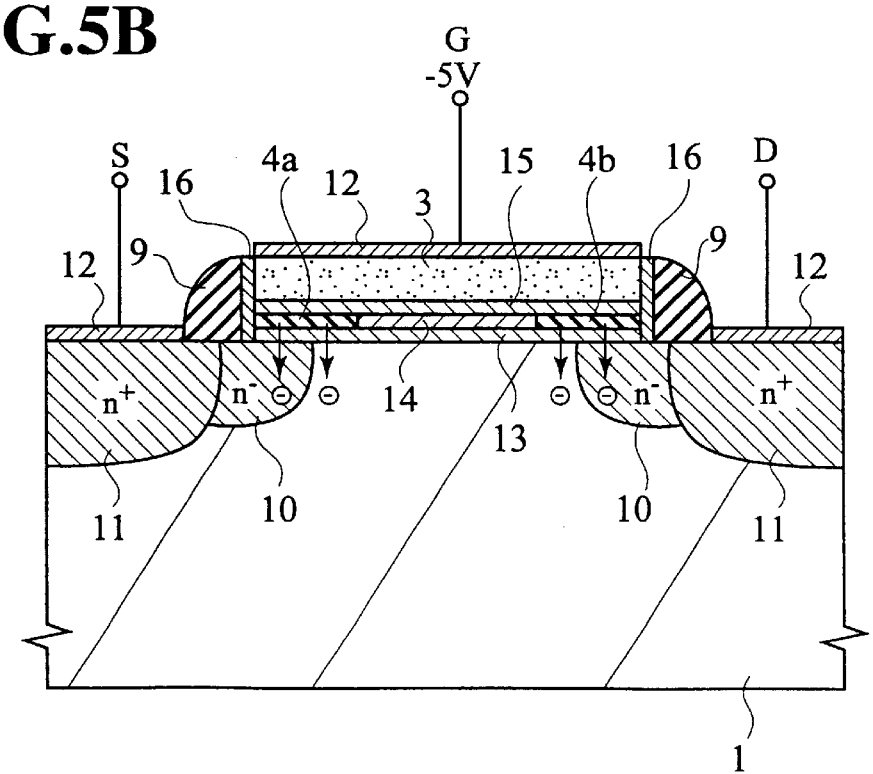
FIG. 5B is a sectional view describing the operation of the nonvolatile semiconductor memory according to the second embodiment of the present invention.

The operation of the nonvolatile memory according to the second embodiment of the present invention will be described below with reference to FIGS. 5A and 5B. FIG. 5A is a sectional view of the nonvolatile memory describing the writing operation. FIG. 5B is a sectional view of the nonvolatile memory describing the erasing operation. As shown in FIG. 5A, when the memory cell is written, a voltage of about 7 to 8 V is applied to a gate G, a voltage of about 5 V is applied to a drain D, respectively, and a source S is grounded. In this way, the voltages are applied. So, through the channel hot electron (CHE), electrons are implanted into the charge trapping layer 4b on the side of the drain area. If electrons are implanted into the charge trapping layer 4a on the side of the source area, the respective voltages applied to the drain D and the source S may be interchanged from the above-mentioned case. On the other hand, as shown in FIG. 5B, the memory cell is erased by applying a negative voltage (~-5V) to the gate G, using a FOWLER NORDHEIM (FN) type tunnel current, and pulling out the electrons from the charge trapping layers 4a, 4b. Also, if the gate electrode 3 is shared by a plurality of memory cells, the electrons can be simultaneously pulled out from those memory cells. In this case, potentials of the source S and the drain D may be equal to that of the p-type semiconductor substrate 1. If a positive voltage different from the potential of the p-type semiconductor substrate 1 is applied to the drain D and then the source S is set at a floating potential, the electrons can be also pulled out only from the charge trapping layer 4a on the side of the drain D. If the electrons are pulled out only from the charge trapping layer 4b on the side of the source S, a positive voltage may be applied to the source S to then set the drain D at the floating potential.

The memory cell can be also written by using the FN current, similarly to the operation of erasing the memory cell. A voltage of about 10 V is applied between the gate G and the p-type semiconductor substrate 1, and electrons are implanted into the charge trapping layers 4a, 4b through the FN current. In this case, the electrons can be simultaneously implanted into a plurality of memory cells having the common gate G.

Although not shown, the memory cell can be read out by detecting a read out current flowing between the source S and the drain D. This uses a fact that a current transmission characteristic (channel conductance) in the vicinity of the source and drain areas is modulated depending on the trapping states of the charge trapping layers 4a, 4b. Which of the source S or the drain D is biased may be selected depending on the one which demonstrates larger variations in the current transmission characteristic. Four different current transmission characteristics are obtained depending on the four trapping states with regard to the charge trapping layers 4a, 4b. Accordingly, an information corresponding to two bits can be stored in one cell.

Figure 6A:
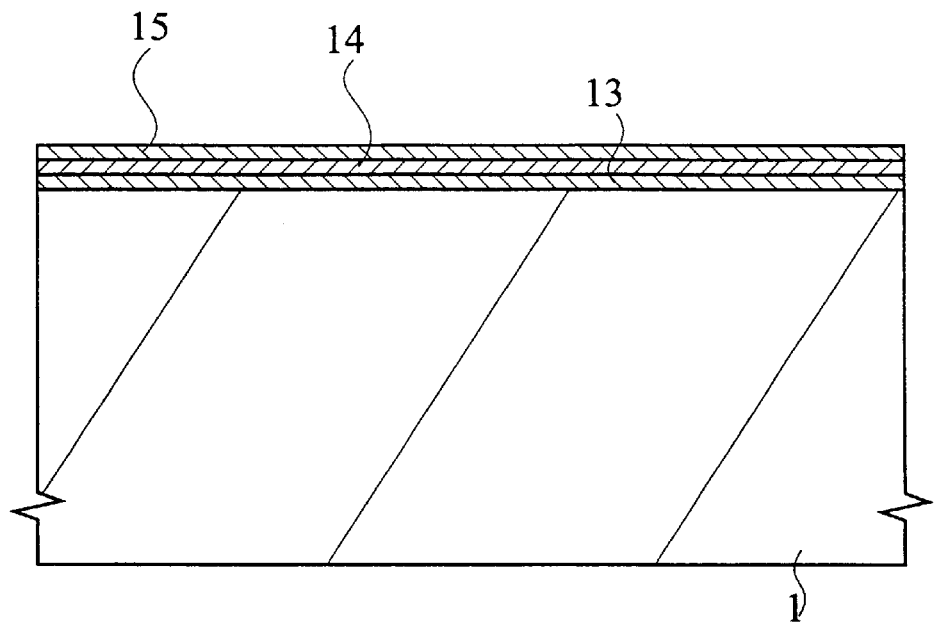
FIGS. 6A to 6G are sectional views showing the steps of manufacturing the memory cell of the nonvolatile semiconductor memory according to the second embodiment of the present invention.

The method for manufacturing the memory cell of the nonvolatile semiconductor memory according to the second embodiment of the present invention will be described below with reference to FIGS. 6A to 6G. As shown in FIG. 6A, silicon nitride film having a low charge trapping ability is firstly deposited on the whole surface of a p-type semiconductor substrate 1 to accordingly form a first gate insulation film 13 of about 10 nm. The silicon nitride film of the low charge trapping ability is deposited by using, for example, a JVD (Jet-Vapor-Deposition) method. The JVD method is noted in, for example, a reference document "T.P. Ma, IEEE Transaction on Electron Devices, Volume 45 Number 3, March 1998 p680". After the formation of the first gate insulation film 13, silicon oxide film is deposited by using the CVD method to accordingly form a second gate insulation film 14 of about 5 to 10 nm. In succession, the silicon nitride film having the low charge trapping ability is deposited by using the JVD method to accordingly form a third gate insulation film 15 of about 10 nm.

Figure 6B:
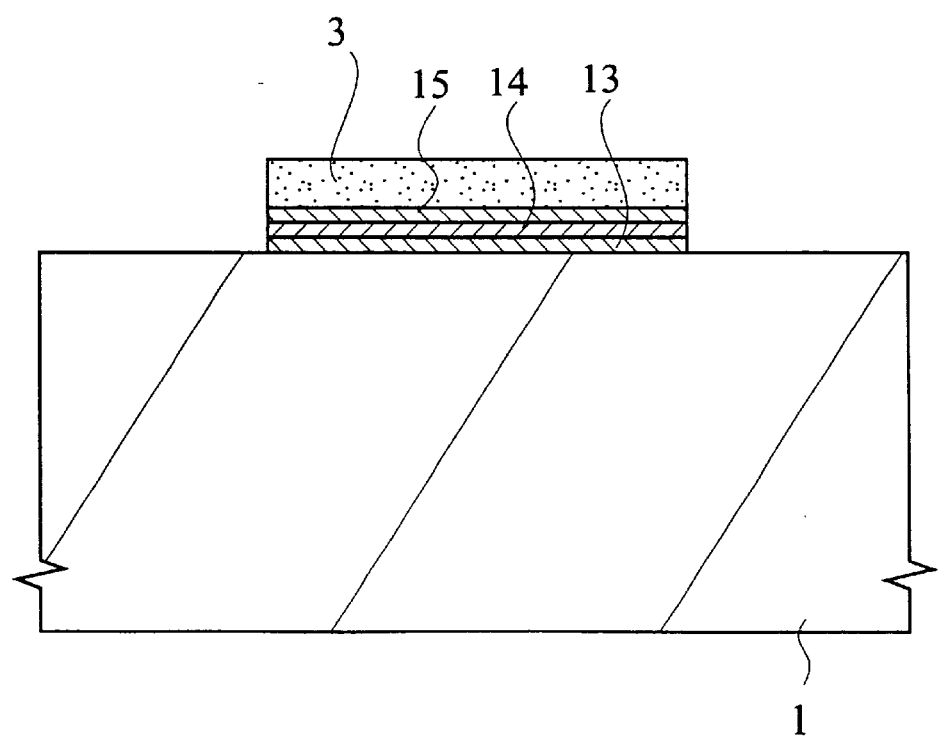

Next, as shown in FIG. 6B, polysilicon film of about 50 to 250 nm doped with the n-type or p-type impurity is deposited on the whole surface of the p-type semiconductor substrate 1 by using the LPCVD method. After that, it is patterned by using the exposure and etching techniques to accordingly form the gate electrode 3. In succession, dry etching is performed in self-alignment manner on the first gate insulation film 13, the second gate insulation film 14 and the third gate insulation film 15 on the surface of the p-type semiconductor substrate 1 in the area, in which the source and drain areas are formed, with the gate electrode 3 as mask.

Figure 6C:
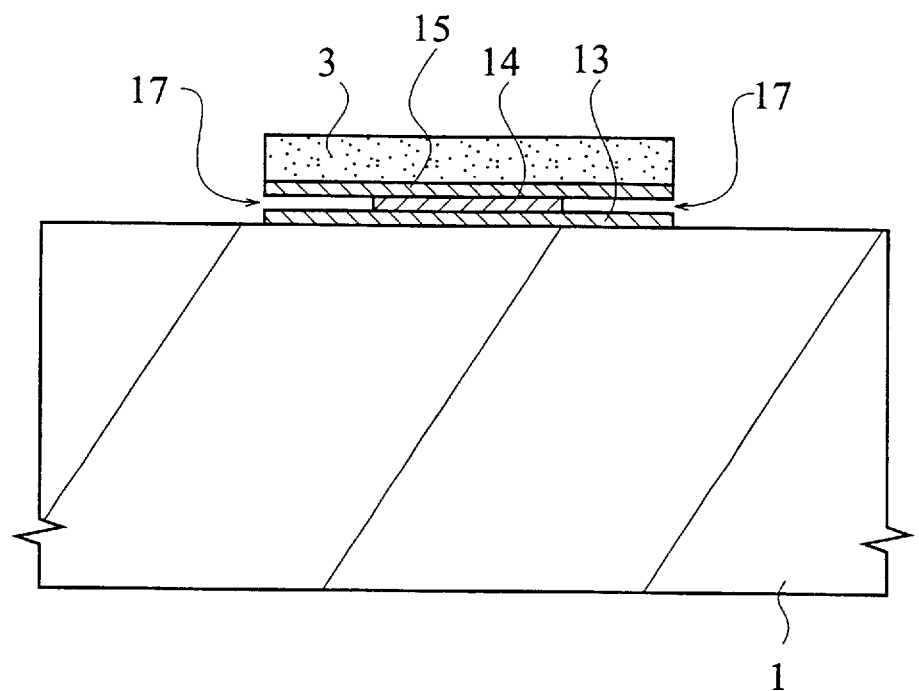

Next, as shown in FIG. 6C, a space 17 is created to form the charge trapping layer. This space 17 is created by using the etching solution, in which an etching speed of the second gate insulation film 14 is faster than those of the first gate oxide film 13 and the third gate insulation film 15, and selectively performing wet etching on an end of the second gate insulation film 14. In the second embodiment of the present invention, the first gate oxide film 13 and the third gate insulation film 15 are made of the silicon nitride film, and the second gate insulation film 14 is made of the silicon oxide film. Thus, for example, hydrofluoric acid system may be used as the etching solution. Also, the space 17 to form the charge trapping layer may be formed by using a plasma dry etching method of using gas containing HF gas, instead of the wet etching method of using the etching solution.

Figure 6D:
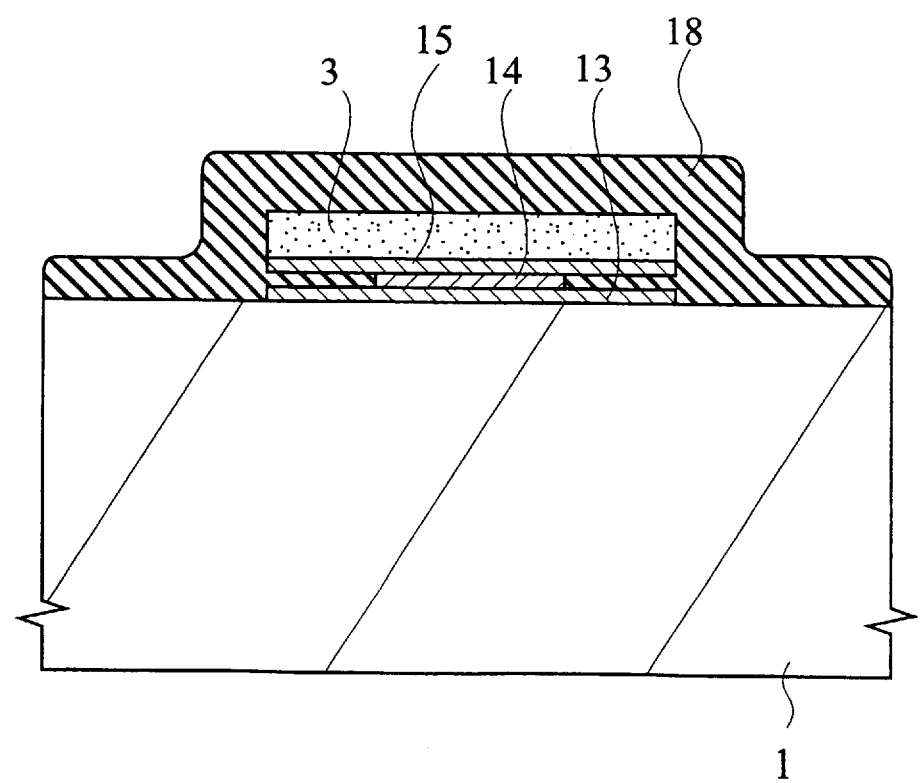
Figure 6E:
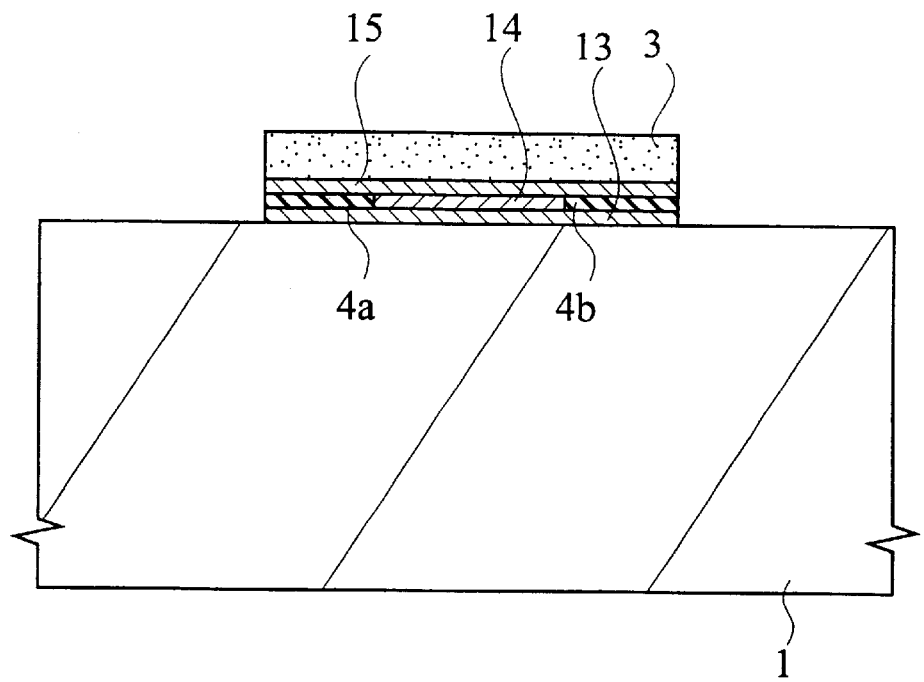

Next, as shown in FIG. 6D, a silicon nitride film 18 having a high charge trapping ability is deposited on the whole surface of the p-type semiconductor substrate 1 by using the LPCVD method so that the silicon nitride film 18 is completely embedded in the space 17 to form the charge trapping layer. Then, as shown in FIG. 6E, the anisotropic etching is performed on the whole surface of the p-type semiconductor substrate 1 by using the RIE method, which accordingly forms the charge trapping layers 4a, 4b made of the silicon nitride film having the high charge trapping ability.

Figure 6F:
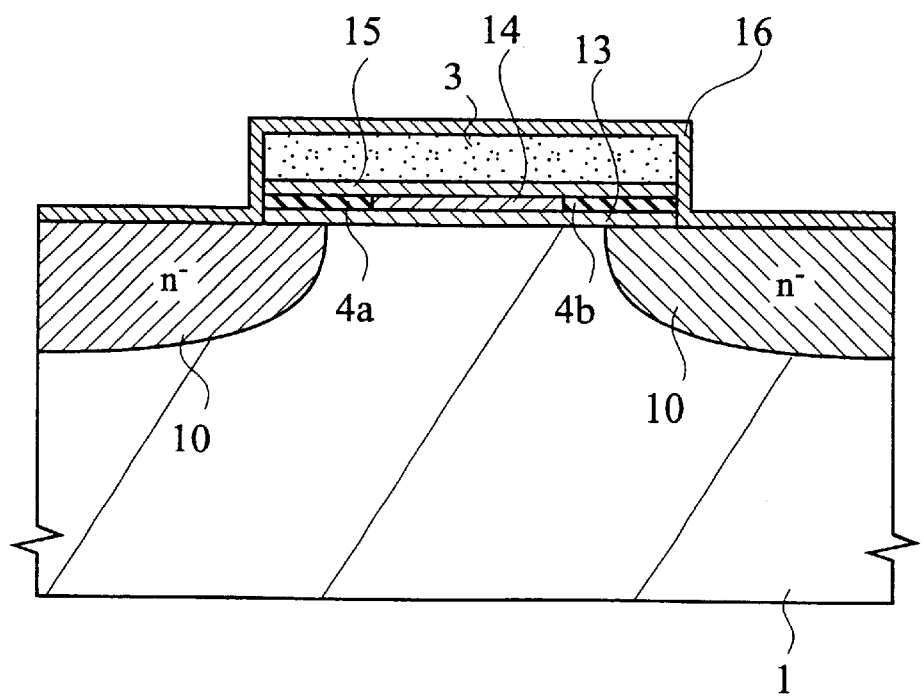

Next, as shown in FIG. 6F, an n$^-$-type diffusion layer 10 of the low impurity concentration is formed after an oxide film 16 is formed on the whole surface of the p-type semiconductor substrate 1. The n$^-$-type diffusion layer 10 is formed by implanting the n-type impurity, with the gate electrode 3 as mask, by using the ion implantation technique, and then activating the impurity implanted by the thermal treatment after the ion implantation.

Figure 6G:
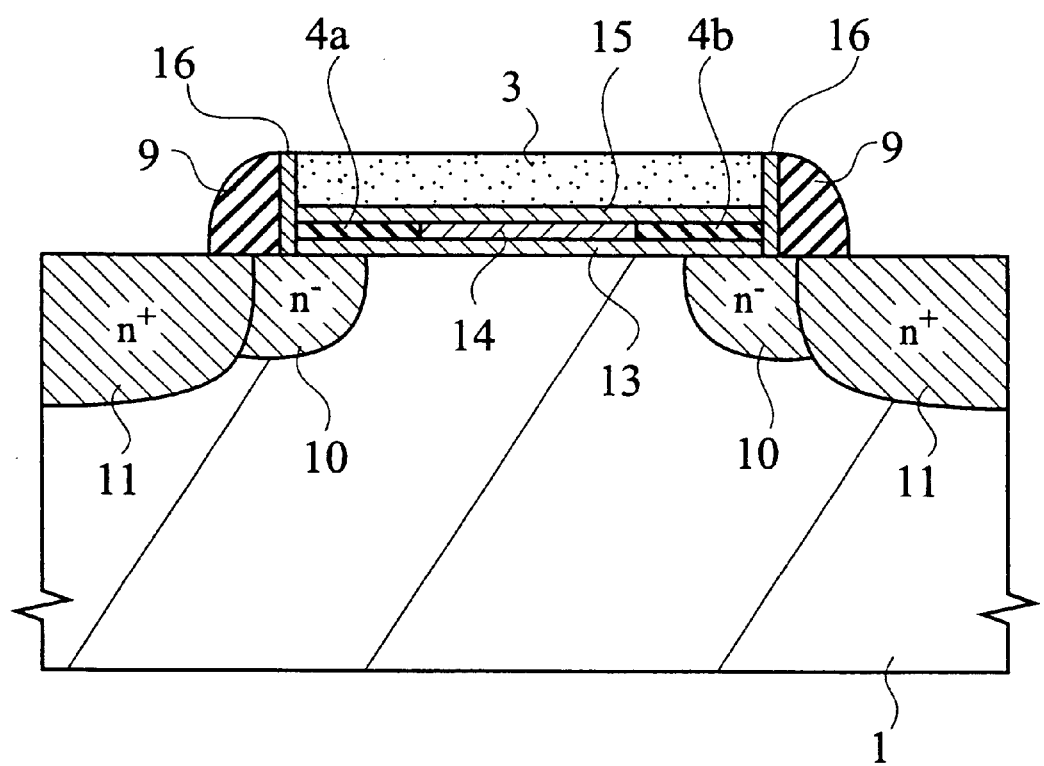

Next, as shown in FIG. 6G, an n$^+$-type diffusion layer 11 of the high impurity concentration is formed after a side wall spacer 9 is formed on a side wall of the gate electrode 3. The n$^+$-type diffusion layer 11 is formed by implanting the n-type impurity, with the gate electrode 3 and the side wall spacer 9 as mask, by using the ion implantation technique, and then activating the impurity implanted by the thermal treatment after the ion implantation.

Next, the high melting point metallic film, such as tungsten, titanium, cobalt and the like, is deposited on the whole surface of the p-type semiconductor substrate 1 by using the CVD method or the sputtering method. In succession, the thermal treatment in the inactive atmosphere is performed on the p-type semiconductor substrate 1. Accordingly, conductive layers 12 made of the high melting point metallic silicide are formed on the respective surfaces of the gate electrode 3 and the n$^+$-type diffusion layer 11. The memory cell structure shown in FIG. 4 is completed if the non-reacted high melting point metal which remains in areas other than the above-mentioned areas is removed after the formation of the conductive layers 12.

In addition, although not shown, the final nonvolatile memory cell is completed through the normal steps of manufacturing CMOS, such as the step of forming the inter-layer insulation film, the step of forming the contact hole, the step of forming the wiring, the step of forming the passivation film and the like, in succession, after the completion of the memory cell structure in FIG. 4.

As mentioned above, in the second embodiment of the present invention, the charge trapping layers 4a, 4b can be formed in the self-alignment manner below both ends of the gate electrode 3. Thus, a cell transistor can be made hyperfine in a gate length direction, which can accordingly provide the nonvolatile semiconductor memory having a large capacitance and a high density. Moreover, a cell area per bit can be substantially halved as compared with the conventional technique to thereby attain the nonvolatile semiconductor memory which is largely scaled down.

Also, widths of the channel length directions in the charge trapping layers 4a, 4b can be easily controlled by adjusting an etching time and a difference between etching speeds of the first gate insulation film 13 and the third gate insulation film 15 and an etching speed of the second gate insulation film 14. Accordingly, the charge trapping layers 4a, 4b can be arranged in symmetry. So, mutual action between the charge trapping layers 4a, 4b never occurs since the charge trapping layers 4a, 4b are perfectly electrically separated from each other through the second gate insulation film 14. Moreover, the nonvolatile semiconductor memory having the excellent charge retention capability can be provided since the charge trapping layers 4a, 4b are perfectly insulated from the source area, the drain area, the gate area 3 and the channel area through the first insulation film 13, the third insulation film 15 and the oxide film 16. The charge trapping layers 4a, 4b are formed extensionally from the end of the gate electrode 3 to a channel area direction. The current transmission characteristic of the memory cell is substantially determined in accordance with the charge trapping state in the portion on the channel area side of the charge trapping layers 4a, 4b. Hence, if a length of a gate length direction in this portion is reduced to the limit, it is possible to provide the further minute nonvolatile semiconductor memory.

Moreover, the cell structure can be easily attained by the normal CMOS step. Thus, the existing manufacturing line can be used to manufacture the nonvolatile semiconductor memory at a low cost.

Third Embodiment

A third embodiment of the present invention will be described below. In the third embodiment of the present invention, the first gate insulation film 13 of the second embodiment shown in FIG. 4 is replaced by a silicon oxide film, the second gate insulation film 14 is replaced by a silicon nitride film, and the third gate insulation film 15 is replaced by a silicon oxide film. The method for manufacturing a memory cell of a nonvolatile semiconductor memory according to the third embodiment of the present invention will be described below with reference to FIGS. 6A to 6C.

In the memory cell of the nonvolatile semiconductor memory according to the third embodiment of the present invention, at first, a p-type semiconductor substrate 1 is thermally oxidized to accordingly form a first gate insulation film 13 made of silicon oxide film of about 10 nm. After the formation of the first gate insulation film 13, silicon nitride film of the low charge trapping ability is deposited by using the JVD method to accordingly form a second gate insulation film 14 of about 5 to 10 nm. In succession, silicon oxide film is deposited by using the CVD method to accordingly form a third gate insulation film 15 of about 10 nm (refer to FIG. 6A).

Next, the polysilicon film of about 50 to 250 nm doped with the n-type or p-type impurity is deposited on the whole surface of the p-type semiconductor substrate 1 by using the LPCVD method. After that, it is patterned by using the exposure and etching technique to accordingly form the gate electrode 3. In succession, the dry etching is performed in the self-alignment manner on the first gate insulation film 13, the second gate insulation film 14 and the third gate insulation film 15 on the surface of the p-type semiconductor substrate 1 in the area, in which the source and drain areas are formed, with the gate electrode 3 as mask.

Next, the p-type semiconductor substrate 1 is thermally oxidized to accordingly form very thin silicon oxide film on the whole surface of the p-type semiconductor substrate 1. After that, a space 17 is created to form the charge trapping layer. This space 17 is created by using the etching solution, in which the etching speed of the second gate insulation film 14 is faster than those of the first gate oxide film 13 and the third gate insulation film 15, and selectively performing the wet etching on an end of the second gate insulation film 14. In the third embodiment of the present invention, the first gate oxide film 13 and the third gate insulation film 15 are made of the silicon oxide film, and the second gate insulation film 14 is made of the silicon nitride film. Thus, for example, phosphoric acid system may be used as the etching solution. In addition, the silicon nitride film 14 is not substantially oxidized by the thermally oxidizing process. Hence, the oxide film is not formed on the side of the second gate insulation film to thereby improve the selectivity of the etching (refer to FIG. 6C). Also, the space 17 to form the charge trapping layer may be formed by using a plasma dry etching method of using gas containing $CF_4$ gas, instead of the wet etching method of using the etching solution. The steps thereafter are identical to those of the second embodiment.

Fourth Embodiment

Figure 7:
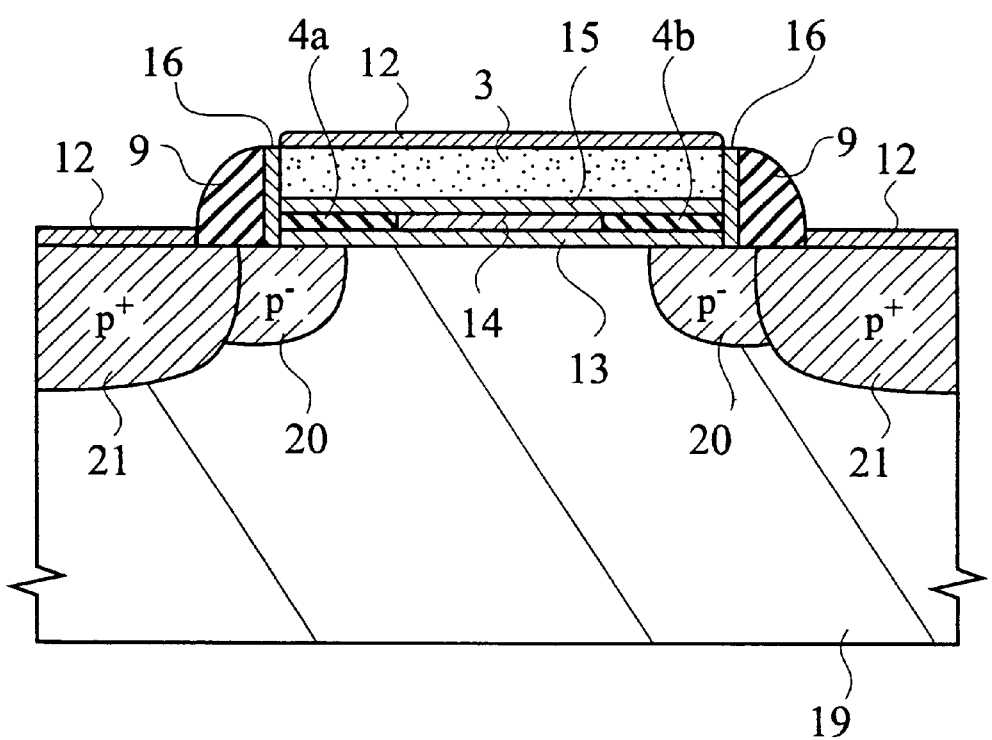
FIG. 7 is a sectional view showing a memory cell structure of a nonvolatile semiconductor memory according to a fourth embodiment of the present invention.

A fourth embodiment of the present invention will be described below. FIG. 7 is a sectional view showing a memory cell structure of a nonvolatile semiconductor memory according to the fourth embodiment of the present invention. The fourth embodiment of the present invention is an example in which the memory cell is constituted by a p-type MOS transistor. As shown in FIG. 7, in the memory cell structure of the nonvolatile memory according to the fourth embodiment of the present invention, a second gate insulation film 14 is formed on a surface of an n-type semiconductor substrate 19 through a first gate insulation film 13. And, charge trapping layers 4a, 4b are formed on both ends of the second gate insulation film 14. A gate electrode 3 is formed on the second gate insulation film 14 and the charge trapping layers 4a, 4b through a third gate insulation film 15. A side wall spacer 9 is formed on a side of the gate electrode 3 through an oxide film 16. A $p^-$-type diffusion layer 20 of a low impurity concentration adjacent to a channel area and a $p^+$-type diffusion layer 21 of a high impurity concentration located outside this $p^-$-type diffusion layer 20 are formed in the n-type semiconductor substrate 19 below this side wall spacer 9. Conductive layers 12 are formed on the respective surfaces of the gate electrode 3 and the $p^+$-type diffusion layer 11.

Figure 8A:
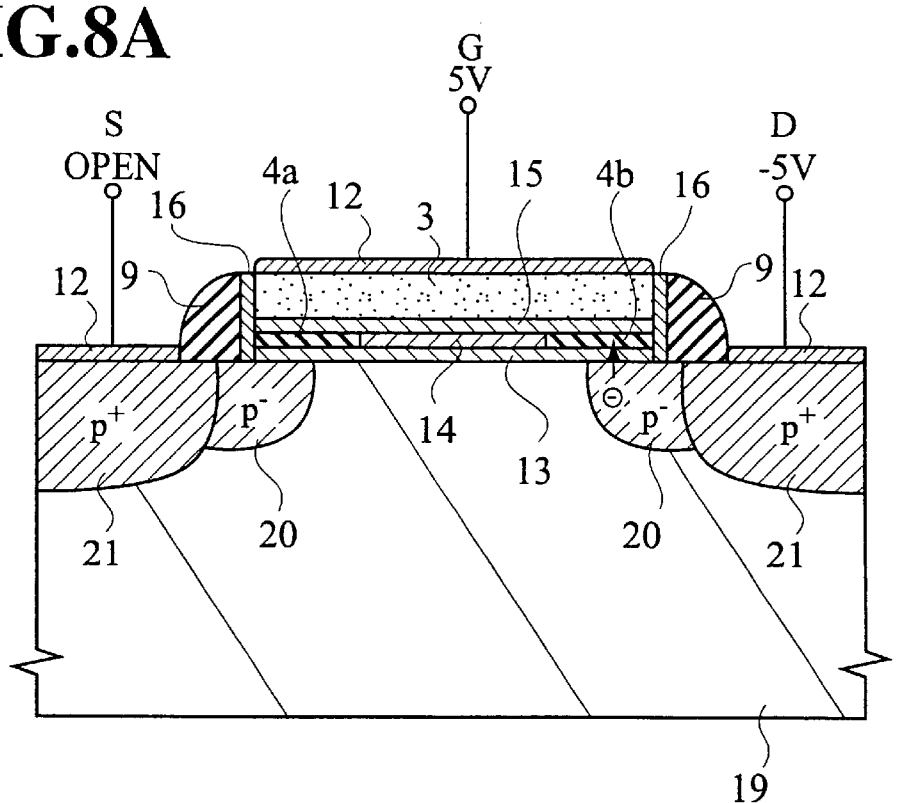
FIG. 8A is a sectional view describing the operation of the nonvolatile semiconductor memory according to the fourth embodiment of the present invention.
Figure 8B:
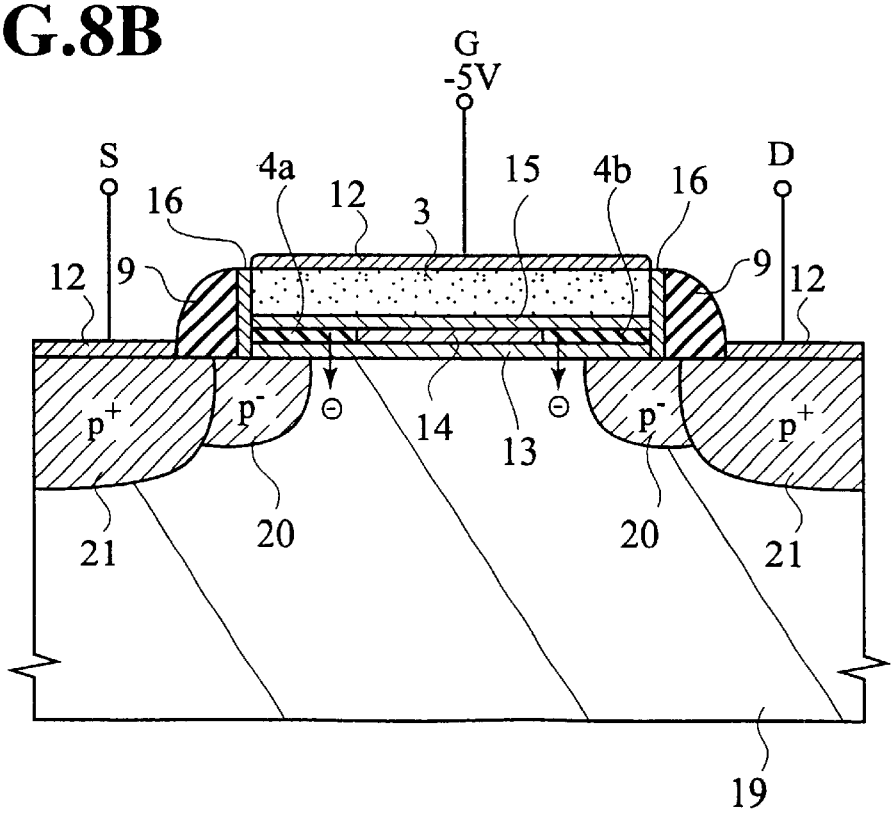
FIG. 8B is a sectional view describing the operation of the nonvolatile semiconductor memory according to the fourth embodiment of the present invention.

Next, the operation of the nonvolatile memory according to the fourth embodiment of the present invention will be described below with reference to FIGS. 8A and 8B. FIG. 8A is a sectional view of the nonvolatile memory describing the writing operation. FIG. 8B is a sectional view of the nonvolatile memory describing the erasing operation. As shown in FIG. 8A, when the memory cell is written, a voltage of about 5 V is applied to a gate G, a voltage of about −5 V is applied to a drain D, respectively, and a source S is set at the floating potential. In this way, the voltages are applied. Then, energy is given to electrons induced by the band-to-band tunneling phenomenon at an electric field in the vicinity of the drain area, and the electrons are implanted into the charge trapping layer 4b on the side of the drain area. If the electrons are implanted into the charge trapping layer 4a on the side of the source area, the respective voltages applied to the drain D and the source S may be interchanged from the above-mentioned case. On the other hand, as shown in FIG. 8B, the memory cell is erased by applying a negative voltage (~−5V) to the gate G, and using the FN current, and then pulling out the electrons from the charge trapping layers 4a, 4b. Also, if the gate G is shared by a plurality of memory cells, the electrons can be simultaneously pulled out from those memory cells. In this case, potentials of the source S and the drain D may be equal to that of the n-type semiconductor substrate 19 or the floating potential.

The memory cell can be also written by using the channel hot current, as in the case of the second embodiment in the present invention. In this case, a voltage of about −2.5 V is applied to the gate G, and a voltage of about −5 V is applied to the drain D, respectively, and the source S is grounded. In this way, the voltages are applied. So, through the channel hot current, electrons are implanted into the charge trapping layer 4b on the side of the drain area. On the other hand, if the electrons are implanted into the charge trapping layer 4a on the side of the source area, the respective voltages applied to the drain D and the source S may be interchanged.

Although not shown, the memory cell can be read out by detecting the read out current flowing between the source S and the drain D. This uses the fact that the current transmission characteristic (channel conductance) in the vicinity of the source and drain areas is modulated depending on the trapping states of the charge trapping layers 4a, 4b. Which of the source S or the drain D is biased may be selected depending on the one which demonstrates larger variations in the current transmission characteristic. The four different current transmission characteristics are obtained depending on the four trapping states with regard to the charge trapping layers 4a, 4b. Accordingly, the information corresponding to the two bits can be stored in the one cell.

Fifth Embodiment

Figure 9:
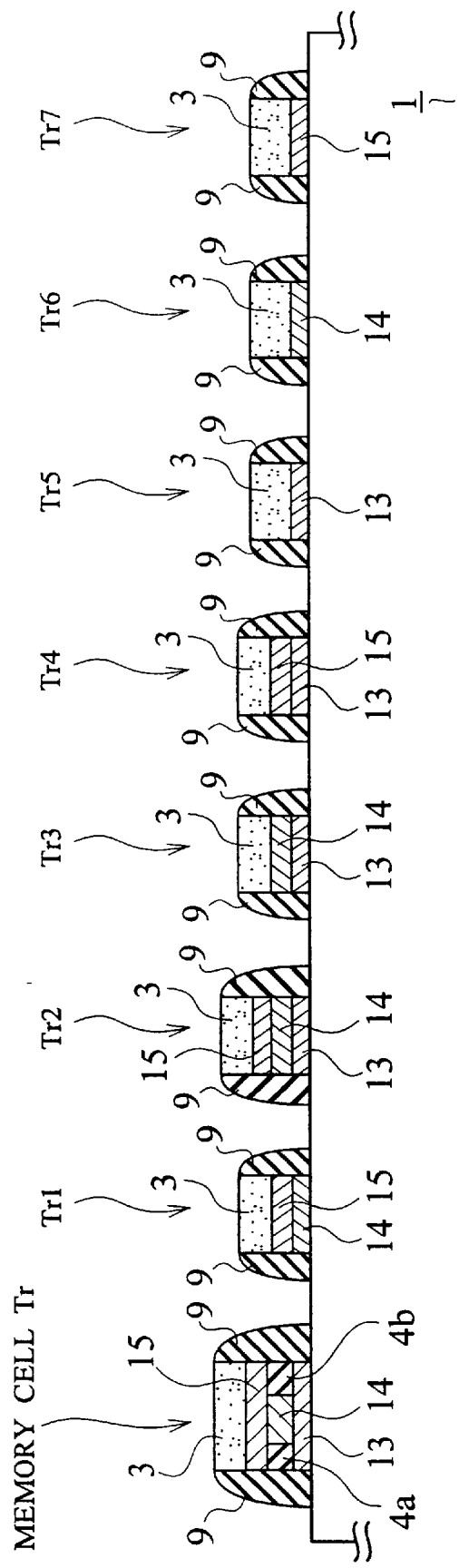
FIG. 9 is a sectional view showing a structure of a MOS transistor constituting a peripheral circuit of a nonvolatile memory according to a fifth embodiment of the present invention.

A fifth embodiment of the present invention will be described below. Typically, in a semiconductor memory, a peripheral circuit is formed around a memory cell array. For example, the peripheral circuit includes a decoder, a writing/erasing circuit, a reading out circuit, an analog circuit, various I/O circuits, various capacitor circuits and the like. The fifth embodiment of the present invention shows an example that the MOS transistors constituting those peripheral circuits are simultaneously manufactured by using the steps of manufacturing the memory cell transistors in the second to fourth embodiments. FIG. 9 is a sectional view showing the structure of the MOS transistor constituting a peripheral circuit of a nonvolatile semiconductor memory according to the fifth embodiment of the present invention. As shown in FIG. 9, in the fifth embodiment of the present invention, seven kinds of MOS transistors (Tr1 to Tr7) in which insulation films are different can be attained in addition to a memory cell transistor (a memory cell Tr). In addition, the memory cell transistor of FIG. 9 is the memory cell transistor shown in FIG. 4. Also, all the MOS transistors Tr1 to Tr7 show an n-type MOS transistor. An $n^-$-type diffusion layer 10, an $n^+$-type diffusion layer 11 and a conductive layer 12 of the memory cell transistor are omitted so as to easily view the drawings. The MOS transistors Tr1 to Tr7 are also similar.

Figure 10G:
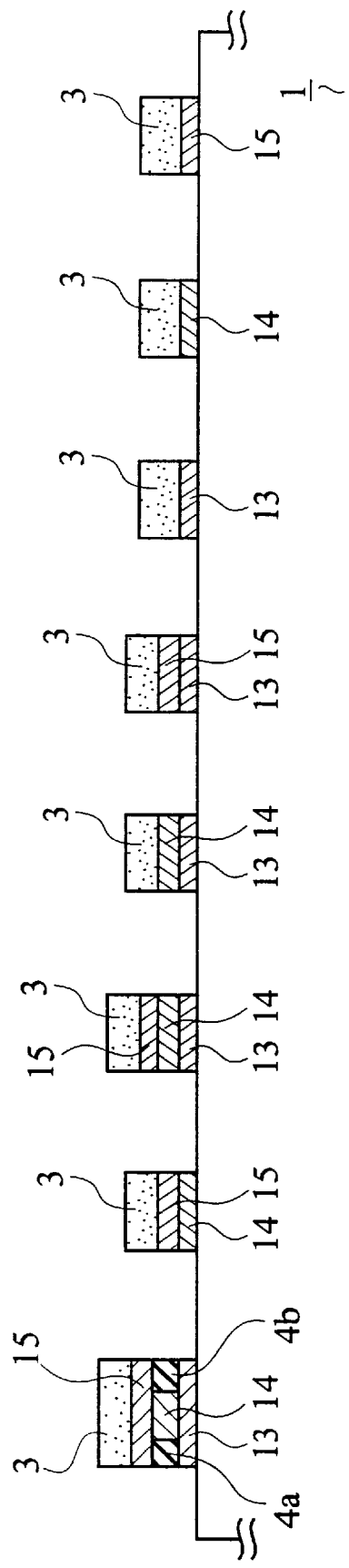

Next, the method for manufacturing the MOS transistor shown in FIG. 9 will be described below with reference to FIGS. 10A to 10G. As shown in FIG. 10A, the silicon nitride film having the low charge trapping ability is firstly deposited on the whole surface of a p-type semiconductor substrate 1 to accordingly form a first gate insulation film 13 of about 10 nm. After the formation of the first gate insulation film 13, a first gate insulation film 13 in some area on the p-type semiconductor substrate 1 is removed by using the well know exposure and dry etching techniques. Then, as shown in FIG. 10B, silicon oxide film is deposited by using the CVD method to accordingly form a second gate insulation film 14 of about 5 to 10 nm. After the formation of the second gate insulation film 14, a second gate insulation film 14 in some area is removed by using the exposure and dry etching techniques. In succession, as shown in FIG. 10C, the silicon nitride film having the low charge trapping ability is deposited by using the JVD method to accordingly form a third gate insulation film 15 of about 10 nm. After the formation of the third gate insulation film 15, a third gate insulation film 15 in some area is removed by using the exposure and dry etching techniques, which accordingly attains the seven kinds of gate insulation films constituted by at least one of the first gate insulation film 13, the second gate insulation film 14 and the third gate insulation film 15.

Next, as shown in FIG. 10D, the polysilicon film of about 50 to 250 nm doped with the n-type or p-type impurity is deposited on the whole surface of the p-type semiconductor substrate 1 by using the LPCVD method. After that, it is patterned by using the exposure and etching techniques to accordingly form a plurality of gate electrodes 3. Moreover, the first gate insulation film 13, the second gate insulation film 14 and the third gate insulation film 15 on the surface of the p-type semiconductor substrate 1 in the area, in which a source area and a drain area in each MOS transistor and memory cell transistor are formed, are removed by using the dry etching with the gate electrode 3 as mask.

Next, as shown in FIG. 10E, an area in which the MOS transistors Tr1 to Tr7 are formed is coated with a photo resist 22, and the wet etching is performed on an area in which the memory cell transistor is formed. As etching solution in which an etching speed of the second gate insulation film 14 is faster than those of the first gate oxide film 13 and the third gate insulation film 15 is used. The end of the second gate insulation film 14 in the area in which the memory cell transistor is formed is selectively etched by this wet etching, which accordingly creates a space 17 to form the charge trapping layer. In the fifth embodiment of the present invention, the first gate oxide film 13 and the third gate insulation film 15 are made of the silicon nitride film, and the second gate insulation film 14 is made of the silicon oxide film. Thus, for example, the hydrofluoric acid system may be used as the etching solution. As shown in FIG. 10F a silicon nitride film 18 having the high charge trapping ability is deposited on the whole surface of the p-type semiconductor substrate 1 by using the LPCVD method so that the silicon nitride film 18 is completely embedded in the space 17 to form the charge trapping layer. In succession, as shown in FIG. 10G, the anisotropic etching is performed on the whole surface of the p-type semiconductor substrate 1 by using the RIE method. Accordingly, the charge trapping layers 4a, 4b made of the silicon nitride film having the high charge trapping ability are formed in the area in which the memory cell transistor is formed. The steps thereafter are identical to those of the second embodiment of the present invention.

According to the fifth embodiment of the present invention, the seven kinds of MOS transistors Tr1 to Tr7 having the gate insulation films different in film thickness can be manufactured simultaneously with the memory cell transistor. Accordingly, the MOS transistor can be provided which corresponds to a variety of operational voltages from a high breakdown voltage transistor of a high voltage operation to an extremely low voltage operation transistor. Moreover, it is possible to attain both the n-type MOS transistor and the p-type MOS transistor. Also, the gate electrodes 3 of the memory cell transistor and the MOS transistors Tr1 to Tr7 can be made of the same material, and formed in the same exposure and dry etching steps. Thus, it is possible to provide the minute transistor in which a deviation in the positional alignment of a photo mask is low.

Sixth Embodiment

Figure 11A:
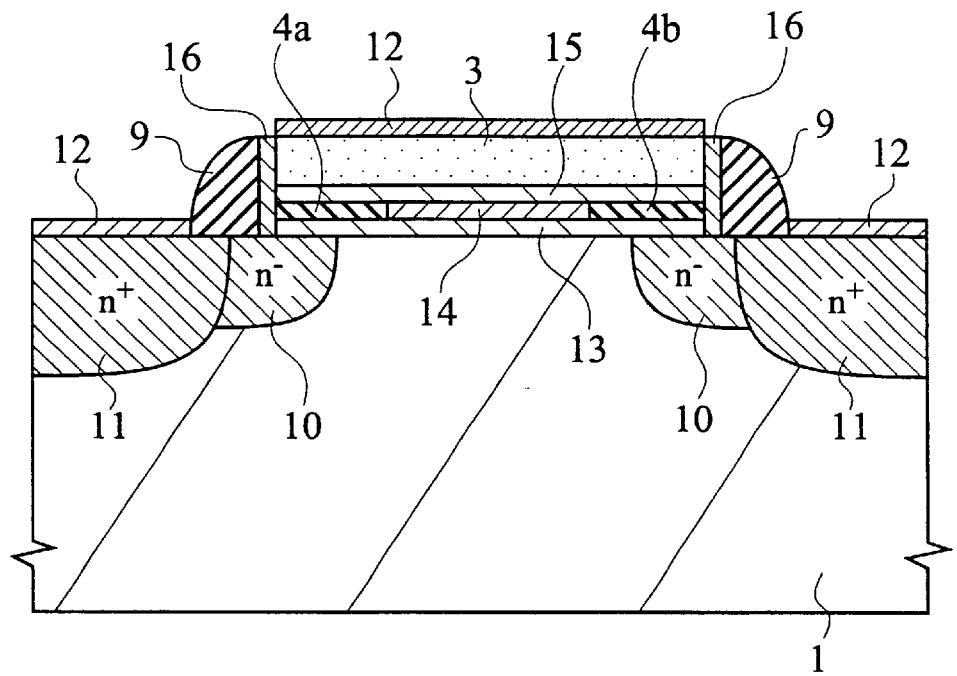
FIG. 11A is a sectional view showing a memory cell structure of a nonvolatile semiconductor memory formed in a semiconductor memory according to a sixth embodiment of the present invention.
Figure 11B:
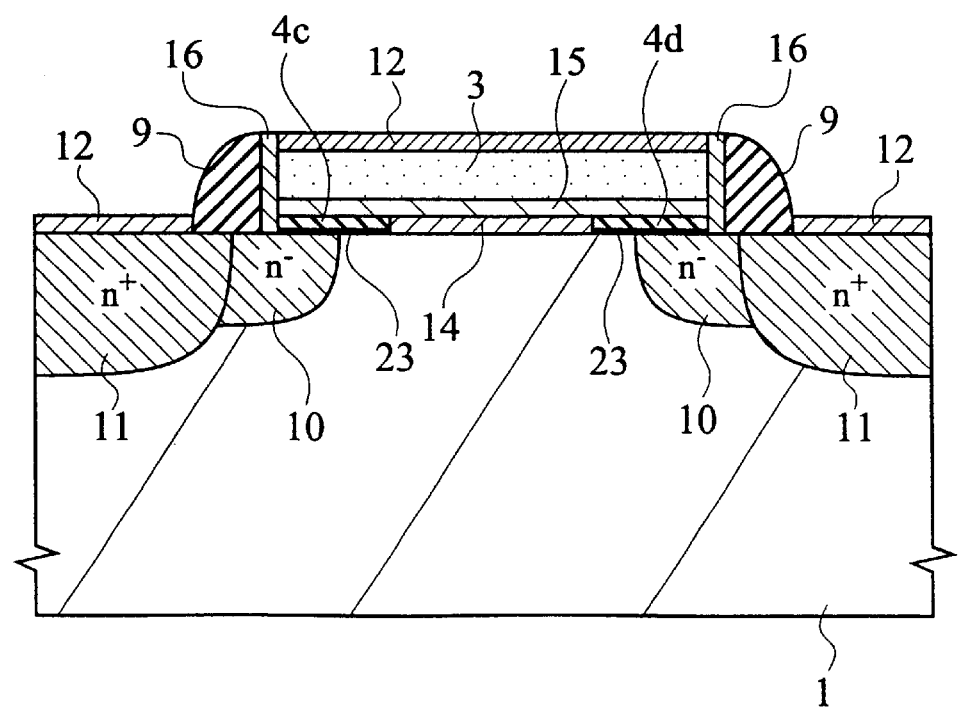
FIG. 11B is a sectional view showing a memory cell structure of a volatile semiconductor memory formed in the semiconductor memory according to the sixth embodiment of the present invention.

A sixth embodiment of the present invention will be described below. This sixth embodiment shows an example that an electrically writable and erasable nonvolatile memory and a rapidly writable and readable volatile memory are attained on the same chip. FIG. 11A is a sectional view showing a memory cell structure of a nonvolatile memory formed in a semiconductor memory according to the sixth embodiment of the present invention. FIG. 11B is a sectional view showing a memory cell structure of a volatile memory formed in the semiconductor memory according to the sixth embodiment of the present invention. The nonvolatile memory of FIG. 11A and the volatile memory of FIG. 11B are mixed on the same chip.
(A) Nonvolatile Memory As shown in FIG. 11A, a memory cell of the nonvolatile memory according to this sixth embodiment is constituted by the n-type MOS transistor. Then, in the memory cell structure of the nonvolatile memory, a second gate insulation film 14 is formed on a main surface of a p-type semiconductor substrate 1 through a first gate insulation film 13. Charge trapping layers 4 (4a, 4b) are formed on both ends of the second gate insulation film 14. A gate electrode 3 is formed on the second gate insulation film 14 and the charge trapping layers 4 through a third gate insulation film 15. A side wall spacer 9 is formed on a side of the gate electrode 3 through an oxide film 16. An n⁻-type diffusion layer 10 of a low impurity concentration adjacent to a channel area and an n⁺-type diffusion layer 11 of a high impurity concentration located outside this n⁻-type diffusion layer 10 are formed on a main surface of a p-type semiconductor substrate 1 below the side wall spacer 9. Conductive layers 12 are formed on the respective surfaces of the gate electrode 3 and the n⁺-type diffusion layer 11.

The memory cell of the nonvolatile memory according to the sixth embodiment of the present invention has the LDD structure in which the source and drain areas are constituted by the n⁻-type diffusion layers 10 of the low impurity concentration and the n⁺-type diffusion layers 11 of the high impurity concentration. Then, the gate insulation film is constituted by the three-layer stacked film composed of the first gate insulation film 13 (bottom layer), the second gate insulation film 14 (middle layer) and the third gate insulation film 15 (top layer). The charge trapping layers 4 (4a, 4b) are formed on both the ends of the second gate insulation film 14. Electrons are trapped in those two charge trapping layers 4a, 4b. Its trapping state may include the following four states: (1) the state that the electrons are not trapped in any one of the charge trapping layers 4a, 4b; (2) the state that the electrons are trapped in only the charge trapping layer 4a; (3) the state that the electrons are trapped in only the charge trapping layer 4b; and (4) the state that the electrons are trapped in both the charge trapping layers 4a, 4b. The change amounts of the threshold voltage caused by the presence or absence of the electrons held in those two charge trapping layers 4a, 4b are correlated with "00", "01", "10" and "11" of a memory information, respectively. In this memory cell structure, the charge trapping layers 4 are positioned in the upper portion of the end of the channel area. Thus, a threshold voltage at a center of the channel area is determined only by an impurity concentration of the channel area, and does not depend on the trapping state of the electrons in the charge trapping layers 4. Hence, the over-erasure caused by the excess or deficiency of the electrons in the charge trapping layers 4 can be protected so that the leakage trouble, the program defect, the read out error and the like are never induced because of the over-erasure. Also, the leakage current between the source and drain areas can be suppressed only by the gate voltage to thereby attain the nonvolatile semiconductor memory of the high reliability. The charge trapping layers 4 may be made of the silicon nitride film having the high charge trapping ability by using the CVD method. This is because the trapping of the electrons at the discrete charge capture level in the silicon nitride film enables the charge retention capability having little influence on the film quality of the lower insulation film. Also, if it is made of the silicon film or the polysilicon film, it can be manufactured at a low cost. Moreover, if the first gate insulation film 13 and the third gate insulation film 15 are made of the silicon nitride film ($Si_3N_4$ film) having the dielectric constant equal to about two times that of the silicon oxide film ($SiO_2$ film), it is possible to stably attain the very thin gate insulation film with the equivalent silicon oxide thickness is about 4 nm to 11 nm. For example, since the substantial film thickness of the silicon nitride film with the equivalent silicon oxide thickness is 5 nm is about 10 nm, the direct tunnel (DT) injection is never induced. Therefore, the voltage at the time of the injection and ejection operation of the electrons is made lower, which not only enables the memory cell to be hyperfine, but also enables the peripheral high voltage operation element to be hyperfine.

In the memory cell of the nonvolatile memory according to the sixth embodiment of the present invention, the n⁻-type diffusion layer 10 is formed, and then the LDD structure is configured, in order to improve the breakdown voltages of the source and drain areas. However, the source and drain areas may be constituted by the single-drain structure or the double-drain structure. Although the second gate insulation film 14 avoids the leakage between the charge trapping layers 4a, 4b, it may be made of, for example, the silicon oxide film. The current transmission characteristic at the center of the channel area can be improved if the metallic oxide film having the high dielectric constant is used for the second gate insulation film 14. The metallic oxide film includes, for example, $TiO_2$, $Ta_2O_5$, $Al_2O_5$, PZT and SBT.

Figure 12A:
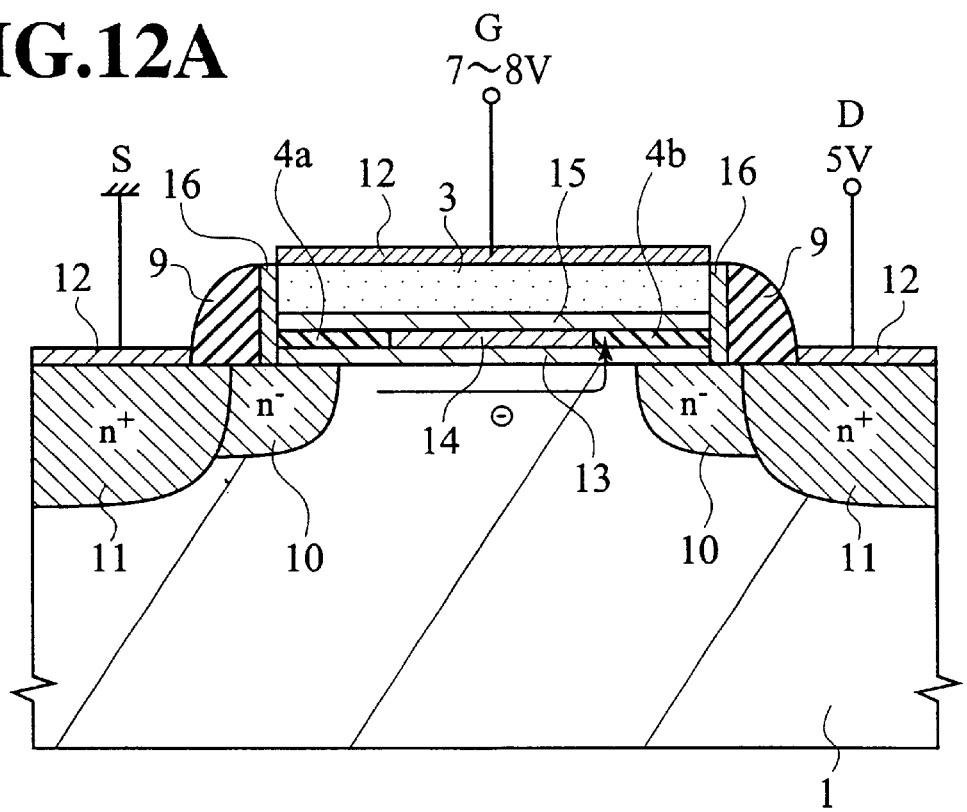
FIG. 12A is a sectional view describing the operation of the nonvolatile semiconductor memory according to the sixth embodiment of the present invention.
Figure 12B:
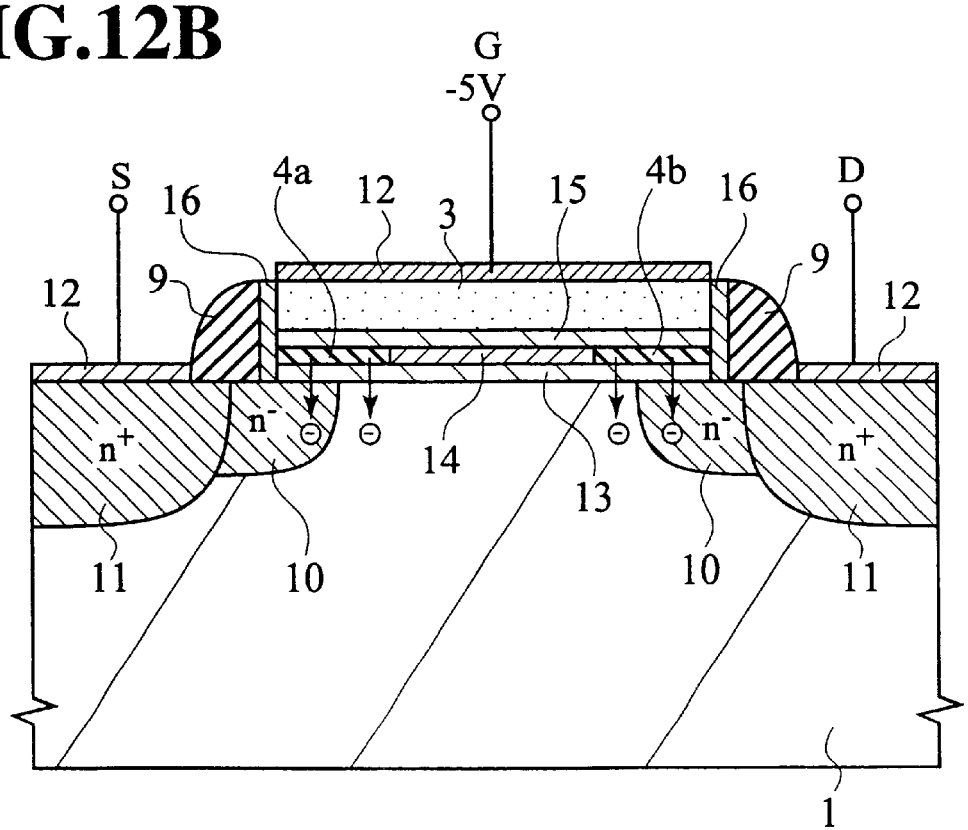
FIG. 12B is a sectional view describing the operation of the nonvolatile semiconductor memory according to the sixth embodiment of the present invention.

The operation of the nonvolatile semiconductor memory according to the sixth embodiment of the present invention will be described below with reference to FIGS. 12A and 12B. FIG. 12A is a sectional view of the nonvolatile memory describing the writing operation. FIG. 12B is a sectional view of the nonvolatile memory describing the erasing operation. As shown in FIG. 12A, when the memory cell is written, the voltage of about 7 to 8 V is applied to a gate G, the voltage of about 5 V is applied to a drain D, respectively, and a source S is grounded. In this way, the voltages are applied. So, through the channel hot electron (CHE), electrons are implanted into the charge trapping layer 4b on the side of the drain area. If the electrons are implanted into the charge trapping layer 4a on the side of the source area, the respective voltages applied to the drain D and the source S may be interchanged from the above-mentioned case. On the other hand, as shown in FIG. 12B, the memory cell is erased by applying the negative voltage (~−5V) to the gate G, using the FOWLER NORDHEIM (FN) type tunnel current, and pulling out the electrons from the charge trapping layers 4a, 4b. Also, if the gate G is shared by a plurality of memory cells, the electrons can be simultaneously pulled out from those memory cells. In this case, potentials of the source S and the drain D may be equal to that of the p-type semiconductor substrate 1. If the positive voltage different from the potential of the p-type semiconductor substrate 1 is applied to the drain electrode and then the source electrode is set at the floating potential, the electrons can be also pulled out only from the charge trapping layer 4a on the side of the drain electrode. If the electrons are pulled out only from the charge trapping layer 4b on the side of the source electrode, the positive voltage may be applied to the source electrode to then set the drain electrode at the floating potential.

The memory cell can be also written by using the FN current, similarly to the operation of erasing the memory cell. The voltage of about 10 V is applied between the gate G and the p-type semiconductor substrate 1, and electrons are implanted into the charge trapping layers 4a, 4b through the FN current. In this case, the electrons can be simultaneously implanted into a plurality of memory cells having the common gate G.

Although not shown, the memory cell can be read out by detecting the read out current flowing between the source S and the drain D. This uses the fact that the current transmission characteristic (channel conductance) in the vicinity of the source and drain areas is modulated depending on the trapping states of the charge trapping layers 4a, 4b. Which of the source S or the drain D is biased may be selected depending on the one which demonstrates larger variations in current transmission characteristic. The four different current transmission characteristics are obtained depending on the four trapping states with regard to the charge trapping layers 4a, 4b. Accordingly, the information corresponding to the two bits can be stored in one cell.

(B) Volatile Memory

As shown in FIG. 11B, a memory cell of the volatile memory according to the sixth embodiment of the present invention is constituted by the n-type MOS transistor. Then, in the memory cell structure of this volatile memory, the second gate insulation film 14 of FIG. 11A is directly formed on a main surface of a p-type semiconductor substrate 1. Charge trapping layers 4 (4c, 4d) are formed on both ends of the second gate insulation film 14, similarly to the nonvolatile memory of FIG. 11A. However, the configuration that those charge trapping layers 4c, 4d are formed on the main surface of the p-type semiconductor substrate 1 through a tunnel insulation film 23 is different from the nonvolatile memory of FIG. 11A. A gate electrode 3 is formed on the second gate insulation film 14 and the charge trapping layers 4 through a third gate insulation film 15. A side wall spacer 9 is formed on a side of the gate electrode 3 through an oxide film 16. An $n^-$-type diffusion layer 10 of a low impurity concentration adjacent to a channel area and an $n^+$-type diffusion layer 11 of a high impurity concentration located outside this $n^-$-type diffusion layer 10 are formed on a main surface of a p-type semiconductor substrate 1 below this side wall spacer 9. Conductive layers 12 are formed on the respective surfaces of the gate electrode 3 and the $n^+$-type diffusion layer 11.

The memory cell of the volatile memory according to the sixth embodiment of the present invention has the LDD structure in which the source and drain areas are constituted by the $n^-$-type diffusion layers 10 of the low impurity concentration and the $n^+$-type diffusion layers 11 of the high impurity concentration. Then, the gate insulation film is composed of the second gate insulation film 14, the tunnel insulation film 23 and the third gate insulation film 15. The charge trapping layers 4 are formed on both the ends of the second gate insulation film 14. Electrons are trapped in those two charge trapping layers 4c, 4d. Its trapping state may include the following four states: (1) the state that the electrons are not trapped in any one of the charge trapping layers 4c, 4d; (2) the state that the electrons are trapped in only the charge trapping layer 4c; (3) the state that the electrons are trapped in only the charge trapping layer 4d; and (4) the state that the electrons are trapped in both the charge trapping layers 4c, 4d. The change amounts of the threshold voltage caused by the presence or absence of the electrons held in those two charge trapping layers 4c, 4d are correlated with "00", "01", "10" and "11" of a memory information, respectively. In this memory cell structure, the charge trapping layers 4 are positioned on the upper portion of the end of the channel area. Thus, a threshold voltage at a center of the channel area is determined only by an impurity concentration of the channel area, and does not depend on the trapping state of the electrons in the charge trapping layers 4. Hence, the over-erasure caused by the excess or deficiency of the electrons in the charge trapping layers 4 can be protected so that the leakage trouble, the program defect, the read out error and the like are never induced because of the over-erasure. Also, the leakage current between the source and drain areas can be suppressed only by the gate voltage to thereby attain the volatile semiconductor memory of the high reliability. The charge trapping layers 4 may be made of the silicon nitride film having the high charge trapping ability by using the CVD method. This is because the trapping of the electrons at the discrete charge capture level in the silicon nitride film enables the charge retention capability having little influence on the film quality of the lower insulation film. Also, if it is made of the silicon film or the polysilicon film, it can be manufactured at a low cost. Moreover, if the third gate insulation film 15 is made of the silicon nitride film ($Si_3N_4$ film) having the dielectric constant equal to about two times that of the silicon oxide film ($SiO_2$ film), it is possible to stably attain the very thin gate insulation film with the equivalent silicon oxide thickness is about 4 nm to 11 nm. For example, since the substantial film thickness of the silicon nitride film with the equivalent silicon oxide thickness is 5 nm is about 10 nm, the direct tunnel (DT) injection is never induced. Therefore, the voltage at the time of the injection and ejection operation of the electrons is made lower, which not only enables the memory cell to be hyperfine, but also enables the peripheral high voltage operation element to be hyperfine.

In the memory cell of the volatile memory according to the sixth embodiment of the present invention, the $n^-$-type diffusion layer 10 is formed, and then the LDD structure is configured, in order to improve the breakdown voltages of the source and drain areas. However, the source and drain areas may be constituted by the single-drain structure or the double-drain structure. Although the second gate insulation film 14 avoids the leakage between the charge trapping layers 4c and 4d, it may be made of, for example, the silicon oxide film. The current transmission characteristic at the center of the channel area can be improved if the metallic oxide film having the high dielectric constant is used for the second gate insulation film 14. The metallic oxide film includes, for example, $TiO_2$, $Ta_2O_5$, $Al_2O_5$, PZT and SBT.

In the volatile memory according to the sixth embodiment of the present invention, the tunnel insulation films 23 are formed in the lower portions of the charge trapping layers 4c, 4d. The tunnel insulation film 23 is made of thin silicon oxide film having a film thickness that can be directly tunneled, which enables a rapidly writing and reading operation equal to or less than 100 ns that is required of a dynamic RAM. If the tunnel insulation film 23 is made of the silicon oxide film, its film thickness may be equal to or less than 3 nm. Also, if it is made of the silicon nitride film equal to or less than 3 nm, a very thin gate insulation film can be stably attained with the equivalent silicon oxide thickness is about 1.5 nm. It is actually difficult to keep data for a long time since the electrons trapped in the charge trapping layer 4 is gradually reduced because of a leakage current through the tunnel insulation film 23. However, a re-writing operation is sufficiently possible within a refresh period of a normal dynamic RAM. Thus, this has no influence on the operation as the dynamic RAM. This fact is noted in 1995 IEDM digest p.867 by C. H.-J. Wann et al.

The memory cell is read out by detecting the read out current flowing between the source electrode and the drain electrode. This uses a fact that the current transmission characteristic (channel conductance) in the vicinity of the source and drain areas is modulated depending on the trapping states of the charge trapping layers 4c, 4d. Which of the source S or the drain D is biased may be selected depending on the one which demonstrates larger variations in current transmission characteristic. The four different current transmission characteristics are obtained depending on the four trapping states with regard to the charge trapping layers 4c, 4d. Accordingly, the information corresponding to the two bits can be stored in one cell.

Moreover, the volatile memory according to the sixth embodiment of the present invention can function as the normal MOS transistor, unless the charges are implanted into the charge trapping layers 4c, 4d.

(C) Method for Manufacturing Nonvolatile And Volatile Mix Memory

The method for manufacturing the memory cell of the nonvolatile memory and the volatile memory according to the sixth embodiment of the present invention will be described below with reference to FIGS. 13A to 13I and FIGS. 14A to 14I. FIGS. 13A to 13I are sectional views showing the method for manufacturing the nonvolatile memory according to the sixth embodiment of the present invention. And, FIGS. 14A to 14I are sectional views showing the method for manufacturing the volatile memory according to the sixth embodiment of the present invention.

Figure 13A:
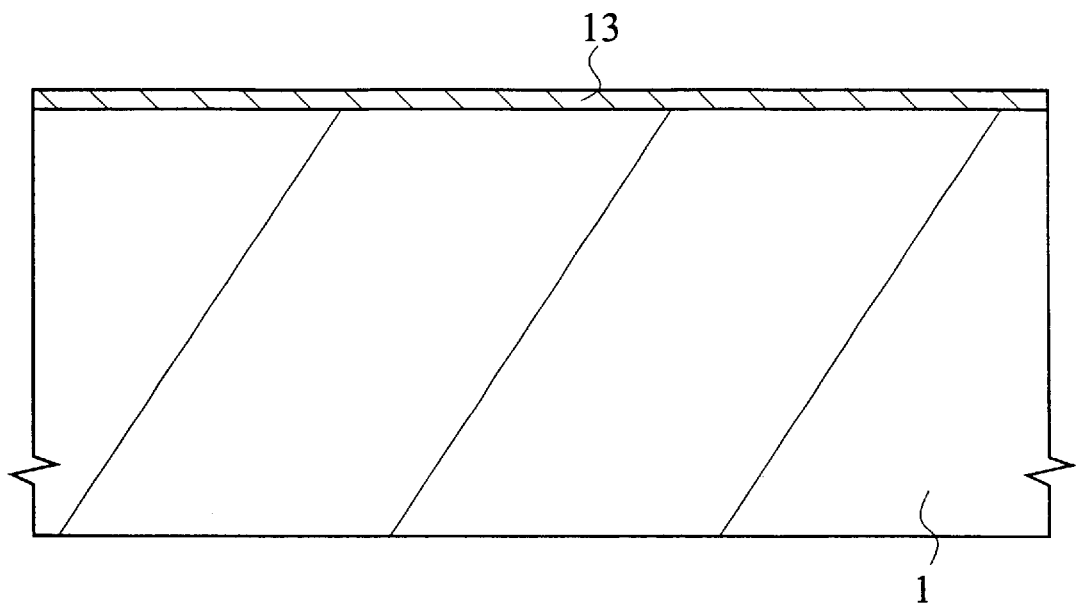
FIGS. 13A to 13I are sectional views showing the steps of manufacturing a memory cell of the nonvolatile semiconductor memory according to the sixth embodiment of the present invention.
Figure 14A:
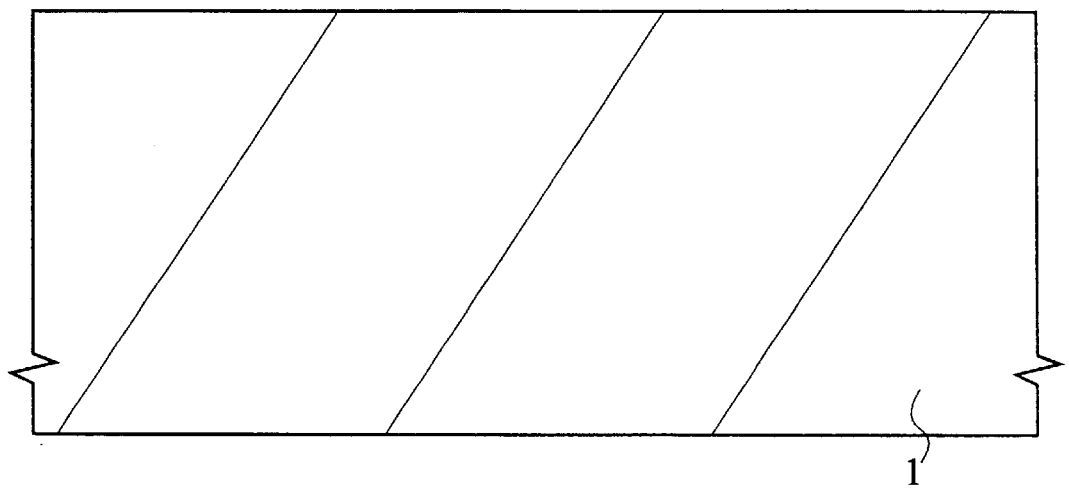
FIGS. 14A to 14I are sectional views showing the steps of manufacturing a memory cell of the volatile semiconductor memory according to the sixth embodiment of the present invention.

At first, as shown in FIGS. 13A and 14A, the silicon nitride film having the low charge trapping ability is deposited on a p-type semiconductor substrate 1 to accordingly form a first gate insulation film 13 of about 10 nm. After the formation of the first gate insulation film 13, the area in which the nonvolatile memory shown in FIG. 13A is formed is coated with, for example, the photo resist. Then, only a first gate insulation film 13 in the area in which the volatile memory of FIG. 14A is formed is removed by using, for example, a wet etching method of employing heated phosphoric acid solution. Thus, the first gate insulation film 13 is formed only in the formation area of the nonvolatile memory of FIG. 13A. The silicon nitride film having the low charge trapping ability is deposited by using, for example, the JVD method.

Figure 13B:
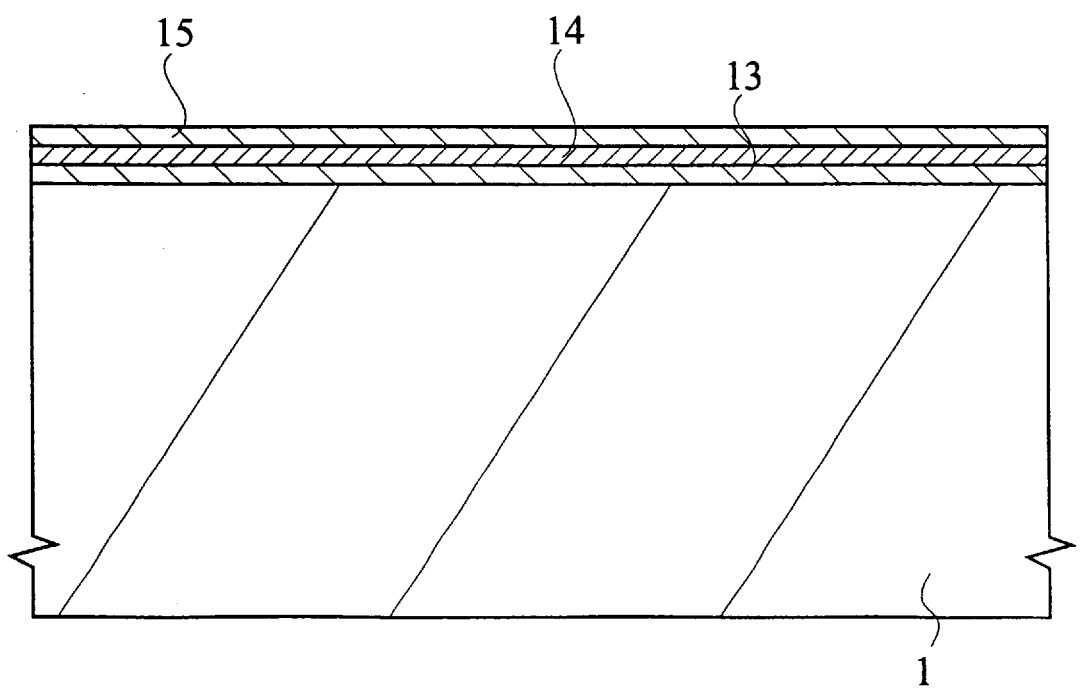
Figure 14B:
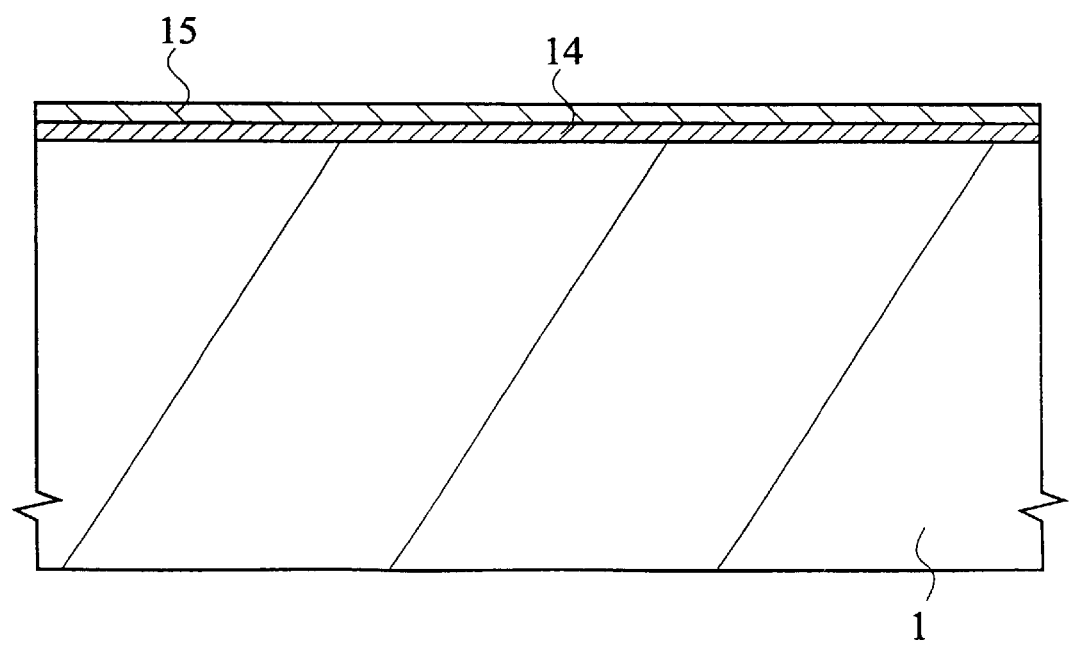

Next, as shown in FIGS. 13B and 14B, silicon oxide film is deposited on the whole surface of the p-type semiconductor substrate 1 by using the CVD method to accordingly form a second gate insulation film 14 of about 5 to 10 nm. In succession, the silicon nitride film having the low charge trapping ability is deposited by using the JVD method to accordingly form a third gate insulation film 15 of about 10 nm. After all, the first, second and third gate insulation films 13, 14 and 15 are formed in the formation area of the nonvolatile memory of FIG. 13B. And, the second and third gate insulation films 14 and 15 are formed in the formation area of the volatile memory of FIG. 14B.

Figure 13C:
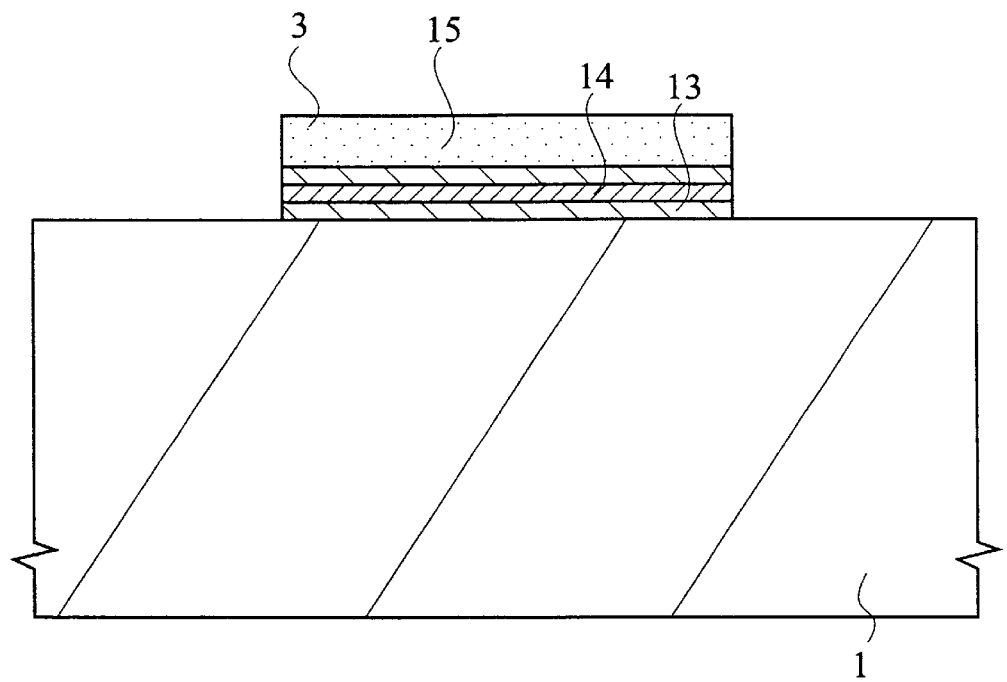
Figure 14C:
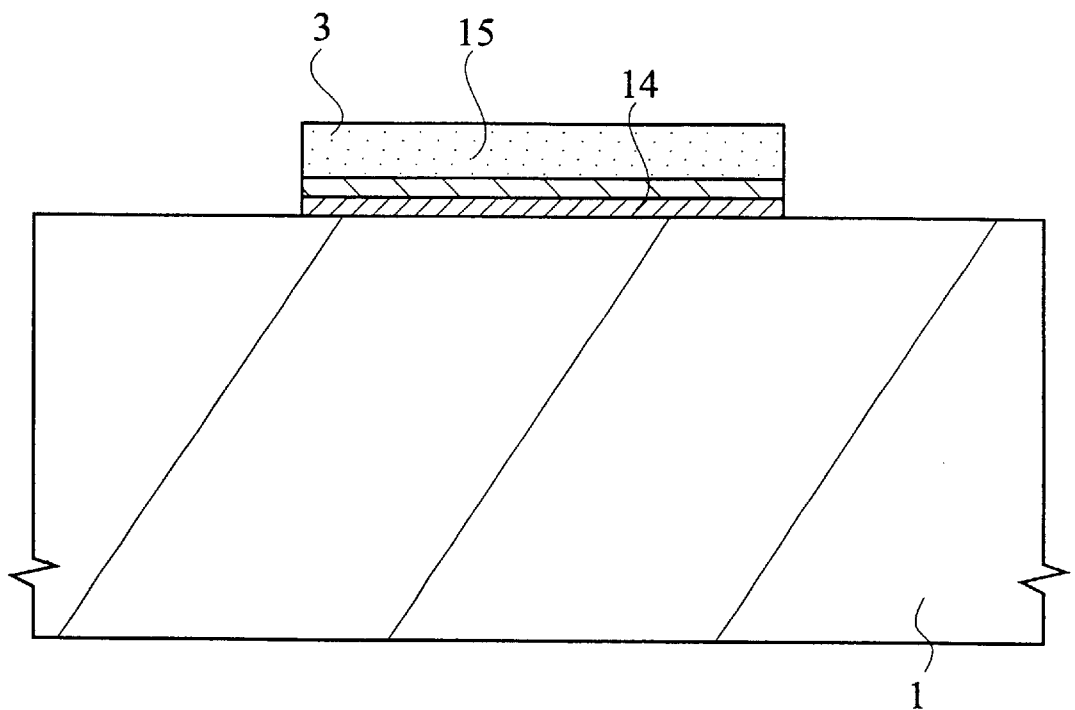

Next, as shown in FIGS. 13C and 14C, the polysilicon film of about 50 to 250 nm doped with the n-type or p-type impurity is deposited on the whole surface of the p-type semiconductor substrate 1 by using the LPCVD method. After that, it is patterned by using the exposure and etching techniques to accordingly form the gate electrode 3. In succession, the dry etching is performed in the self-alignment manner on the first gate insulation film 13, the second gate insulation film 14 and the third gate insulation film 15 on the surface of the p-type semiconductor substrate 1 in the area, in which the source and drain areas are formed, in the formation area of the nonvolatile memory of FIG. 13C, with the gate electrode 3 as mask. On the other hand, the dry etching is performed in the self-alignment manner on the second gate insulation film 14 and the third gate insulation film 15, in the formation area of the volatile memory of FIG. 14C.

Figure 13D:
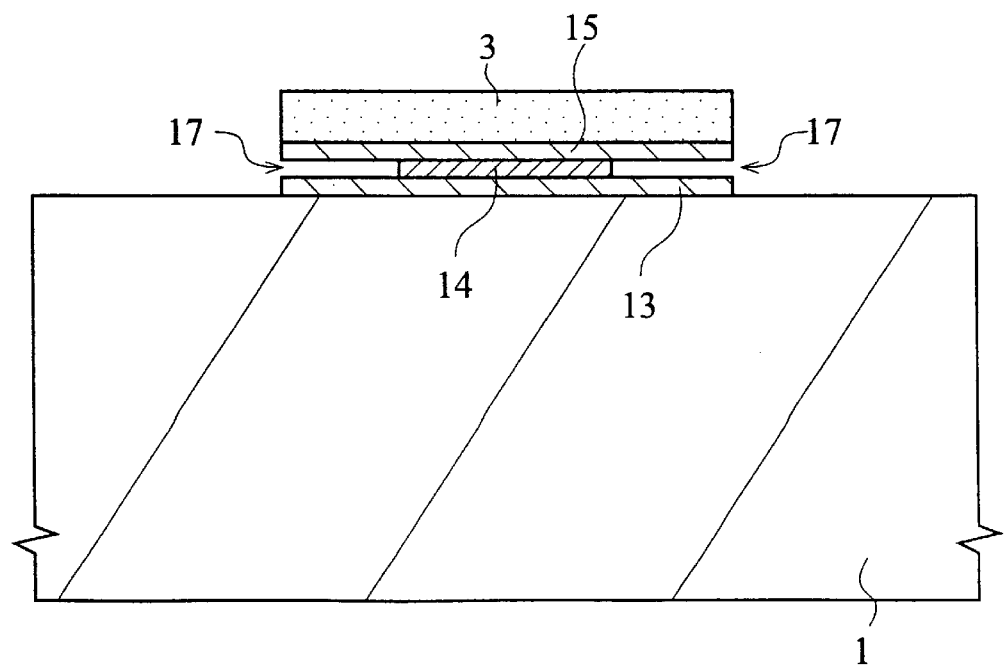
Figure 14D:
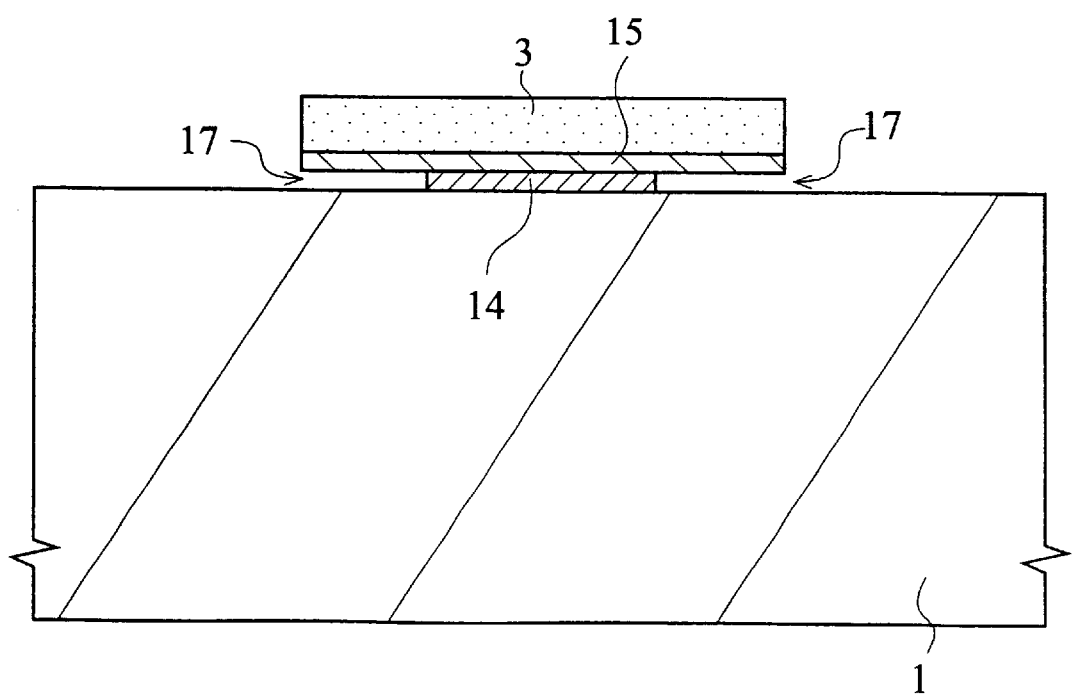

Next, as shown in FIGS. 13D and 14D, a space 17 is created to form the charge trapping layer. This space 17 is created by using the etching solution, in which an etching speed of the second gate insulation film 14 is faster than those of the first gate oxide film 13 and the third gate insulation film 15, and selectively performing the wet etching on an end of the second gate insulation film 14. The space 17 to form the charge trapping layer in the formation area of the nonvolatile memory of FIG. 13D is formed simultaneously with the space 17 to form the charge trapping layer in the formation area of the volatile memory of FIG. 14D. In the sixth embodiment of the present invention, the first gate oxide film 13 and the third gate insulation film 15 are made of the silicon nitride film, and the second gate insulation film 14 is made of the silicon oxide film. Thus, for example, the hydrofluoric acid system may be used as the etching solution. Also, this space 17 may be formed by using the plasma dry etching method of using the gas containing the HF gas, instead of the wet etching method of using the etching solution.

Figure 13E:
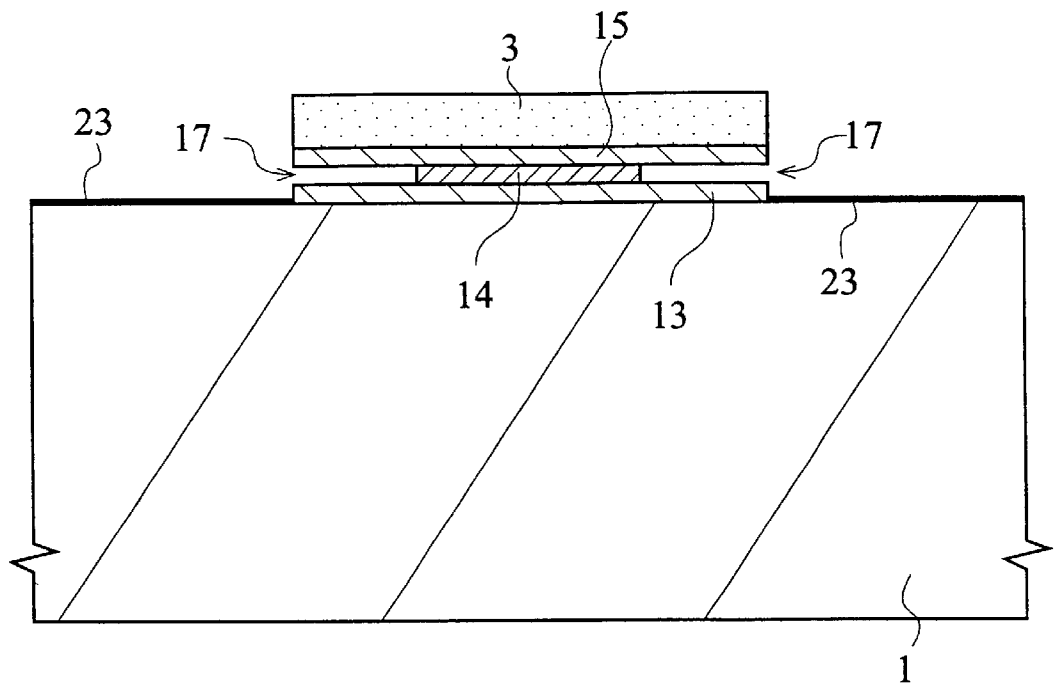
Figure 14E:
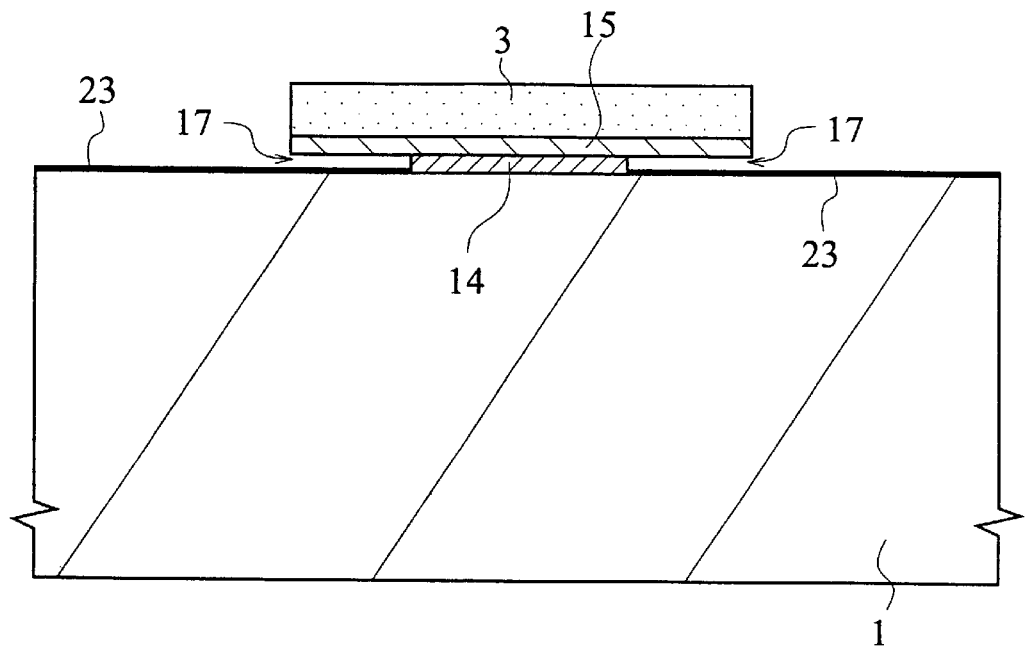

Next, as shown in FIGS. 13E and 14E, the whole surface of the p-type semiconductor substrate 1 is oxidized by using, for example, an RTO method, which accordingly forms the tunnel insulation film 23 made of the silicon oxide film that can be directly tunneled.

Figure 13F:
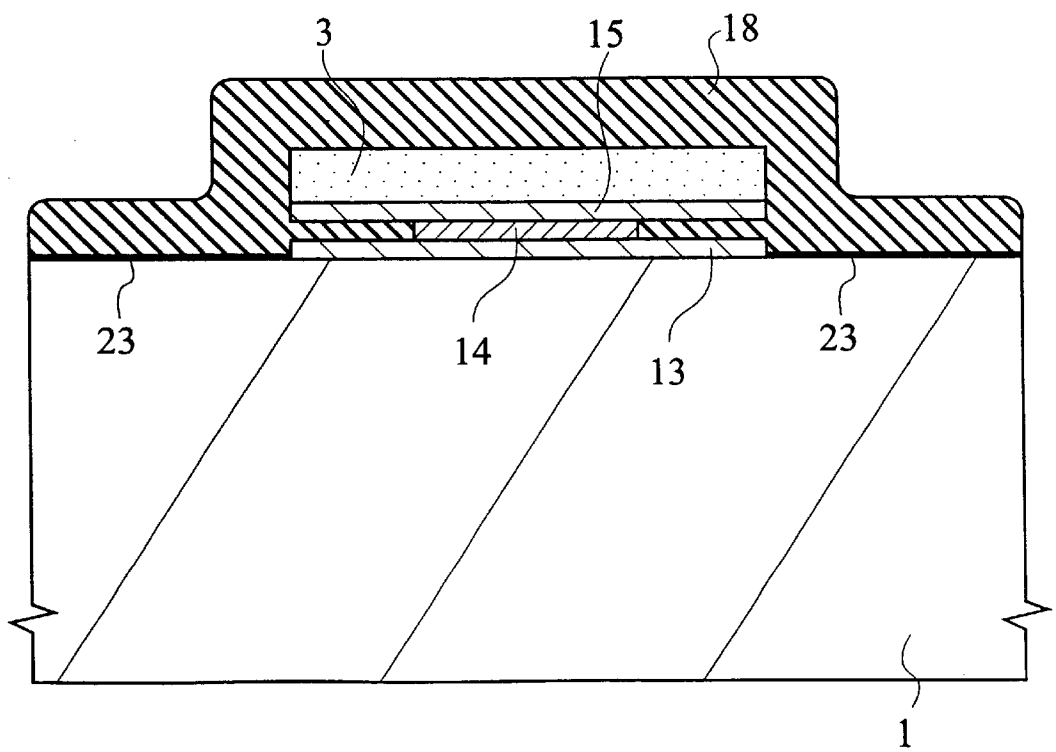
Figure 13G:
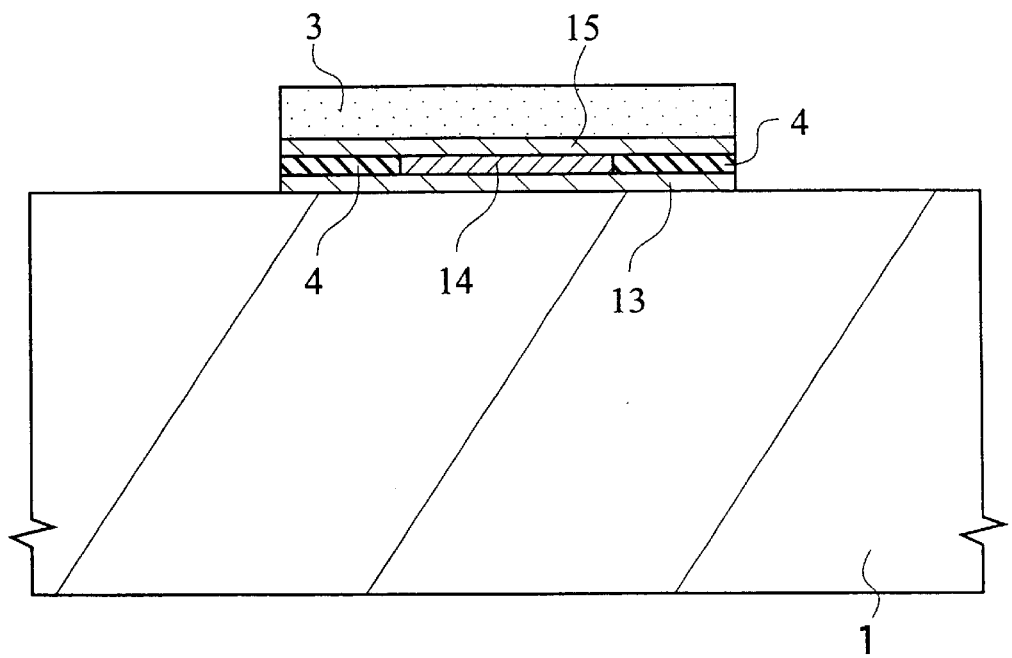
Figure 14F:
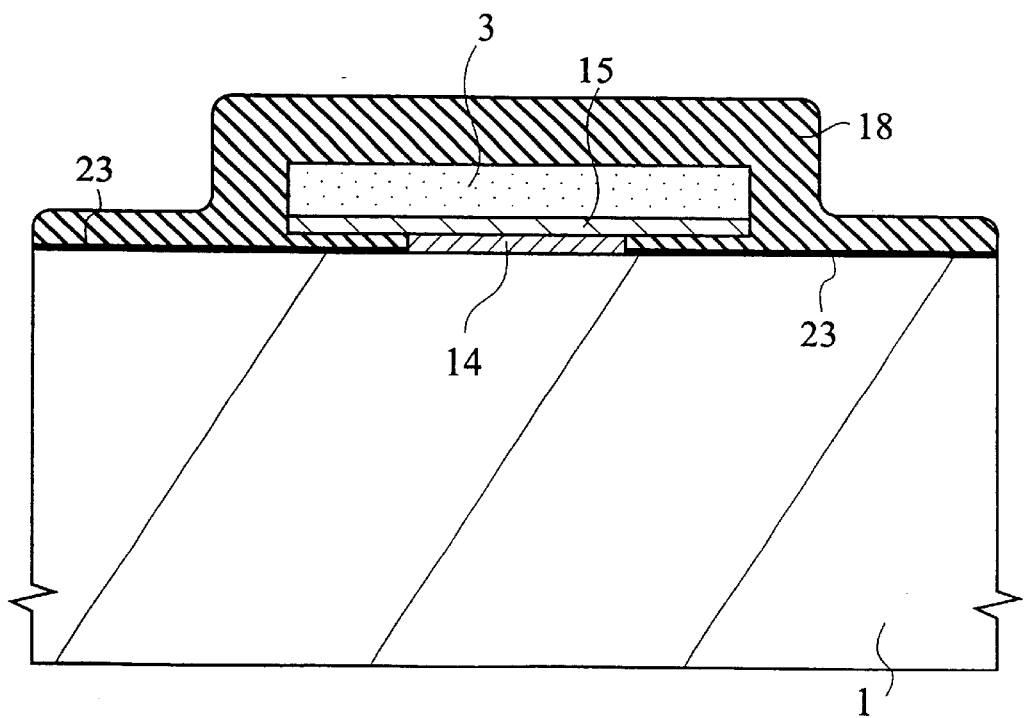
Figure 14G:
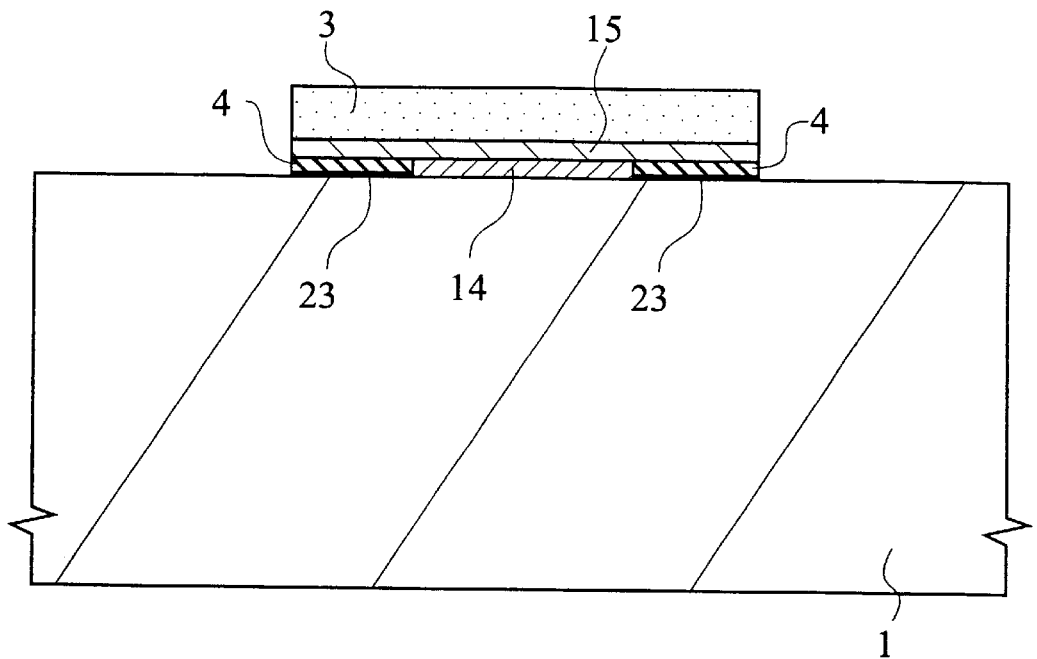

Next, as shown in FIGS. 13F and 14F, a silicon nitride film 18 having the high charge trapping ability is deposited on the whole surface of the p-type semiconductor substrate 1 by using the LPCVD method so that the silicon nitride film 18 is completely embedded in the space 17 to form the charge trapping layer. Then, as shown in FIGS. 13G and 14G, the anisotropic etching is performed on the whole surface of the p-type semiconductor substrate 1 by using the RIE method, which accordingly forms the charge trapping layers 4 (4a, 4b, 4c and 4d) made of the silicon nitride film having the high charge trapping ability at the same time.

Figure 13H:
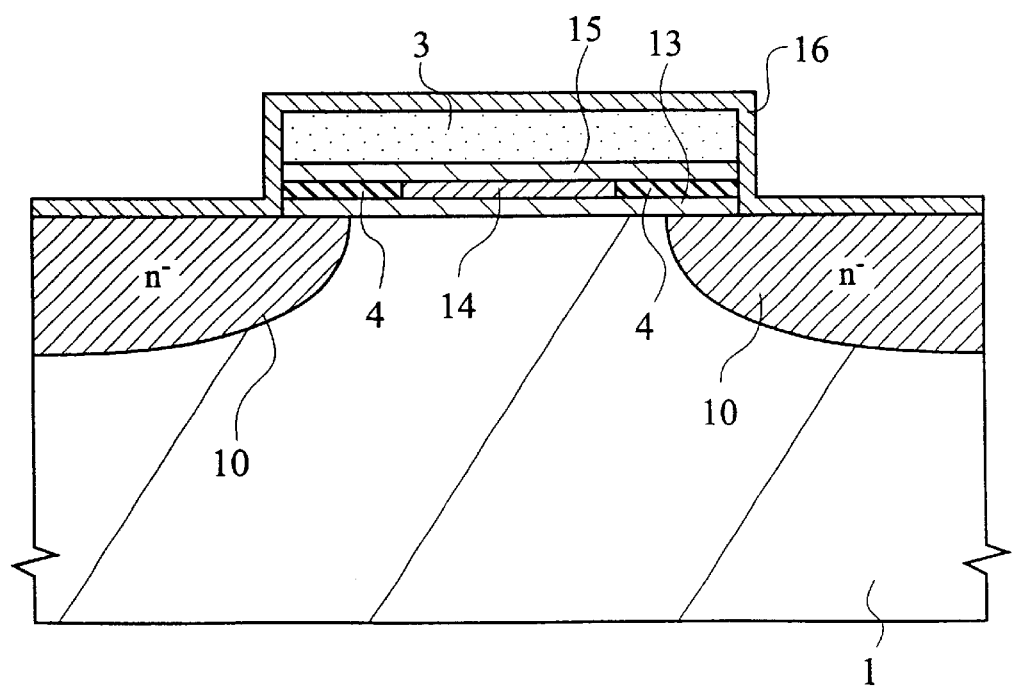
Figure 14H:
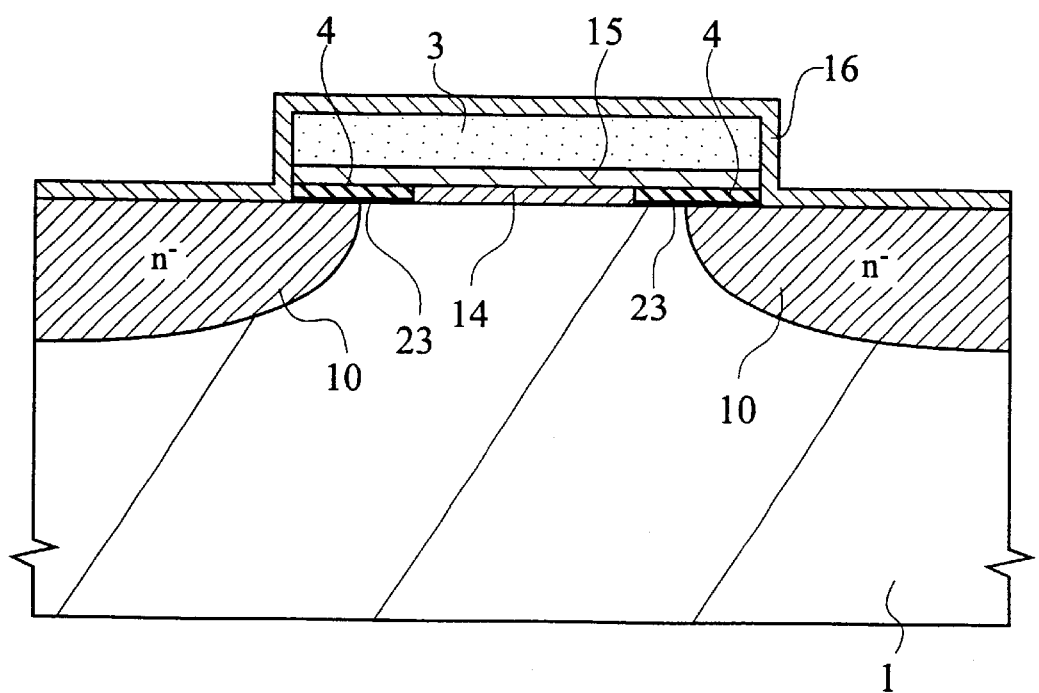

Next, as shown in FIGS. 13H and 14H, an $n^-$-type diffusion layer 10 of the low impurity concentration is formed after an oxide film 16 is formed on the whole surface of the p-type semiconductor substrate 1. The $n^-$-type diffusion layer 10 is formed by implanting the n-type impurity with the gate electrode 3 as mask, by using the ion implantation technique, and then activating the impurity implanted by the thermal treatment after the ion implantation.

Figure 13I:
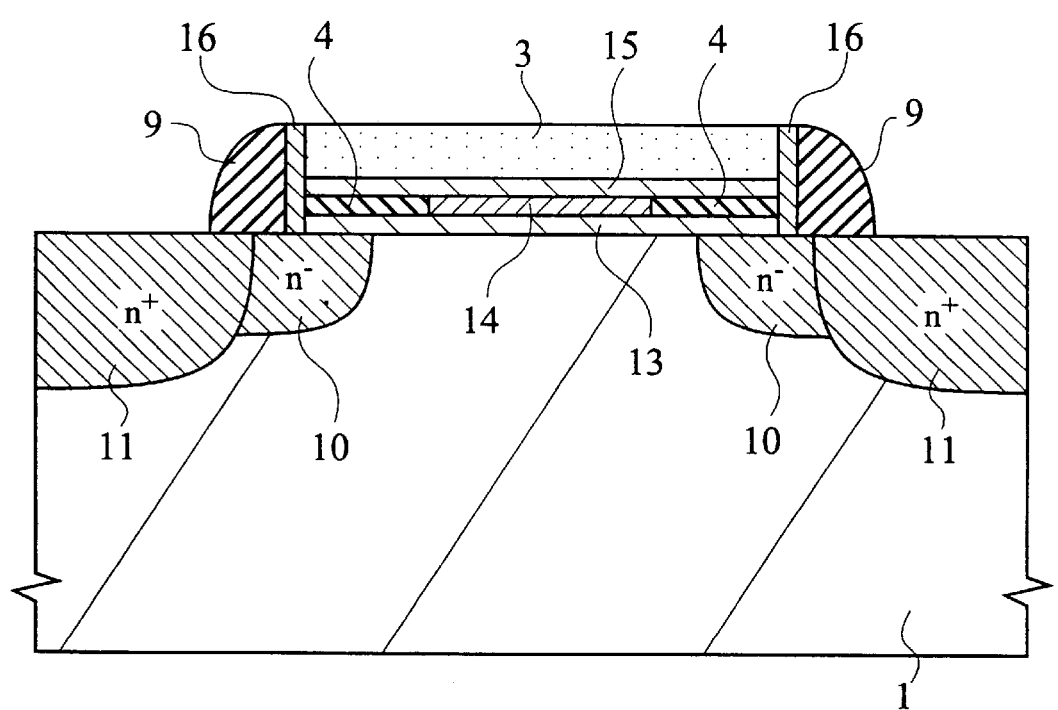
Figure 14I:
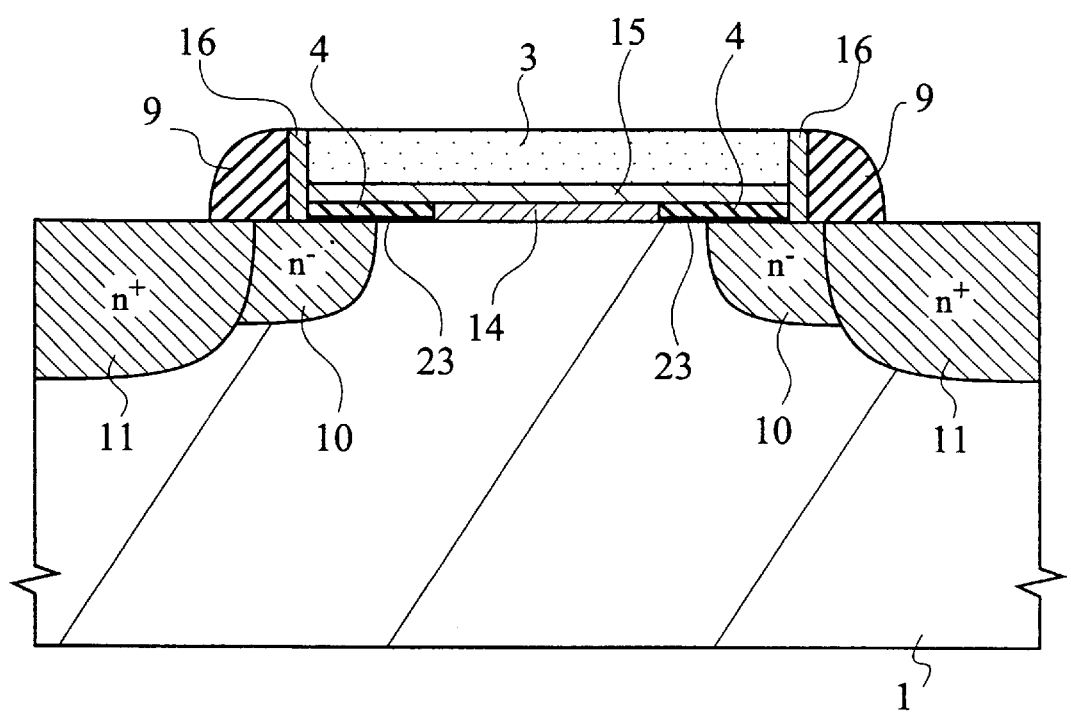

Next, as shown in FIGS. 13I and 14I, an $n^+$-type diffusion layer 11 of the high impurity concentration is formed after a side wall spacer 9 is formed on a side wall of the gate electrode 3. The $n^+$-type diffusion layer 11 is formed by implanting the n-type impurity, with the gate electrode 3 and the side wall spacer 9 as mask, by using the ion implantation technique, and then activating the impurity implanted by the thermal treatment after the ion implantation.

Next, the high melting point metallic film, such as tungsten, titanium, cobalt and the like, is deposited on the whole surface of the p-type semiconductor substrate 1 by using the CVD method or the sputtering method. In succession, the thermal treatment in the inactive atmosphere is performed on the p-type semiconductor substrate 1. Accordingly, conductive layers 12 made of the high melting point metallic silicide are formed on the respective surfaces of the gate electrode 3 and the $n^+$-type diffusion layer 11. The memory cell structure of the nonvolatile memory shown in FIG. 11A and the volatile memory shown in FIG. 11B is completed if the non-reacted high melting point metal which remains in areas other than the above-mentioned areas is removed after the formation of the conductive layers 12.

In addition, although not shown, a semiconductor device comprising the final nonvolatile and volatile memories is completed through the normal steps of manufacturing CMOS, such as the step of forming the inter-layer insulation film, the step of forming the contact hole, the step of forming the wiring, the step of forming the passivation film and the like, in succession, after the completion of the memory cell structures in FIGS. 11A and 11B.

As mentioned above, in the sixth embodiment of the present invention, the charge trapping layers 4 (4a, 4b, 4c and 4d) can be formed in the self-alignment manner below both ends of the gate electrode 3. Thus, gate length directions of the memory cell transistors of FIGS. 11A and 11B can be made hyperfine, which can accordingly provide the nonvolatile memory and the volatile memory which have a large capacitance and a high density. Moreover, a cell area per bit can be substantially halved as compared with the conventional technique to thereby attain the nonvolatile memory and the volatile memory which are largely scaled down.

Also, widths of the channel length directions in the charge trapping layers 4 can be easily controlled by adjusting an etching time and a difference between etching speeds of the first gate insulation film 13 and the third gate insulation film 15 and an etching speed of the second gate insulation film 14. Accordingly, the charge trapping layers 4 can be arranged in symmetry. So, the mutual action between the charge trapping layers 4 never occurs since the charge trapping layers 4 are perfectly electrically separated from each other through the second gate insulation film 14. Moreover, the nonvolatile and volatile memories having the excellent charge retention capability can be provided since the charge trapping layers 4 are perfectly insulated from the source area, the drain area, the gate area 3 and the channel area through the first insulation film 13, the tunnel insulation film 23, the third insulation film 15 and the oxide film 16. The charge trapping layers 4 are formed extensionally from the end of the gate electrode 3 to a channel area direction. The current transmission characteristic of the memory cell is substantially determined in accordance with the charge trapping state in the portion on the channel area side of the charge trapping layers 4. Hence, if a length of a gate length direction in this portion is reduced to the limit, it is possible to provide the further minute nonvolatile and volatile memories.

The cell structure can be easily attained in the normal CMOS step. Thus, the existing manufacturing line can be used to manufacture the nonvolatile and volatile memories at a low cost.

Moreover, in the above-mentioned nonvolatile and volatile memories, most of the steps of manufacturing them are made common. Thus, the semiconductor device in which the nonvolatile memory and the volatile memory are mixed can be manufactured at a low cost and in a short manufacturing period.

In addition, in the sixth embodiment of the present invention, the first gate insulation film 13 is made of the silicon nitride film, the second gate insulation film 14 is made of the silicon oxide film, and the third gate insulation film 15 is made of the silicon nitride film. However, the first gate insulation film 13 may be made of the silicon oxide film, the second gate insulation film 14 may be made of the silicon nitride film, and the third gate insulation film 15 may be made of the silicon oxide film. In this case, for example, the first gate insulation film 13 is made of the silicon oxide film of about 10 nm in which the p-type semiconductor substrate 1 is thermally oxidized. The second gate insulation film 14 is made of the silicon nitride film having the low charge trapping ability of about 5 to 10 nm deposited by using the JVD method. And, the third gate insulation film 15 is made of the silicon oxide film of about 10 nm deposited by using the CVD method. Also, the space 17 to form the charge trapping layer is formed in the configuration that the first gate insulation film 13 and the third gate insulation film 15 are made of the silicon oxide film and then the second gate insulation film 14 is made of the silicon nitride film. Thus, for example, the phosphoric acid system may be used as the etching solution.

Seventh Embodiment

Figure 15A:
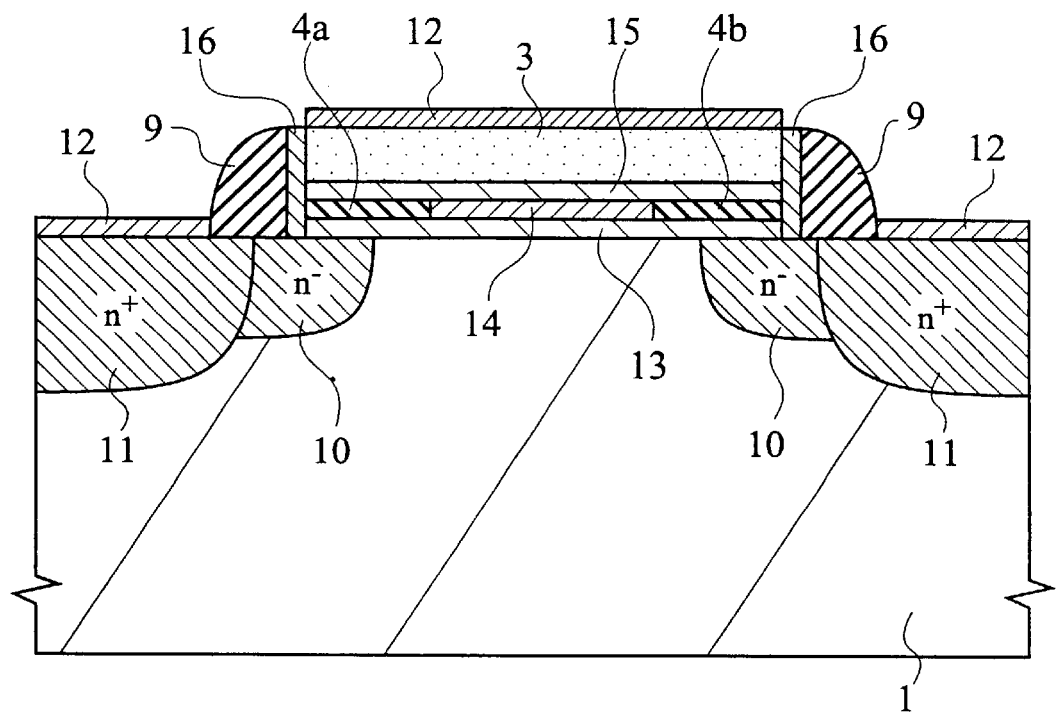
FIG. 15A is a sectional view showing a memory cell structure of a nonvolatile semiconductor memory formed in a semiconductor memory according to a seventh embodiment of the present invention.
Figure 15B:
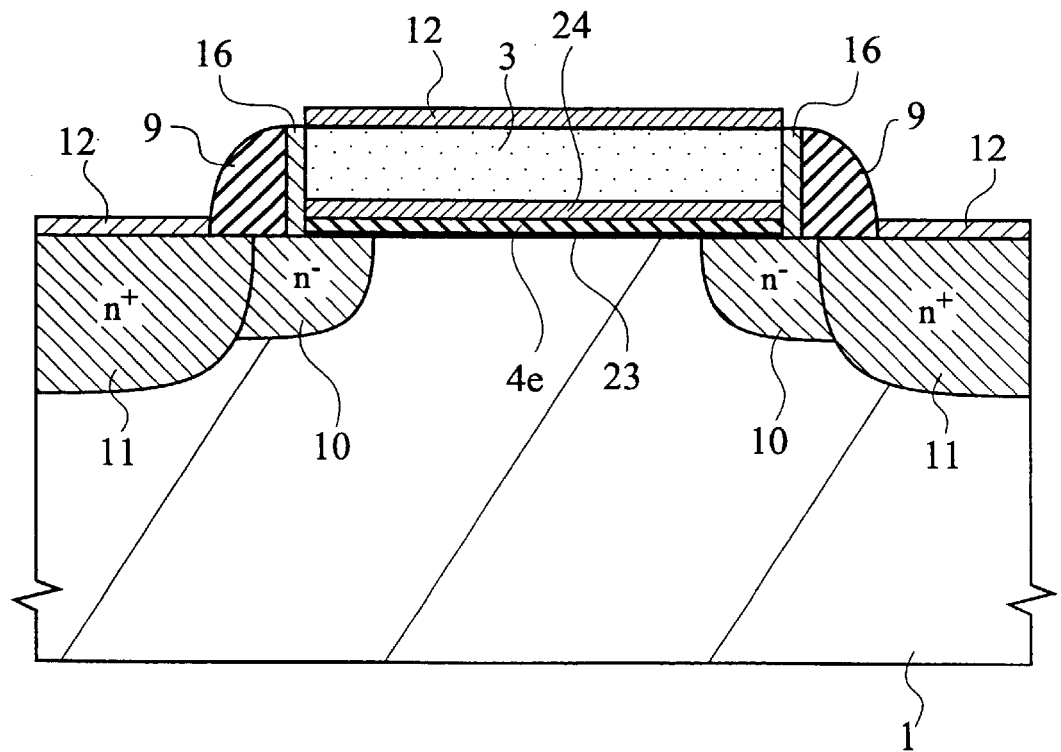
FIG. 15B is a sectional view showing a memory cell structure of a volatile semiconductor memory formed in the semiconductor memory according to the seventh embodiment of the present invention.

A seventh embodiment of the present invention will be described below. This seventh embodiment shows an example that an electrically writable and erasable nonvolatile memory and a rapidly writable and readable volatile memory are attained on the same chip, similarly to the sixth embodiment. FIG. 15A is a sectional view showing a memory cell structure of a nonvolatile memory formed in a semiconductor memory according to the seventh embodiment of the present invention. FIG. 15B is a sectional view showing a memory cell structure of a volatile memory formed in the semiconductor memory according to the seventh embodiment of the present invention. The nonvolatile memory of FIG. 15A and the volatile memory of FIG. 15B are mixed on the same chip. Since the nonvolatile memory shown in FIG. 15A is similar to that of the sixth embodiment, the explanation thereof is omitted here.

As shown in FIG. 15B, a memory cell of the volatile memory according to this seventh embodiment is constituted by the n-type MOS transistor. Then, in the memory cell structure of this volatile memory, a charge trapping layer 4e is formed on a main surface of a p-type semiconductor substrate 1 through a tunnel insulation film 23. A gate electrode 3 is formed on the charge trapping layer 4e through a fourth gate insulation film 24. A side wall spacer 9 is formed on a side of the gate electrode 3 through an oxide film 16. An $n^-$-type diffusion layer 10 of a low impurity concentration adjacent to a channel area and an $n^+$-type diffusion layer 11 of a high impurity concentration located outside this $n^-$-type diffusion layer 10 are formed on a main surface of a p-type semiconductor substrate 1 below this side wall spacer 9. Conductive layers 12 are formed on the respective surfaces of the gate electrode 3 and the $n^+$-type diffusion layer 11.

The memory cell of the volatile memory according to the seventh embodiment of the present invention has the LDD structure in which the source and drain areas are constituted by the $n^-$-type diffusion layers 10 of the low impurity concentration and the $n^+$-type diffusion layers 11 of the high impurity concentration. Then, the gate insulation film is constituted by stacked structure provided with the tunnel insulation film 23 and the fourth gate insulation film 21. The charge trapping layer 4e is formed between the tunnel insulation film 23 and the fourth gate insulation film 24. Electrons are trapped in this charge trapping layer 4e. The change amounts of a threshold voltage caused by the presence or absence of the electrons held in this charge trapping layer 4e are correlated with "0" and "1" of a memory information, respectively. The charge trapping layer 4e may be made of the silicon nitride film having the high charge trapping ability by using the CVD method. This is because the trapping of the electrons at the discrete charge capture level in the silicon nitride film enables the charge retention capability having little influence on the film quality of the lower insulation film. Also, if it is made of the silicon film or the polysilicon film, it can be manufactured at a low cost. Moreover, if the fourth gate insulation film 24 is made of the silicon nitride film ($Si_3N_4$ film) having the dielectric constant equal to about two times that of the silicon oxide film ($SiO_2$ film), it is possible to stably attain the very thin gate insulation film with the equivalent silicon oxide thickness is about 4 nm to 11 nm. For example, since the substantial film thickness of the silicon nitride film with the equivalent silicon oxide thickness is 5 nm is about 10 nm, the direct tunnel (DT) injection is never induced. Therefore, the voltage at the time of the injection and ejection operation of the electrons is made lower, which not only enables the memory cell to be hyperfine, but also enables the peripheral high voltage operation element to be hyperfine.

In the memory cell of the volatile memory according to the seventh embodiment of the present invention, the n⁻-type diffusion layer 10 is formed, and then the LDD structure is configured, in order to improve the breakdown voltages of the source and drain areas. However, the source and drain areas may be constituted by the single-drain structure or the double-drain structure.

In the volatile memory according to the seventh embodiment of the present invention, the tunnel insulation film 23 is formed in the lower portion of the charge trapping layer 4e. The tunnel insulation film 23 is made of the thin silicon oxide film having the film thickness that can be directly tunneled, which enables the rapidly writing and reading operation equal to or less than 100 ns that is required of the dynamic RAM. If the tunnel insulation film 23 is made of the silicon oxide film, its film thickness may be equal to or less than 3 nm. Also, if it is made of the silicon nitride film equal to or less than 3 nm, the very thin gate insulation film can be stably attained with the equivalent silicon oxide thickness is about 1.5 nm.

Moreover, the volatile memory according to the seventh embodiment of the present invention can function as the normal MOS transistor, unless the charges are implanted into the charge trapping layer 4e.

The method for manufacturing the memory cell of the nonvolatile memory and the volatile memory according to the seventh embodiment of the present invention will be described below with reference to FIGS. 16A to 16H and FIGS. 17A to 17H. FIGS. 16A to 16H are sectional views showing the method for manufacturing the nonvolatile memory according to the seventh embodiment of the present invention. And, FIGS. 17A to 17H are sectional views showing the method for manufacturing the volatile memory according to the seventh embodiment of the present invention.

Figure 16A:
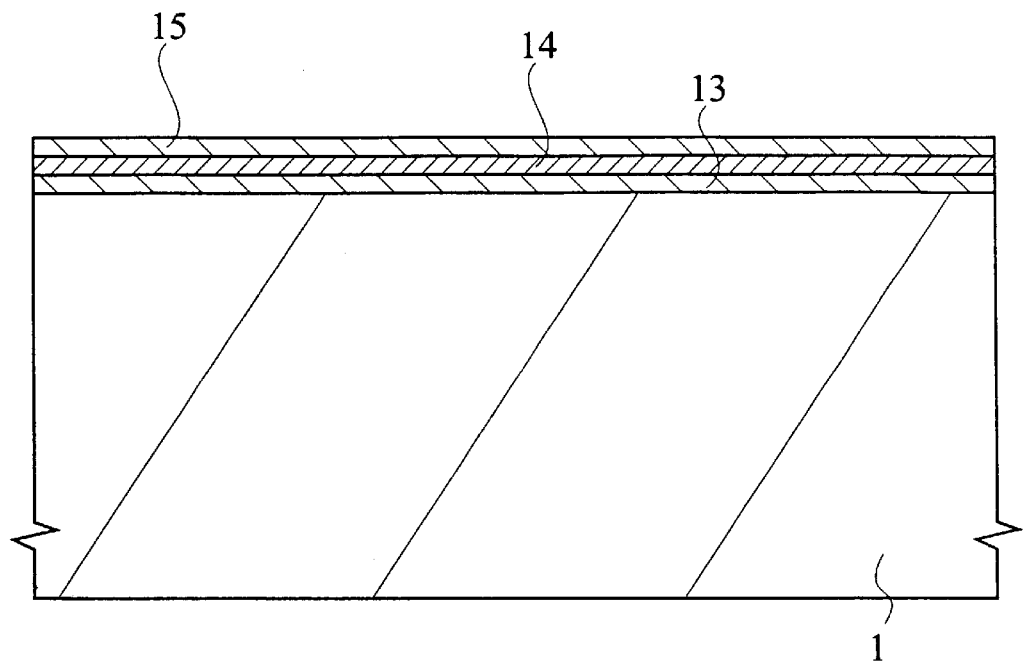
FIGS. 16A to 16H are sectional views showing the steps of manufacturing a memory cell of the nonvolatile semiconductor memory according to the seventh embodiment of the present invention.
Figure 17A:
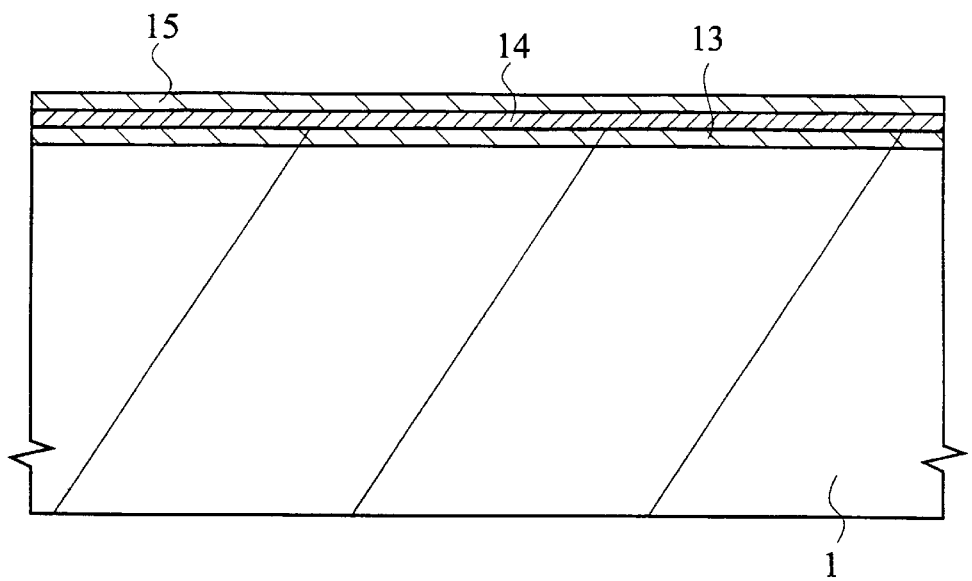
FIGS. 17A to 17H are sectional views showing the steps of manufacturing a memory cell of the volatile semiconductor memory according to the seventh embodiment of the present invention.

As shown in FIGS. 16A and 17A, the silicon nitride film having the low charge trapping ability is firstly deposited on the whole surface of a p-type semiconductor substrate 1 to accordingly form a first gate insulation film 13 of about 10 nm. The silicon nitride film having the low charge trapping ability is deposited by using, for example, the JVD method. After the formation of the first gate insulation film 13, silicon oxide film is deposited by using the CVD method to accordingly form a second gate insulation film 14 of about 5 to 10 nm. In succession, the silicon nitride film having the low charge trapping ability is deposited by using the JVD method to accordingly form a third gate insulation film 15 of about 10 nm.

Figure 16B:
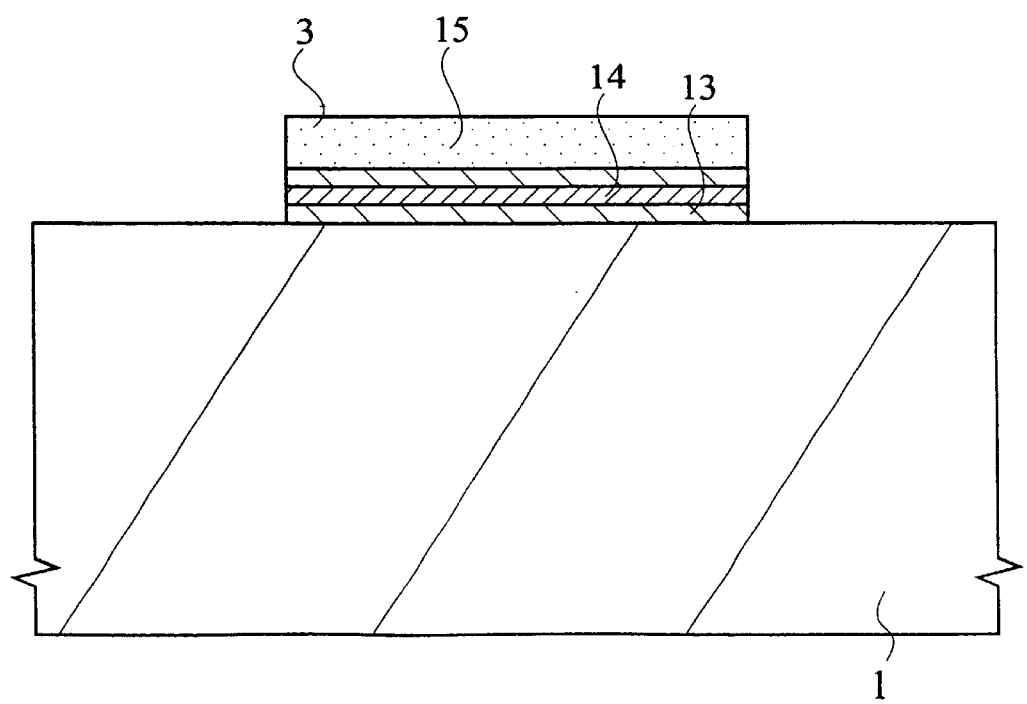
Figure 17B:
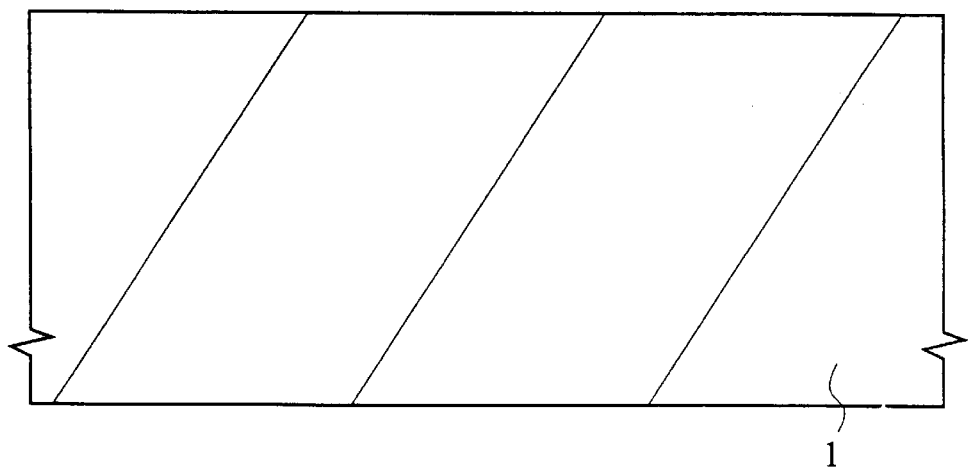

Next, as shown in FIGS. 16B and 17B, the polysilicon film of about 50 to 250 nm doped with the n-type or p-type impurity is deposited on the whole surface of the p-type semiconductor substrate 1 by using the LPCVD method. After that, in the formation area of the nonvolatile memory of FIG. 16B, it is patterned by using the exposure and etching techniques to accordingly form the gate electrode 3. In succession, the dry etching is performed in the self-alignment manner on the first gate insulation film 13, the second gate insulation film 14 and the third gate insulation film 15 on the surface of the p-type semiconductor substrate 1 in the area, in which the source and drain areas are formed, with the gate electrode 3 as mask. In the formation area of the volatile memory of FIG. 17B, the polysilicon film, the first gate insulation film 13, the second gate insulation film 14 and the third gate insulation film 15 are all removed so that the surface of the p-type semiconductor substrate 1 is exposed.

Figure 16C:
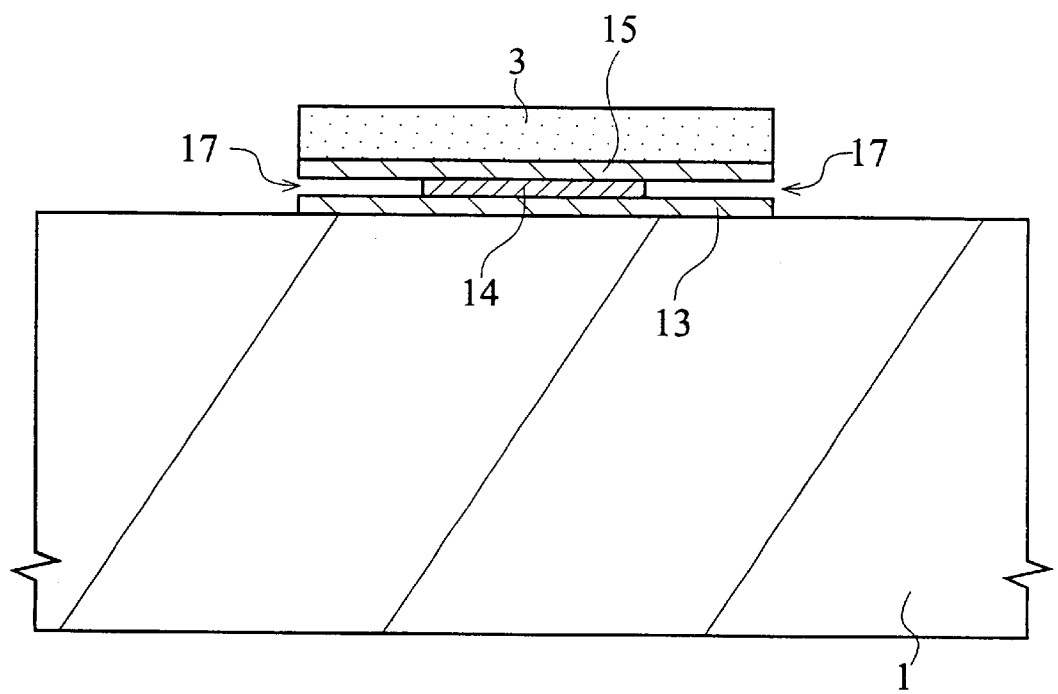
Figure 17C:
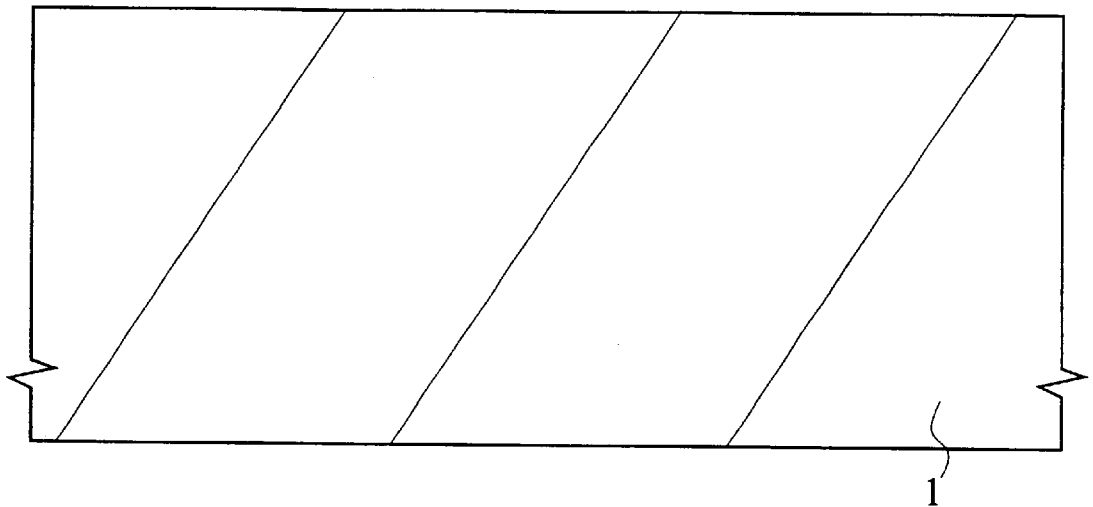

Next, as shown in FIG. 16C, in the formation area of the nonvolatile memory, a space 17 is created to form the charge trapping layer. This space 17 to form the charge trapping layer is created by using the etching solution, in which an etching speed of the second gate insulation film 14 is faster than those of the first gate oxide film 13 and the third gate insulation film 15, and selectively performing the wet etching on an end of the second gate insulation film 14. In the seventh embodiment of the present invention, the first gate oxide film 13 and the third gate insulation film 15 are made of the silicon nitride film, and the second gate insulation film 14 is made of the silicon oxide film. Thus, for example, the hydrofluoric acid system may be used as the etching solution. Also, this space 17 to form the charge trapping layer system may be formed by using the plasma dry etching method of using the gas containing the HF gas, instead of the wet etching method of using the etching solution. On the other hand, as shown in FIG. 17C, the surface of the p-type semiconductor substrate 1 remains in the exposed condition, in the formation area of the volatile memory.

Figure 16D:
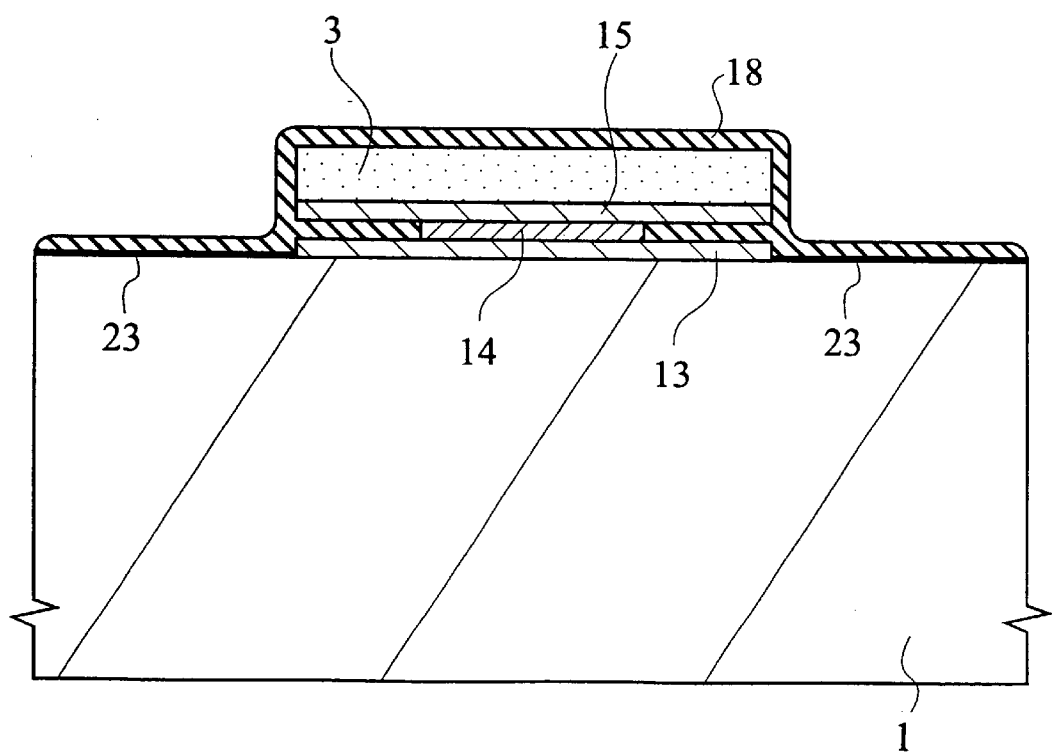
Figure 16E:
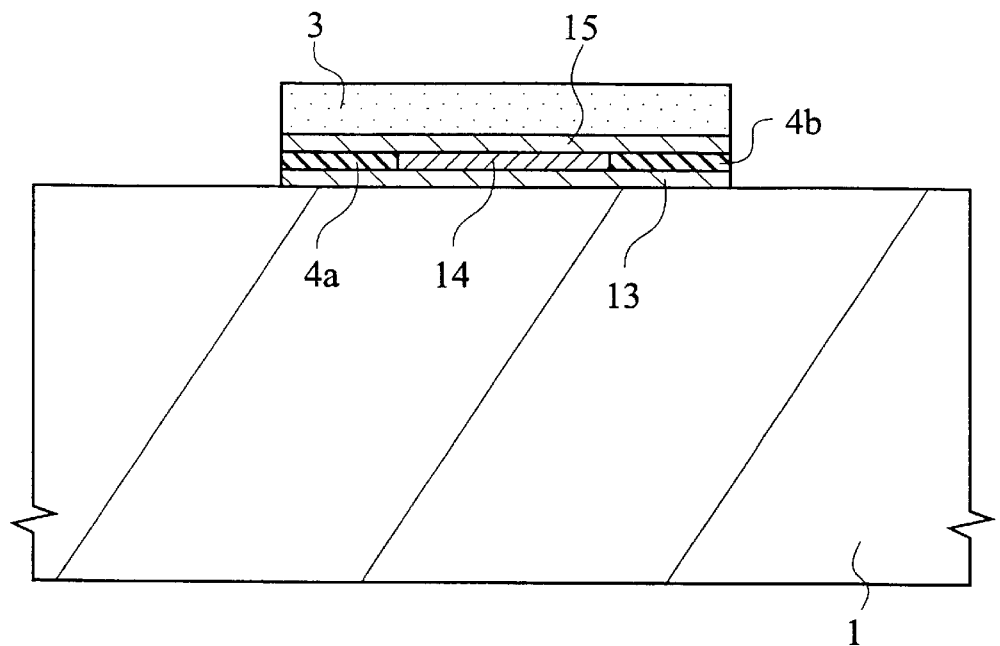
Figure 17D:
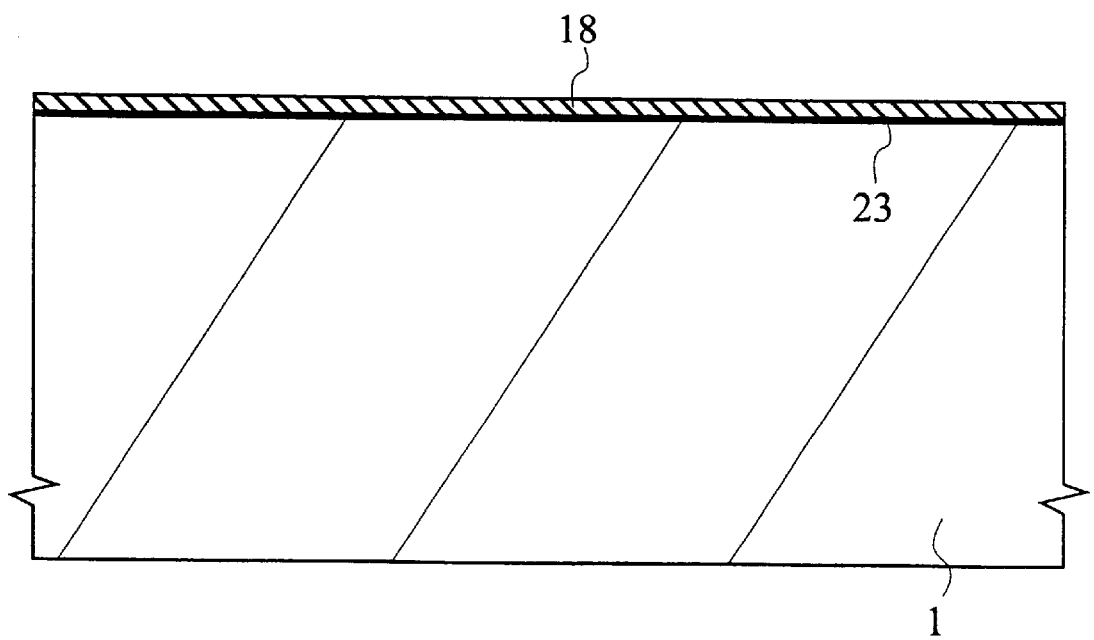
Figure 17E:
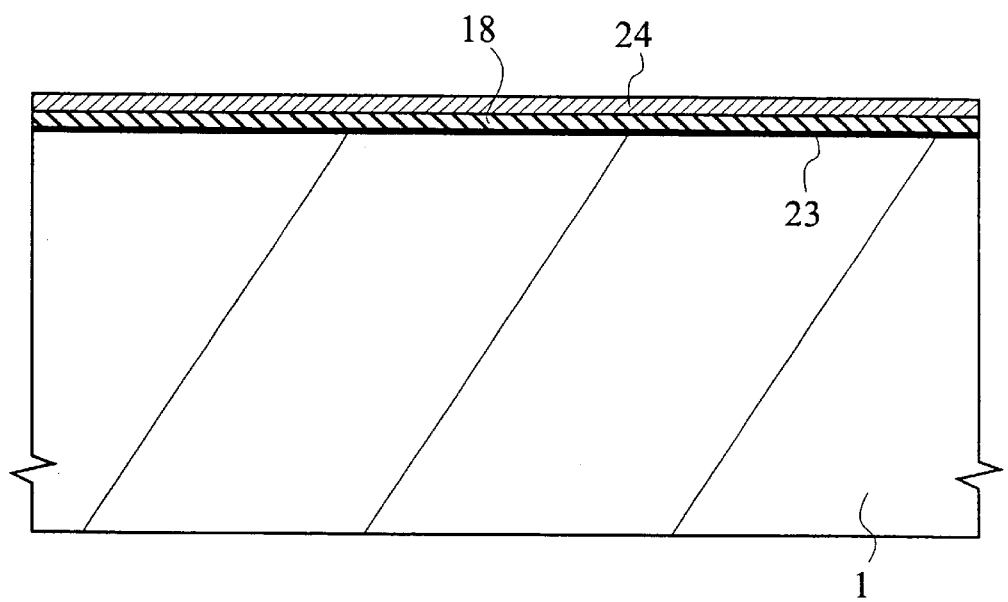

Next, as shown in FIGS. 16D and 17D, for example, the RTO method is used to form the tunnel insulation film 23 made of the silicon oxide film that can be directly tunneled, on the whole surface of the p-type semiconductor substrate 1. After the formation of the tunnel insulation film 23, a silicon nitride film 18 having a high charge trapping ability is deposited on the whole surface of the p-type semiconductor substrate 1 by using the LPCVD method. At this time, the silicon nitride film 18 is completely embedded in the space 17 to form the charge trapping layer. Then, as shown in FIG. 16E, in the formation area of the nonvolatile memory, the anisotropic etching is performed on the whole surface of the p-type semiconductor substrate 1 by using the RIE method, which accordingly forms the charge trapping layers 4 (4a, 4b) made of the silicon nitride film having the high charge trapping ability. At this time, the formation area of the volatile memory of FIG. 17E is coated with the photo resist, and thereby the silicon nitride film 18 is not etched.

After the silicon nitride film 18 is etched, the silicon oxide film is deposited on the whole surface of the p-type semiconductor substrate 1 to accordingly form the fourth gate insulation film 24. Here, the fourth gate insulation film 24 in the formation area of the nonvolatile memory of FIG. 16E is removed. This removal is done by coating the formation area of the volatile memory of FIG. 17E with the photo resist, and then etching the fourth gate insulation film 24 deposited on the formation area of the nonvolatile memory of FIG. 16E.

Figure 16F:
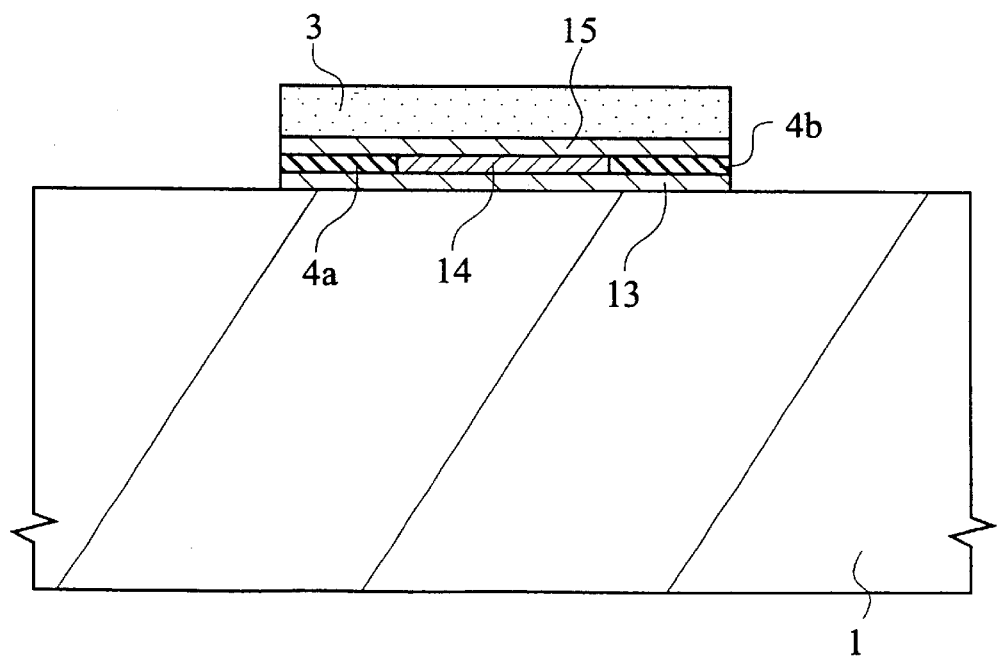
Figure 17F:
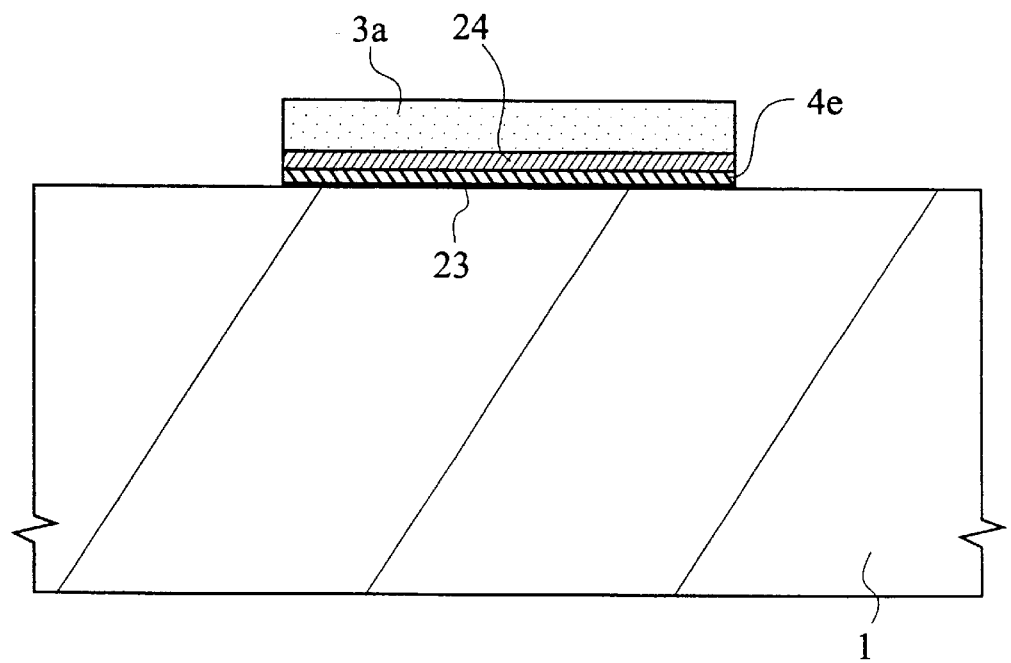

Next, as shown in FIG. 17F, the polysilicon film of about 50 to 250 nm doped with the n-type or p-type impurity is deposited on the whole surface of the p-type semiconductor substrate 1 by using the LPCVD method. Then, the polysilicon film is patterned by using the exposure and etching techniques to accordingly form a gate electrode 3a. In succession, the dry etching is performed in the self-alignment manner on the tunnel insulation film 23, the charge trapping layer 4e and the fourth gate insulation film 24 on the surface of the p-type semiconductor substrate 1 in the area, in which the source and drain areas are formed, with the gate electrode 3a as etching mask. On the other hand, in the formation area of the nonvolatile memory, as shown in FIG. 16F, the polysilicon film may be perfectly removed, or it may be patterned in alignment with the gate electrode 3 to then create a new gate electrode.

Figure 16G:
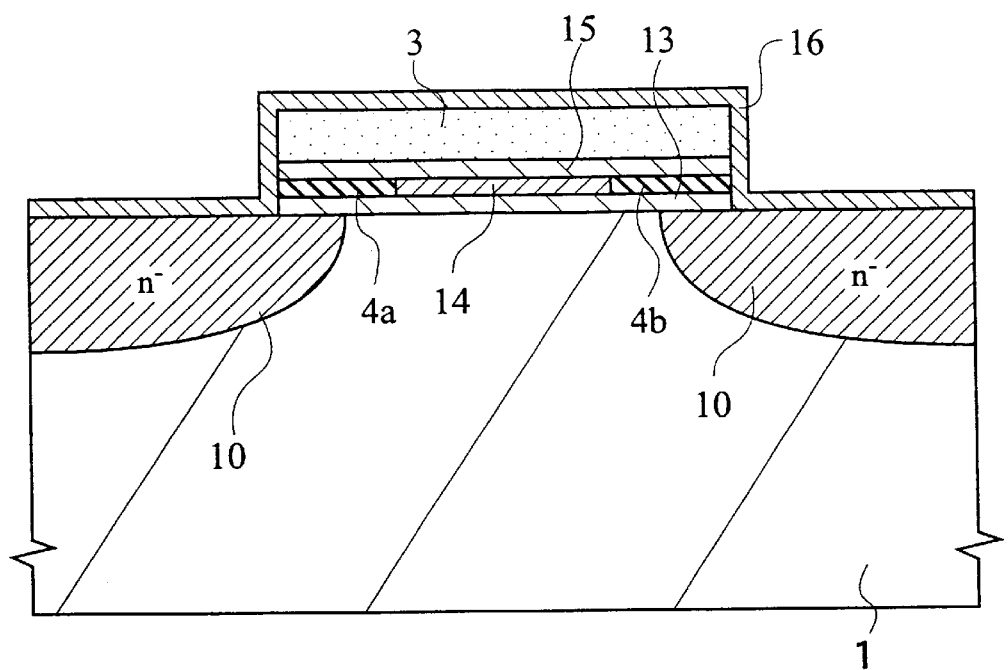
Figure 17G:
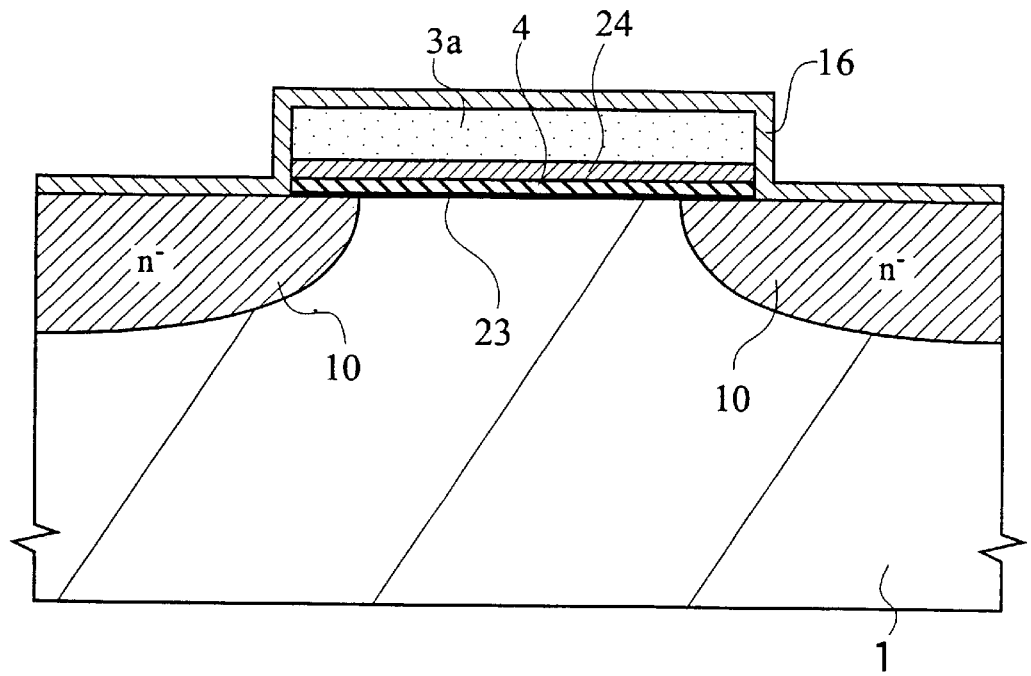

Next, as shown in FIGS. 16G and 17G, an $n^-$-type diffusion layer 10 of the low impurity concentration is formed after an oxide film 16 is formed on the whole surface of the p-type semiconductor substrate 1. The $n^-$-type diffusion layer 10 is formed by implanting the n-type impurity, with the gate electrode 3 as mask, by using the ion implantation technique, and then activating the impurity implanted by the thermal treatment after the ion implantation.

Figure 16H:
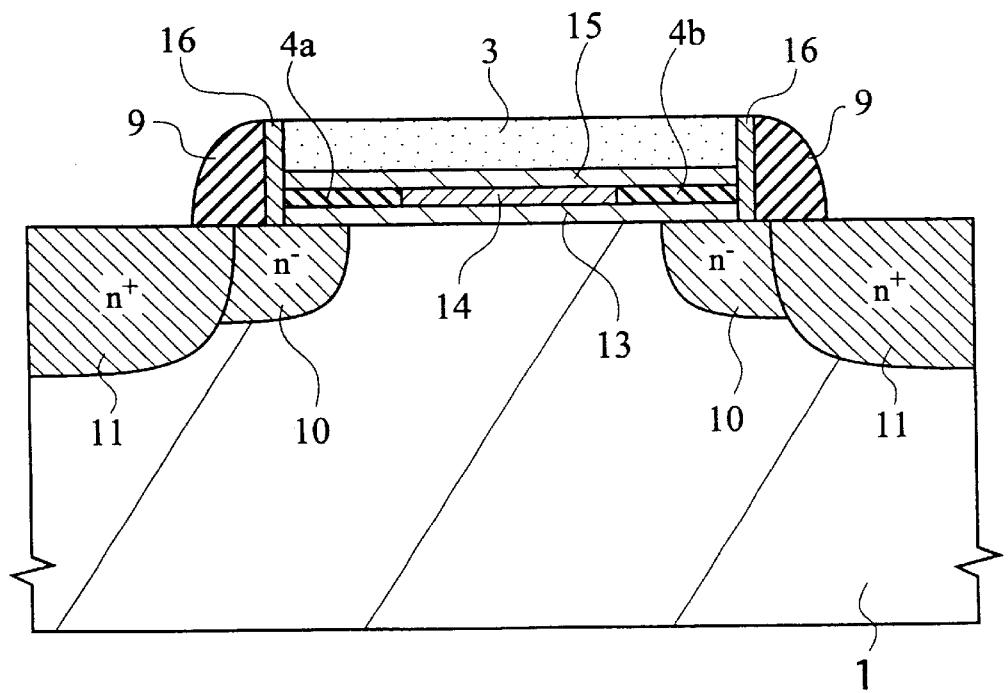
Figure 17H:
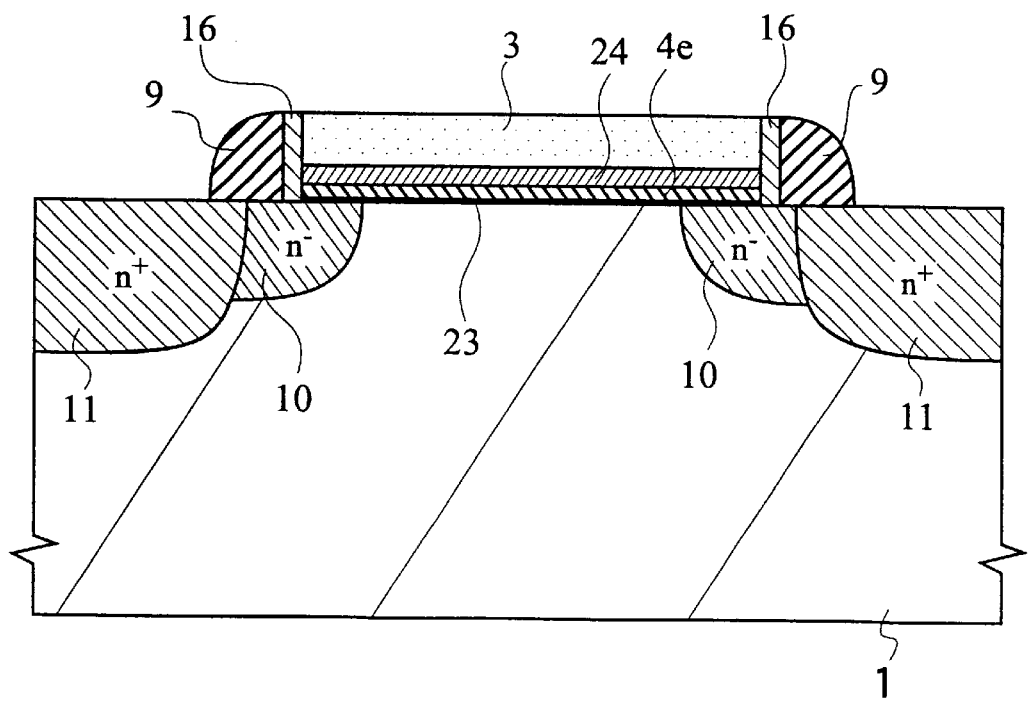

Next, as shown in FIGS. 16H and 17H, an $n^+$-type diffusion layer 11 of the high impurity concentration is formed after a side wall spacer 9 is formed on a side wall of the gate electrode 3. The $n^+$-type diffusion layer 11 is formed by implanting the n-type impurity, with the gate electrode 3 and the side wall spacer 9 as mask, by using the ion implantation technique, and then activating the impurity implanted by the thermal treatment after the ion implantation.

Next, the high melting point metallic film, such as tungsten, titanium, cobalt and the like, is deposited on the whole surface of the p-type semiconductor substrate 1 by using the CVD method or the sputtering method. In succession, the thermal treatment in the inactive atmosphere is performed on the p-type semiconductor substrate 1. Accordingly, conductive layers 12 made of the high melting point metallic silicide are formed on the respective surfaces of the gate electrode 3 and the $n^+$-type diffusion layer 11. The memory cell structure of the nonvolatile memory shown in FIG. 15A and the volatile memory shown in FIG. 15B is completed if the non-reacted high melting point metal which remains in areas other than the above-mentioned areas is removed after the formation of the conductive layers 12.

Although not shown, the final nonvolatile and volatile memories are completed through the normal steps of manufacturing CMOS, such as the step of forming the inter-layer insulation film, the step of forming the contact hole, the step of forming the wiring, the step of forming the passivation film and the like, in succession, after the completion of the memory cell structures in FIGS. 15A and 15B.

In the seventh embodiment of the present invention, the first gate insulation film 13 is made of the silicon nitride film, the second gate insulation film 14 is made of the silicon oxide film, and the third gate insulation film 15 is made of the silicon nitride film. However, the first gate insulation film 13 may be made of the silicon oxide film, the second gate insulation film 14 may be made of the silicon nitride film, and the third gate insulation film 15 may be made of the silicon oxide film. In this case, for example, the first gate insulation film 13 is made of the silicon oxide film of about 10 nm in which the p-type semiconductor substrate 1 is thermally oxidized. The second gate insulation film 14 is made of the silicon nitride film having the low charge trapping ability of about 5 to 10 nm deposited by using the JVD method. And, the third gate insulation film 15 is made of the silicon oxide film of about 10 nm deposited by using the CVD method. Also, the space 17 to form the charge trapping layer is formed in the configuration that the first gate insulation film 13 and the third gate insulation film 15 are made of the silicon oxide film and then the second gate insulation film 14 is made of the silicon nitride film. Thus, for example, the phosphoric acid system may be used as the etching solution.

The sixth and seventh embodiments of the present invention describe the example that the memory cell of the nonvolatile memory and the volatile memory are both constituted by the n-type MOS transistors. However, of course, the memory cell may be constituted by the oppositely conductive type of p-type MOS transistors. In this case, the conductive type of the substrate and the diffusion layer may be suitably substituted for the opposite type.

Eighth Embodiment

An eighth embodiment of the present invention will be described below. In the first to seventh embodiments, the structure of the charge trapping layer does not contribute directly to the improvement of an electron injection efficiency. In a nonvolatile semiconductor memory of floating gate structure, a trial of mounting a step structure in a channel portion and accordingly improving the electron injection efficiency is proposed (S.Ogura, 1998IEDM, p987, U.S. Patent Publication No. 5780341). However, since this proposal employs the floating gate structure, it is weak at leak site or defect in oxide film. Also, there may be a fear that sufficient reliability is not obtained for defect that may occur in forming the structure of the step structure. The eighth embodiment of the present invention can improve the electron injection efficiency in a simple process.

Figure 18:
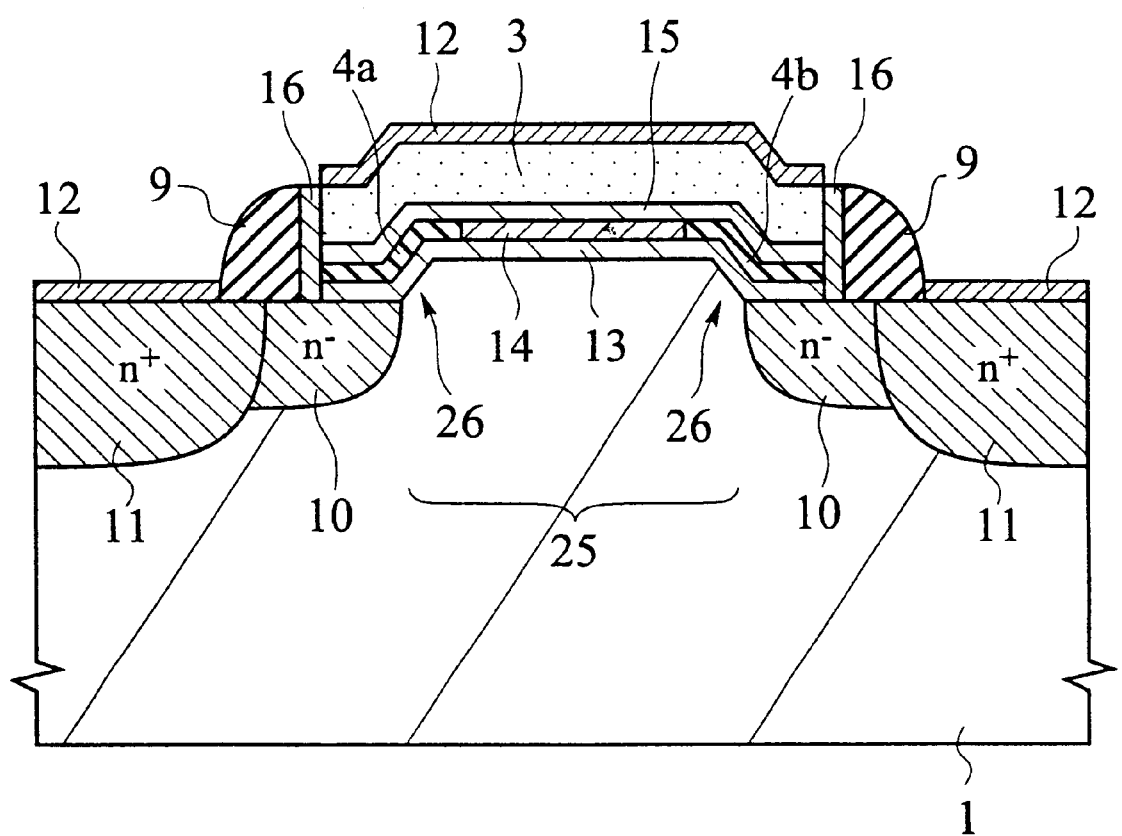
FIG. 18 is a sectional view showing a memory cell structure of a nonvolatile semiconductor memory according to an eighth embodiment of the present invention.

FIG. 18 is a sectional view showing a memory cell structure of a nonvolatile semiconductor memory according to the eighth embodiment of the present invention. This eighth embodiment is intended to mount a slope structure and a step structure in a channel area of a memory cell to accordingly improve the electron injection efficiency in the writing operation. As shown in FIG. 18, this memory cell is provided with the n-type MOS transistor. In the memory cell structure according to the eighth embodiment, a second gate insulation film 14 is formed on a surface of a p-type semiconductor substrate 1 through a first gate insulation film 13. Charge trapping layers 4a, 4b are formed on both ends of the second gate insulation film 14. A gate electrode 3 is formed on the second gate insulation film 14 and the charge trapping layers 4a, 4b through a third gate insulation film 15. A side wall spacer 9 is formed on a side of the gate electrode 3 through an oxide film 16. An $n^-$-type diffusion layer 10 of a low impurity concentration adjacent to the channel area and an $n^+$-type diffusion layer 11 of a high impurity concentration located outside this $n^-$-type diffusion layer 10 are formed in a p-type semiconductor substrate 1 below this side wall spacer 9. Conductive layers 12 are formed on the respective surfaces of the gate electrode 3 and the $n^+$-type diffusion layer 11.

Moreover, in the memory cell structure of the nonvolatile semiconductor memory according to the eighth embodiment of the present invention, a step structure 26 is formed in a channel area 25. Due to this step structure 26, the charge trapping layer 4 is located in a scattering direction of electrons within the p-type semiconductor substrate 1 to thereby improve the electron injection efficiency in the writing operation.

The memory cell of the nonvolatile semiconductor memory according to the eighth embodiment of the present invention has the LDD structure in which the source and drain areas are constituted by the $n^-$-type diffusion layers 10 of the low impurity concentration and the $n^+$-type diffusion layers 11 of the high impurity concentration. Then, the gate insulation film is constituted by the three-layer stacked film composed of the first gate insulation film 13 (bottom layer), the second gate insulation film 14 (middle layer) and the third gate insulation film 15 (top layer). The charge trapping layers 4a, 4b are formed on both the ends of the second gate insulation film 14. Electrons are trapped in those two charge trapping layers 4a, 4b. Its trapping state may include the following four states: (1) the state that the electrons are not trapped in any one of the charge trapping layers 4a, 4b; (2) the state that the electrons are trapped in only the charge trapping layer 4a; (3) the state that the electrons are trapped in only the charge trapping layer 4b; and (4) the state that the electrons are trapped in both the charge trapping layers 4a, 4b. The change amounts of the threshold voltage caused by the presence or absence of the electrons held in those two charge trapping layers 4a, 4b are correlated with "00", "01", "10" and "11" of a memory information, respectively. In this memory cell structure, the charge trapping layers 4a, 4b are positioned in the upper portion of the end of the channel area. Thus, a threshold voltage at a center of the channel area is determined only by an impurity concentration of the channel area, and does not depend on the trapping state of the electrons in the charge trapping layers 4a, 4b. Hence, the over-erasure caused by the excess or deficiency of the electrons in the charge trapping layers 4a, 4b can be protected so that the leakage trouble, the program defect, the read out error and the like are never induced because of the over-erasure. Also, the leakage current between the source and drain areas can be suppressed only by a gate voltage to thereby attain the nonvolatile semiconductor memory of high reliability. The charge trapping layers 4a, 4b may be made of the silicon nitride film having the high charge trapping ability by using the CVD method. This is because the trapping of the electrons at the discrete charge capture level in the silicon nitride film enables the charge retention capability having little influence on the film quality of the lower insulation film. Also, if it is made of the silicon film or the polysilicon film, it can be manufactured at a low cost. Moreover, if the first gate insulation film 13 and the third gate insulation film 15 are made of the silicon nitride film ($Si_3N_4$ film) having the dielectric constant equal to about two times that of the silicon oxide film ($SiO_2$ film), it is possible to stably form the very thin gate insulation film with the equivalent silicon oxide thickness is about 4 nm to 11 nm. For example, since the substantial film thickness of the silicon nitride film with the equivalent silicon oxide thickness is 5 nm is about 10 nm, the direct tunnel (DT) injection is never induced. Therefore, the voltage at the time of the injection and ejection operation of the electrons is made lower, which not only enables the memory cell to be hyperfine, but also enables the peripheral high voltage operation element to be hyperfine.

In the memory cell of the nonvolatile semiconductor memory according to the eighth embodiment of the present invention, the $n^-$-type diffusion layer 10 is formed, and then the LDD structure is configured, in order to improve the breakdown voltages of the source and drain areas. However, the source and drain areas may be constituted by the single-drain structure or the double-drain structure. Although the second gate insulation film 14 avoids the leakage between the charge trapping layers 4a and 4b, it may be made of, for example, the silicon oxide film. The current transmission characteristic at the center of the channel area can be improved if the metallic oxide film having the high dielectric constant is used for the second gate insulation film 14. The metallic oxide film includes, for example, $TiO_2$, $Ta_2O_5$, $Al_2O_5$, PZT and SBT.

In the eighth embodiment of the present invention, the step structures 26 are formed in both the source and the drain. However, it may be formed in any one of the source and the drain. It is enough that the step structure 26 is formed in one of them, especially in a memory for storing an information corresponding to one bit.

Figure 19A:
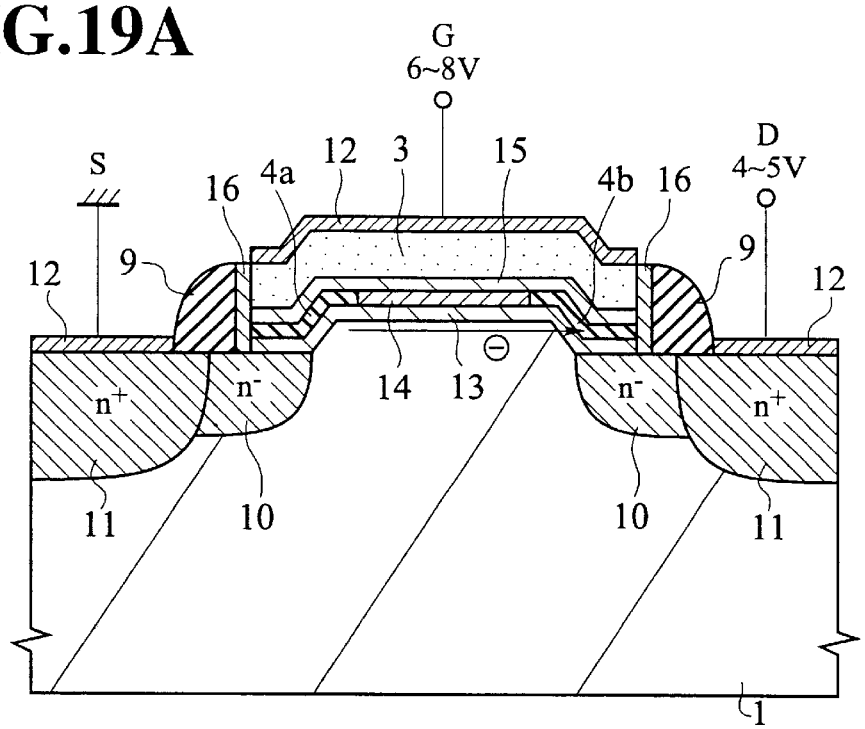
FIGS. 19A and 19B are sectional views showing the operation of the nonvolatile semiconductor memory according to the eighth embodiment of the present invention.
Figure 19B:
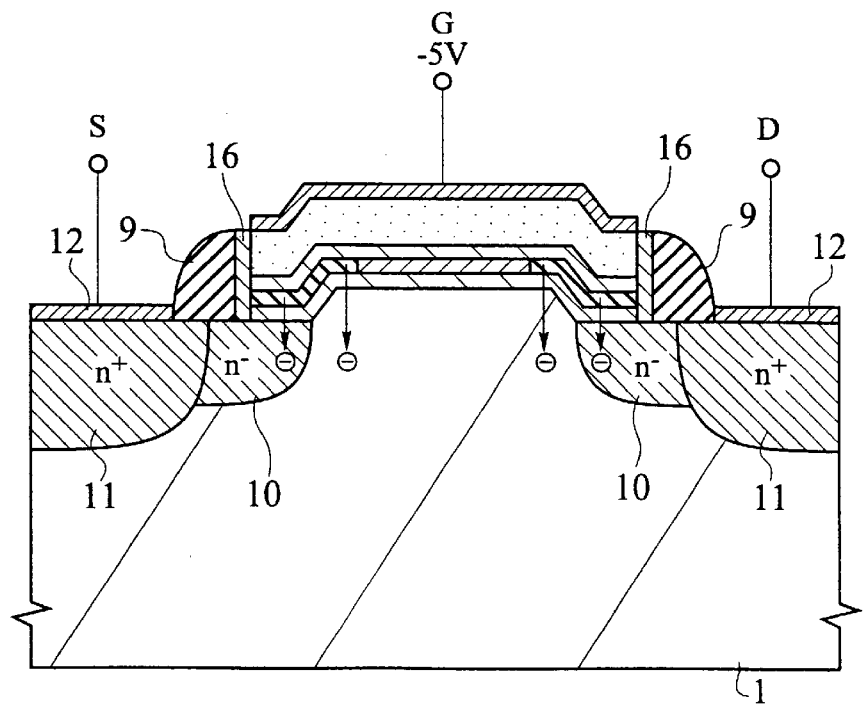

The operation of the nonvolatile memory according to the eighth embodiment of the present invention will be described below with reference to FIGS. 19A and 19B. FIG. 19A is a sectional view of the nonvolatile memory describing the writing operation. FIG. 19B is a sectional view of the nonvolatile memory describing the erasing operation. As shown in FIG. 19A, when the memory cell is written, a voltage of about 6 to 8 V is applied to a gate G, a voltage of about 4 to 5 V is applied to a drain D, respectively, and a source S is grounded. In this way, the voltages are applied. So, through the channel hot electron (CHE), electrons are implanted into the charge trapping layer 4b on the side of the drain area. Since the step structure 26 is formed in the channel area 25, the charge trapping layer 4b is located in the scattering direction of the electrons. Thus, the injection efficiency of the electrons to the charge trapping layer 4b can be improved to thereby make the injection speed faster and also reduce the applied voltage. If the electrons are implanted into the charge trapping layer 4a on the side of the source area, the respective voltages applied to the drain D and the source S may be interchanged from the above-mentioned case. On the other hand, as shown in FIG. 19B, the memory cell is erased by applying a negative voltage (~–5V) to the gate G, using the FOWLER NORDHEIM (FN) type tunnel current, and pulling out the electrons from the charge trapping layers 4a, 4b. Also, if the gate electrode 3 is shared by a plurality of memory cells, the electrons can be simultaneously pulled out from those memory cells. In this case, potentials of the source S and the drain D may be equal to that of the p-type semiconductor substrate 1. If the positive voltage different from the potential of the p-type semiconductor substrate 1 is applied to the drain D and then the source S is set at the floating potential, the electrons can be also pulled out only from the charge trapping layer 4a on the side of the drain D. If the electrons are pulled out only from the charge trapping layer 4b on the side of the source S, the positive voltage may be applied to the source S to then set the drain D at the floating potential.

Figure 20A:
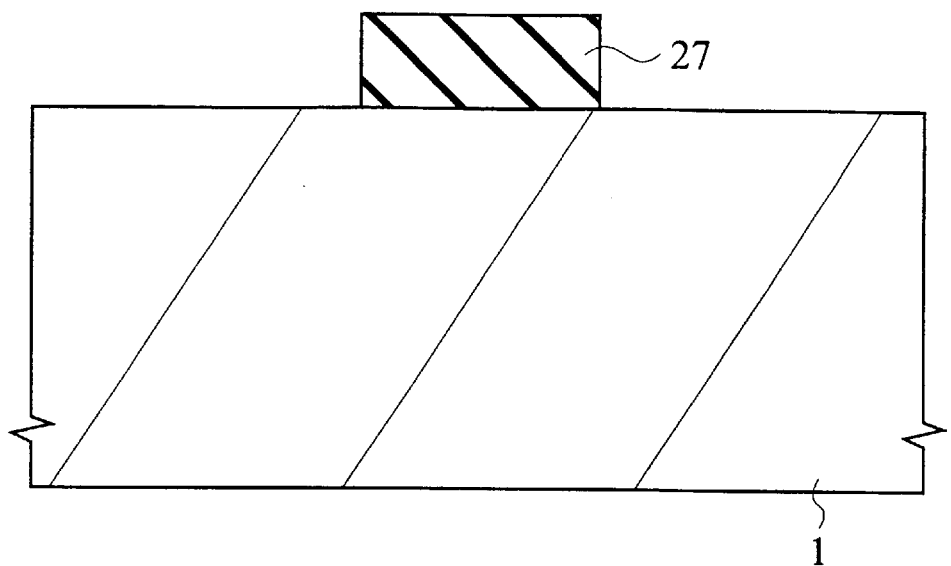
FIGS. 20A to 20I are sectional views showing the steps of manufacturing a memory cell of the nonvolatile semiconductor memory according to the eighth embodiment of the present invention.
Figure 20B:
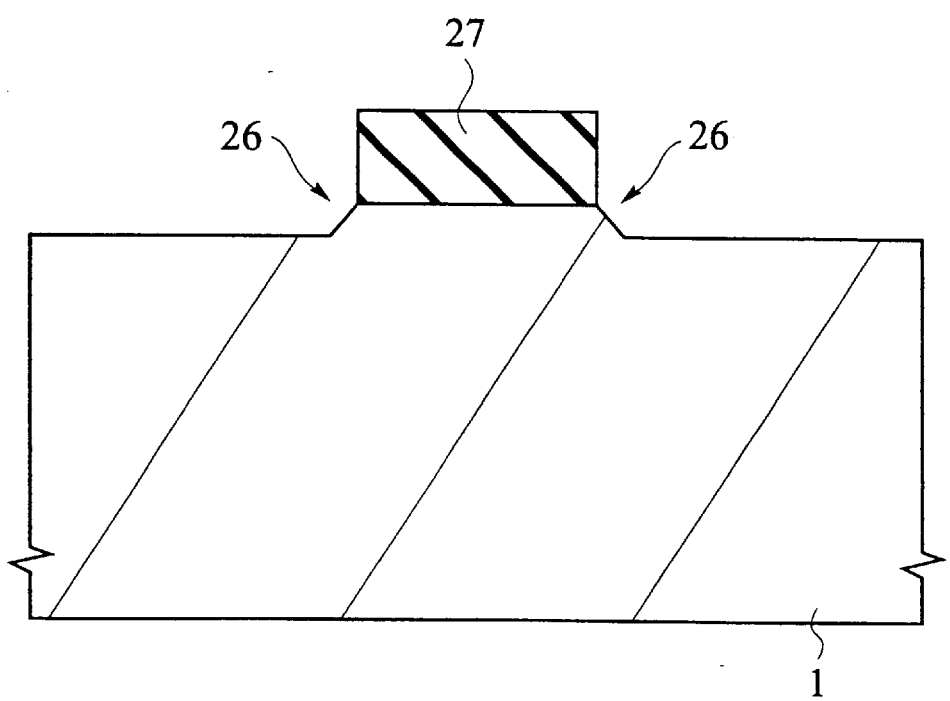

Although not shown, the memory cell can be read out by detecting the read out current flowing between the source S and the drain D. This uses the fact that the current transmission characteristic (channel conductance) in the vicinity of the source and drain areas is modulated depending on the trapping states of the charge trapping layers 4a, 4b. Which of the source S or the drain D is biased may be selected depending on the one which demonstrates larger variations in current transmission characteristic. The four different current transmission characteristics are obtained depending on the four trapping states with regard to the charge trapping layers 4a, 4b. Accordingly, the information corresponding to the two bits can be stored in one cell The method for manufacturing the memory cell of the nonvolatile memory according to the eighth embodiment of the present invention will be described below with reference to FIGS. 20A to 20I. As shown in FIG. 20A, a photo resist pattern 27 that coats the area in which a channel area 25 is formed is formed on the p-type semiconductor substrate 1. Then, as shown in FIG. 20B, a step structure 26 is formed by etching the p-type semiconductor substrate 1 by using, for example, the RIE method.

Figure 20C:
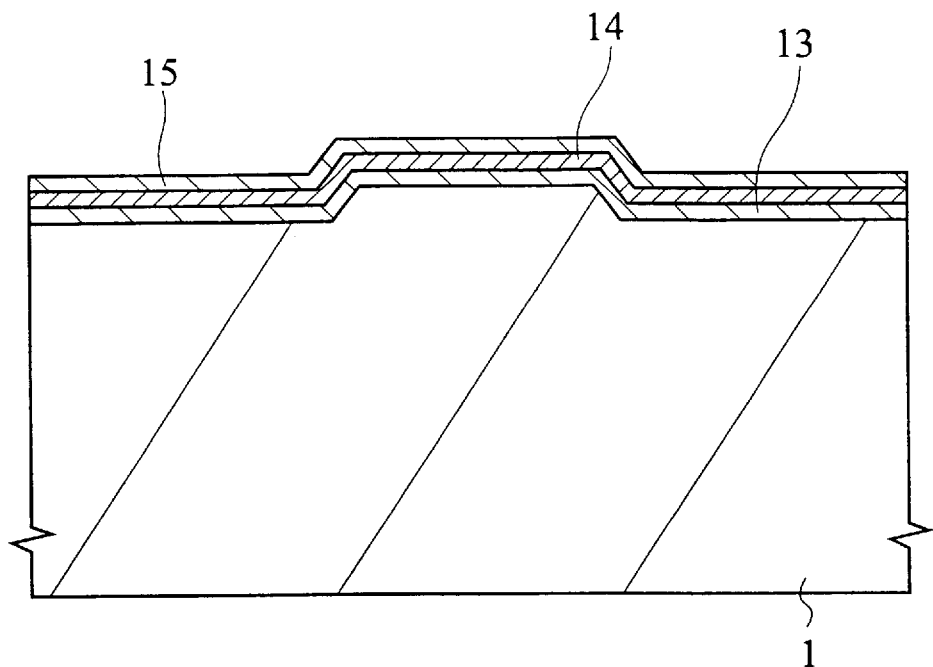

Next, as shown in FIG. 20C, the silicon nitride film having the low charge trapping ability is deposited on the whole surface of the p-type semiconductor substrate 1 to accordingly form a first gate insulation film 13 of about 10 nm. The silicon nitride film having the low charge trapping ability is deposited by using, for example, the JVD method. After the formation of the first gate insulation film 13, silicon oxide film is deposited by using the CVD method to accordingly form a second gate insulation film 14 of about 5 to 10 nm. In succession, the silicon nitride film having the low charge trapping ability is deposited by using the JVD method to accordingly form a third gate insulation film 15 of about 10 nm.

Figure 20D:
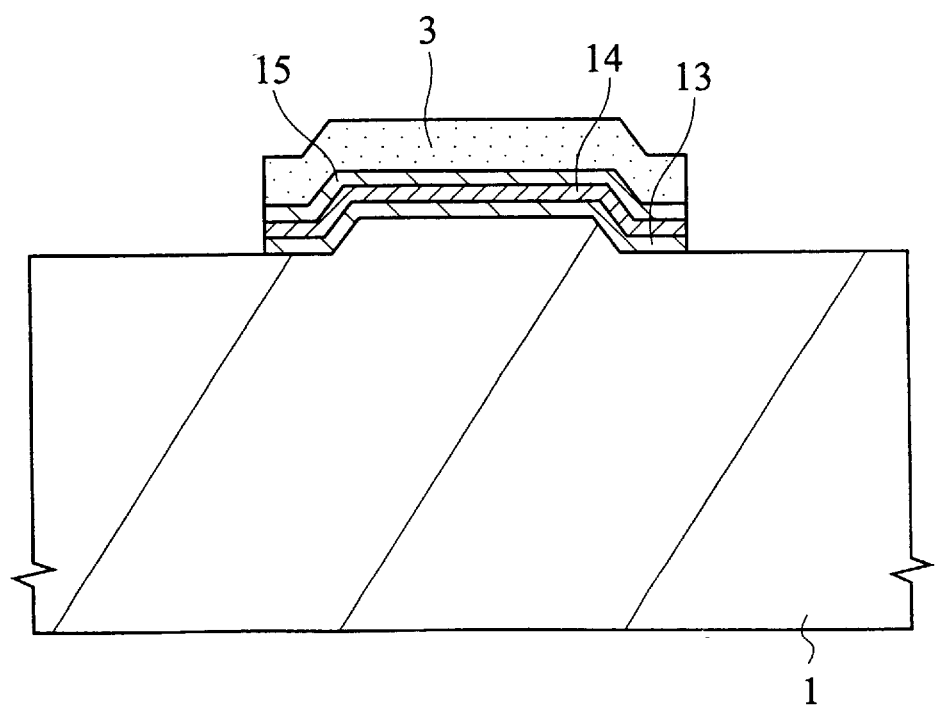

Next, as shown in FIG. 20D, the polysilicon film of about 50 to 250 nm doped with the n-type or p-type impurity is deposited on the whole surface of the p-type semiconductor substrate 1 by using the LPCVD method. After that, it is patterned by using the exposure and etching techniques to accordingly form the gate electrode 3. In succession, the dry etching is performed in the self-alignment manner on the first gate insulation film 13, the second gate insulation film 14 and the third gate insulation film 15 on the surface of the p-type semiconductor substrate 1 in the area, in which the source and drain areas are formed, with the gate electrode 3 as mask.

Figure 20E:
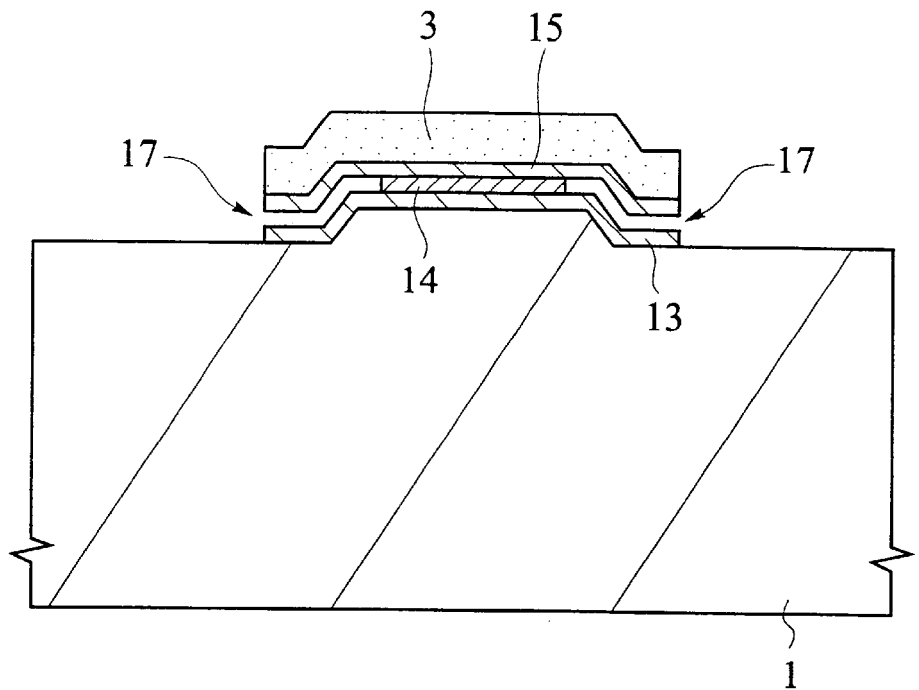

Next, as shown in FIG. 20E, a space 17 is created to form the charge trapping layer. This space 17 is created by using the etching solution, in which an etching speed of the second gate insulation film 14 is faster than those of the first gate oxide film 13 and the third gate insulation film 15, and selectively performing the wet etching on an end of the second gate insulation film 14. In the eighth embodiment of the present invention, the first gate oxide film 13 and the third gate insulation film 15 are made of the silicon nitride film, and the second gate insulation film 14 is made of the silicon oxide film. Thus, for example, the hydrofluoric acid system may be used as the etching solution. Also, the space 17 to form the charge trapping layer may be formed by using the plasma dry etching method of using the gas containing the HF gas, instead of the wet etching method of using the etching solution.

Figure 20F:
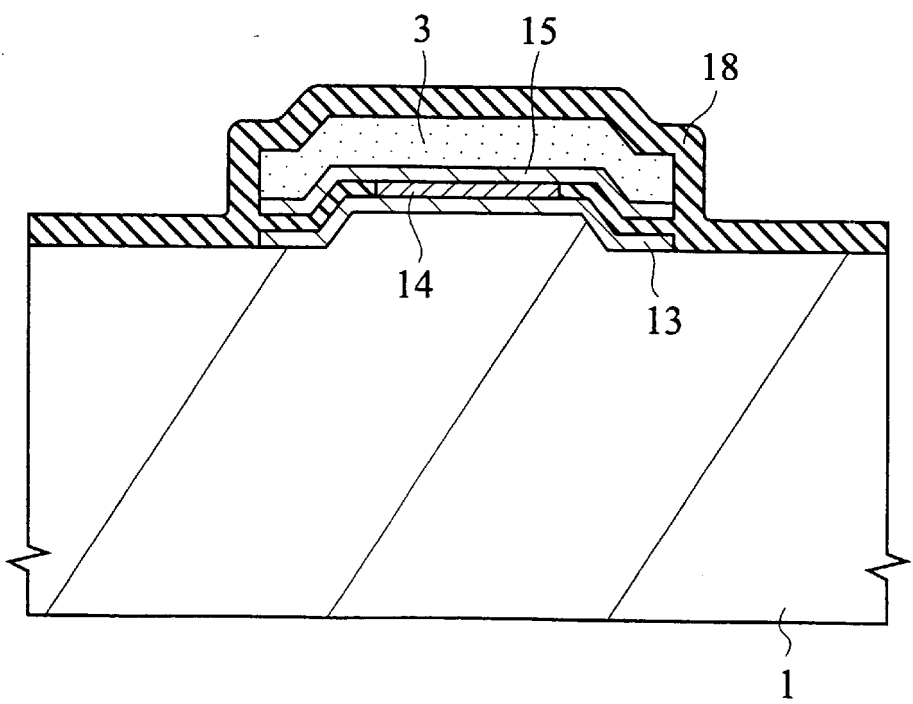
Figure 20G:
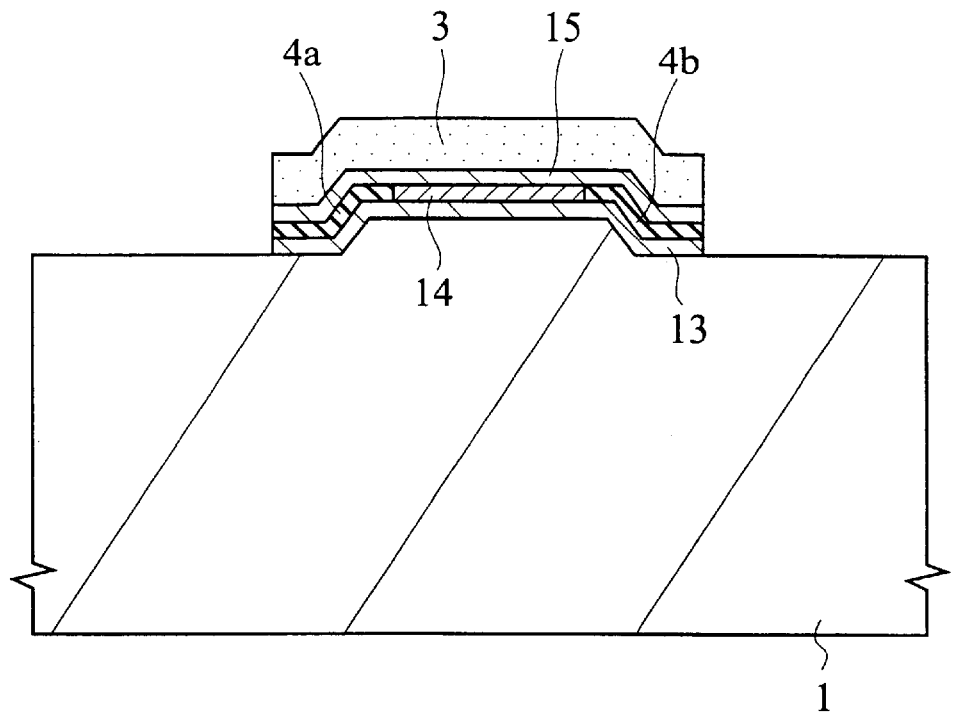

Next, as shown in FIG. 20F, a silicon nitride film 18 having a high charge trapping ability is deposited on the whole surface of the p-type semiconductor substrate 1 by using the LPCVD method so that the silicon nitride film 18 is completely embedded in the space 17 to form the charge trapping layer. Then, as shown in FIG. 20G, the anisotropic etching is performed on the whole surface of the p-type semiconductor substrate 1 by using the RIE method, which accordingly forms the charge trapping layers 4a, 4b made of the silicon nitride film having the high charge trapping ability.

Figure 20H:
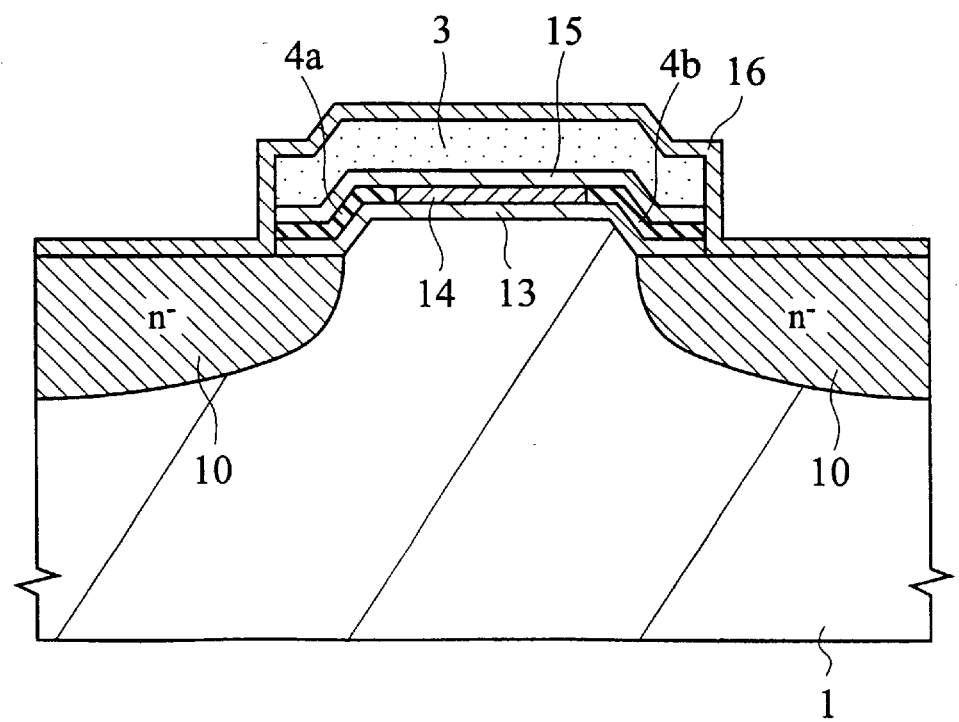

Next, as shown in FIG. 20H, an n$^-$-type diffusion layer 10 of the low impurity concentration is formed after an oxide film 16 is formed on the whole surface of the p-type semiconductor substrate 1. The n$^-$-type diffusion layer 10 is formed by implanting the n-type impurity, with the gate electrode 3 as mask, by using the ion implantation technique and then activating the impurity implanted by the thermal treatment after the ion implantation.

Figure 20I:
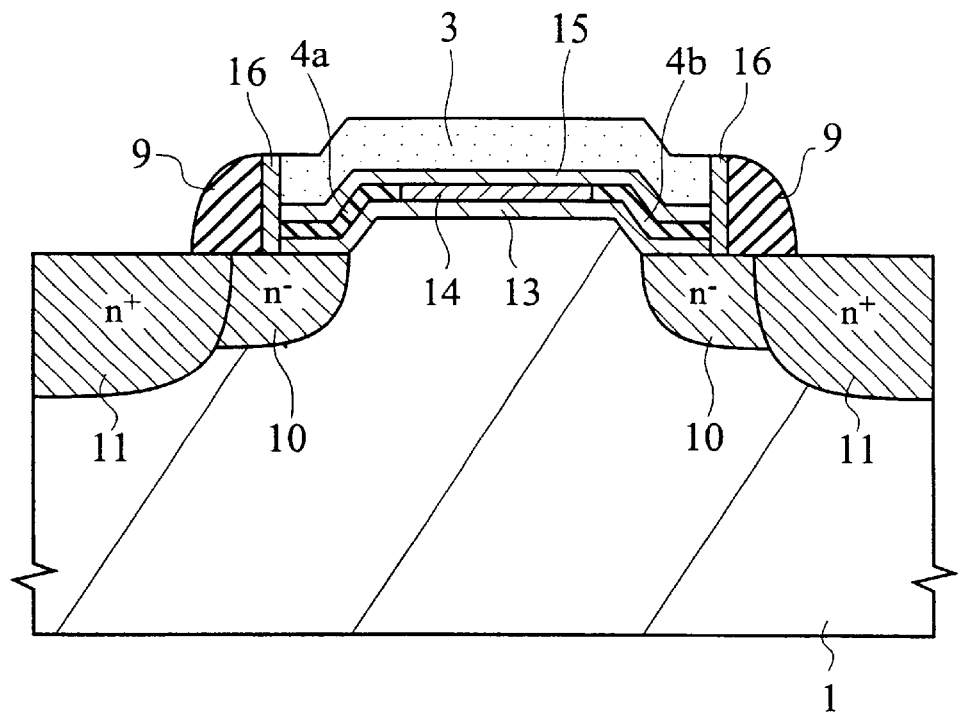

Next, as shown in FIG. 20I, an n$^+$-type diffusion layer 11 of the high impurity concentration is formed after a side wall spacer 9 is formed on a side wall of the gate electrode 3. The n$^+$-type diffusion layer 11 is formed by implanting the n-type impurity, with the gate electrode 3 and the side wall spacer 9 as mask, by using the ion implantation technique, and then activating the impurity implanted by the thermal treatment after the ion implantation.

Next, the high melting point metallic film, such as tungsten, titanium, cobalt and the like, is deposited on the whole surface of the p-type semiconductor substrate 1 by using the CVD method or the sputtering method. In succession, the thermal treatment in the inactive atmosphere is performed on the p-type semiconductor substrate 1. Accordingly, conductive layers 12 made of the high melting point metallic silicide are formed on the respective surfaces of the gate electrode 3 and the n$^+$-type diffusion layer 11. The memory cell structure shown in FIG. 18 is completed if the non-reacted high melting point metal which remains in areas other than the above-mentioned areas is removed after the formation of the conductive layers 12.

In addition, although not shown, the final nonvolatile memory cell is completed through the normal steps of manufacturing CMOS, such as the step of forming the inter-layer insulation film, the step of forming the contact hole, the step of forming the wiring, the step of forming the passivation film and the like, in succession, after the completion of the memory cell structure in FIG. 18.

As mentioned above, in the eighth embodiment of the present invention, the charge trapping layers 4a, 4b can be formed in the self-alignment manner below both ends of the gate electrode 3. Thus, a cell transistor can be made hyperfine in a gate length direction, which can accordingly provide the nonvolatile semiconductor memory having a large capacitance and a high density. Moreover, a cell area per bit can be substantially halved as compared with the conventional technique to thereby attain the nonvolatile semiconductor memory which is largely scaled down.

Also, widths of the channel length directions in the charge trapping layers 4a, 4b can be easily controlled by adjusting an etching time and a difference between etching speeds of the first gate insulation film 13 and the third gate insulation film 15 and an etching speed of the second gate insulation film 14. Accordingly, the charge trapping layers 4a, 4b can be arranged in symmetry. So, the mutual action between the charge trapping layers 4a, 4b never occurs since the charge trapping layers 4a, 4b are perfectly electrically separated from each other through the second gate insulation film 14. Moreover, the nonvolatile semiconductor memory having the excellent charge retention capability can be provided since the charge trapping layers 4a, 4b are perfectly insulated from the source area, the drain area, the gate area 3 and the channel area through the first insulation film 13, the third insulation film 15 and the oxide film 16. The charge trapping layers 4a, 4b are formed extensionally from the end of the gate electrode 3 to a channel area direction. The current transmission characteristic of the memory cell is substantially determined in accordance with the charge trapping state in the portion on the channel area side of the charge trapping layers 4a, 4b. Hence, if a length of a gate length direction in this portion is reduced to the limit, it is possible to provide the further minute nonvolatile semiconductor memory.

Moreover, the cell structure can be easily attained by the normal CMOS step. Thus, the existing manufacturing line can be used to manufacture the nonvolatile semiconductor memory at a low cost.

Then, the eighth embodiment of the present invention can improve the electron injection efficiency in the writing operation to thereby make the writing speed faster and also reduce the applied voltage in the writing operation.

Ninth Embodiment

Figure 21:
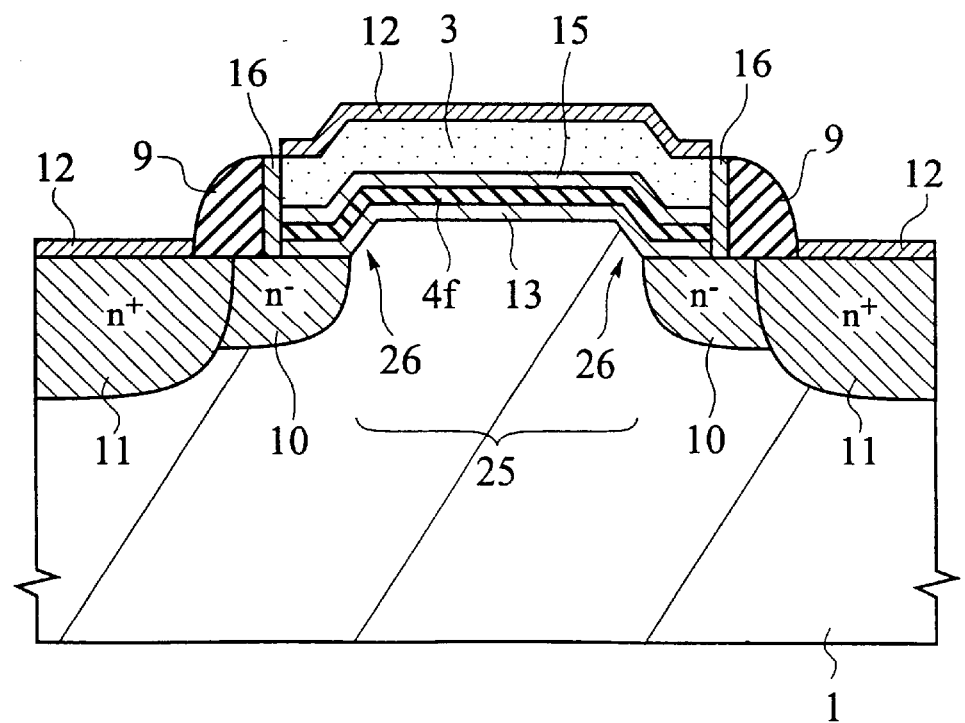
FIG. 21 is a sectional view showing a memory cell structure of a nonvolatile semiconductor memory according to a ninth embodiment of the present invention.

A ninth embodiment of the present invention will be described below. The ninth embodiment of the present invention employs the configuration that it does not require the second insulation film 14 formed between the charge trapping layers 4a, 4b of FIG. 18 in the eighth embodiment and then the two charge trapping layers 4a, 4b are integrated into a single charge trapping layer. FIG. 21 is a sectional view showing a memory cell structure of a nonvolatile semiconductor memory according to the ninth embodiment of the present invention. As shown in FIG. 21, in this memory cell structure, a charge trapping layer 4f is formed instead of the charge trapping layers 4a, 4b and the second gate insulation film 14 in the eighth embodiment.

Figure 22A:
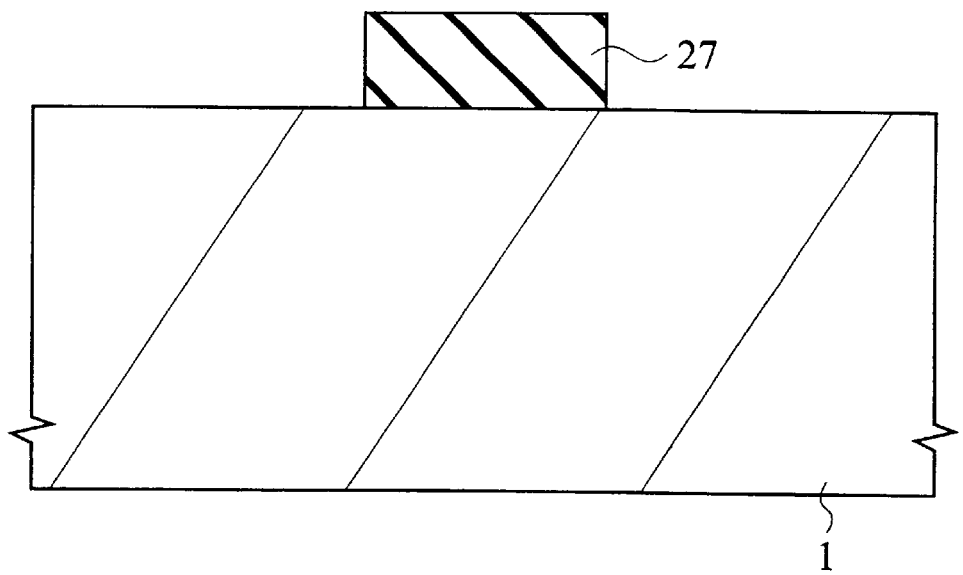
FIGS. 22A to 22F are sectional views showing the steps of manufacturing a memory cell of the nonvolatile semiconductor memory according to the ninth embodiment of the present invention.
Figure 22B:
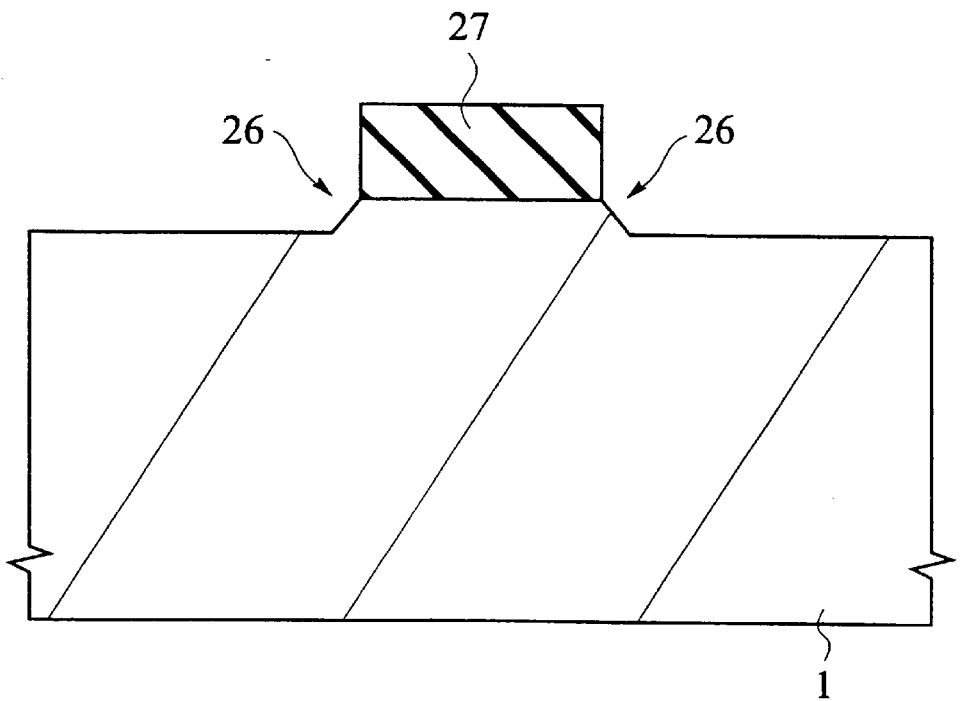

Next, the method for manufacturing the memory cell of the nonvolatile memory according to the ninth embodiment of the present invention will be described below with reference to FIGS. 22A to 22F. Similarly to the eighth embodiment, the photo resist pattern 27 that coats the area in which the channel area 25 is formed is firstly formed on the p-type semiconductor substrate 1, as shown in FIG. 22A. Then, as shown in FIG. 22B, the step structure 26 is formed by etching the p-type semiconductor substrate 1 by using, for example, the RIE method.

Figure 22C:
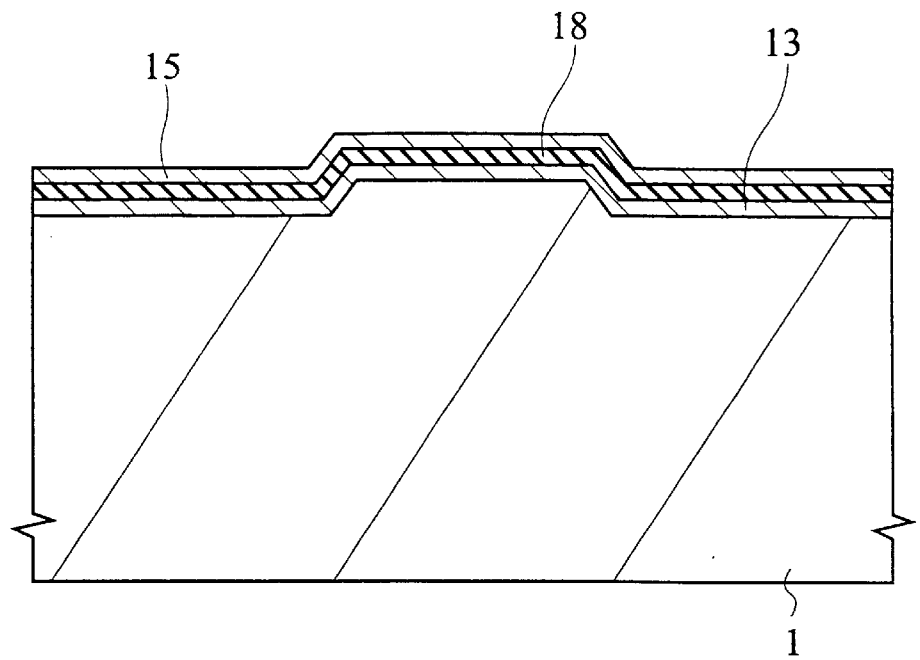

Next, as shown in FIG. 22C, the silicon nitride film having the low charge trapping ability is deposited on the whole surface of the p-type semiconductor substrate 1 to accordingly form a first gate insulation film 13 of about 10 nm. The silicon nitride film having the low charge trapping ability is deposited by using, for example, the JVD method. After the formation of the first gate insulation film 13, the LPCVD method is used to form a silicon nitride film 18 having a high charge trapping ability of about 5 to 10 nm. In succession, the silicon nitride film having the low charge trapping ability is deposited by using the JVD method to accordingly form a third gate insulation film 15 of about 10 nm.

Figure 22D:
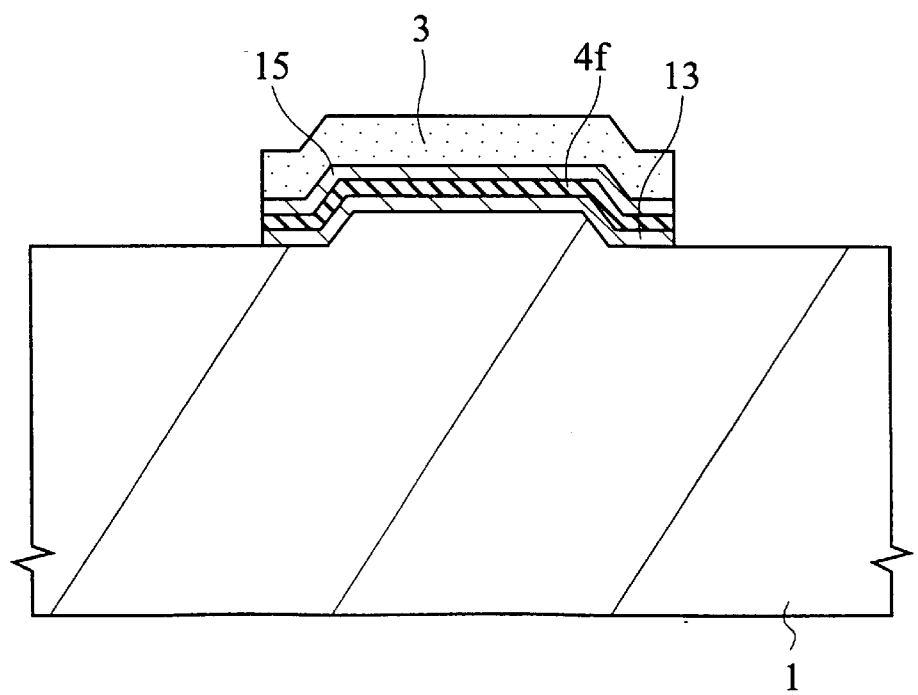

Next, as shown in FIG. 22D, the polysilicon film of about 50 to 250 nm doped with the n-type or p-type impurity is deposited on the whole surface of the p-type semiconductor substrate 1 by using the LPCVD method. After that, it is patterned by using the exposure and etching techniques to accordingly form a gate electrode 3. In succession, the dry etching is performed in the self-alignment manner on the first gate insulation film 13, the silicon nitride film 18 and the third gate insulation film 15 on the surface of the p-type semiconductor substrate 1 in the area, in which the source and drain areas are formed, with the gate electrode 3 as mask. Here, the charge trapping layer 4 is formed.

Figure 22E:
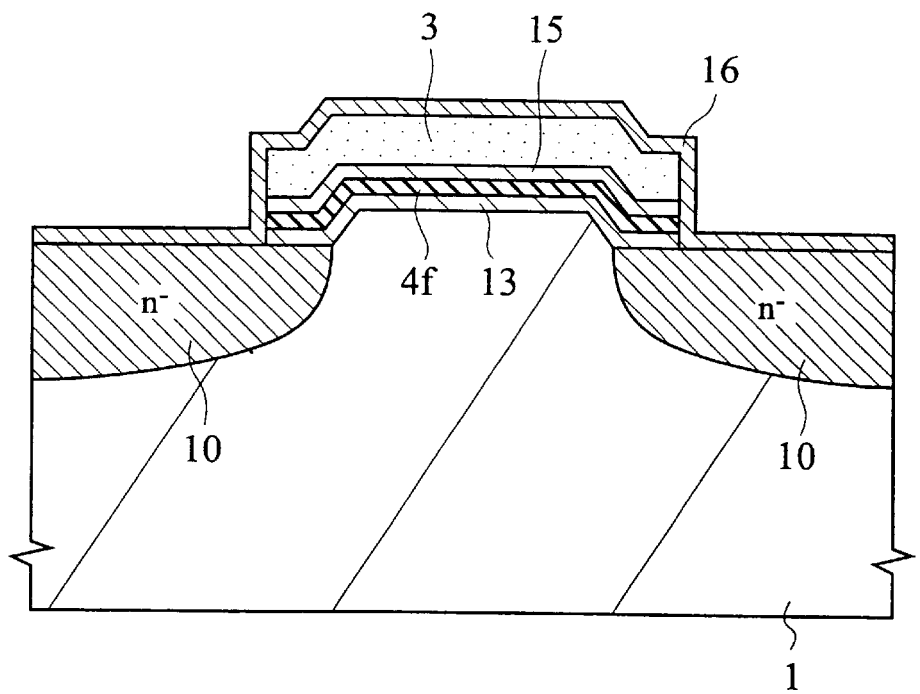

Next, as shown in FIG. 22E, an n$^-$-type diffusion layer 10 of the low impurity, concentration is formed after an oxide film 16 is formed on the whole surface of the p-type semiconductor substrate 1. The n$^-$-type diffusion layer 10 is formed by implanting the n-type impurity, with the gate electrode 3 as mask, by using the ion implantation technique, and then activating the impurity implanted by the thermal treatment after the ion implantation.

Figure 22F:
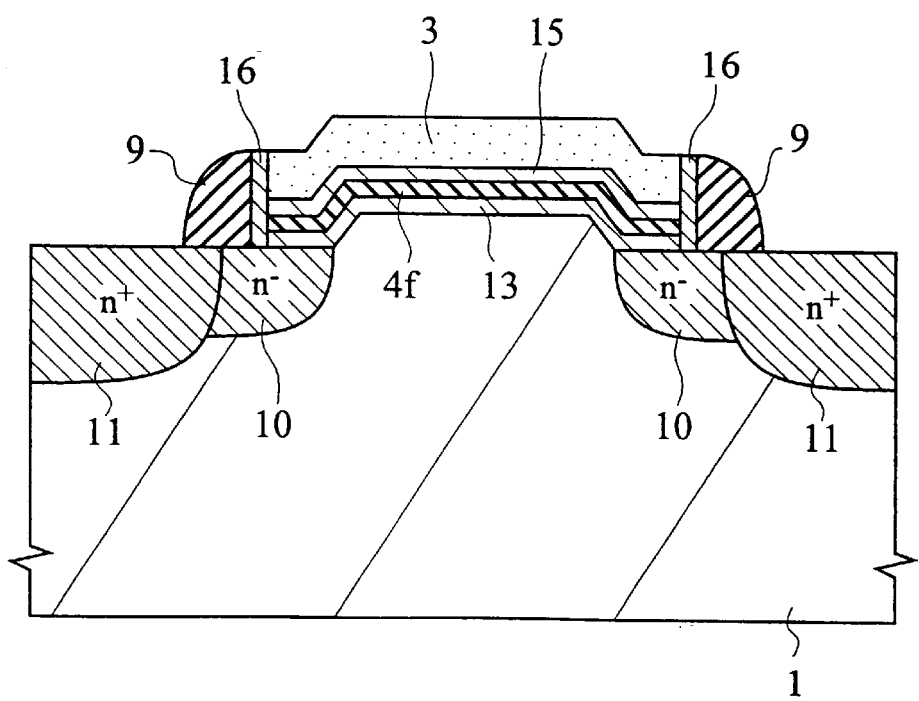

Next, as shown in FIG. 22F, an n$^+$-type diffusion layer 11 of the high impurity concentration is formed after a side wall spacer 9 is formed on a side wall of the gate electrode 3. The n$^+$-type diffusion layer 11 is formed by implanting the n-type impurity, with the gate electrode 3 and the side wall spacer 9 as mask, by using the ion implantation technique, and then activating the impurity implanted by the thermal treatment after the ion implantation.

Next, the high melting point metallic film, such as tungsten, titanium, cobalt and the like, is deposited on the whole surface of the p-type semiconductor substrate 1 by using the CVD method or the sputtering method. In succession, the thermal treatment in the inactive atmosphere is performed on the p-type semiconductor substrate 1. Accordingly, conductive layers 12 made of the high melting point metallic silicide are formed on the respective surfaces of the gate electrode 3 and the n$^+$-type diffusion layer 11. The memory cell structure shown in FIG. 21 is completed if the non-reacted high melting point metal which remains in areas other than the above-mentioned areas is removed after the formation of the conductive layers 12.

In addition, although not shown, the final nonvolatile memory cell is completed through the normal steps of manufacturing CMOS, such as the step of forming the inter-layer insulation film, the step of forming the contact hole, the step of forming the wiring, the step of forming the passivation film and the like, in succession, after the completion of the memory cell structure in FIG. 21.

Tenth Embodiment

Figure 23:
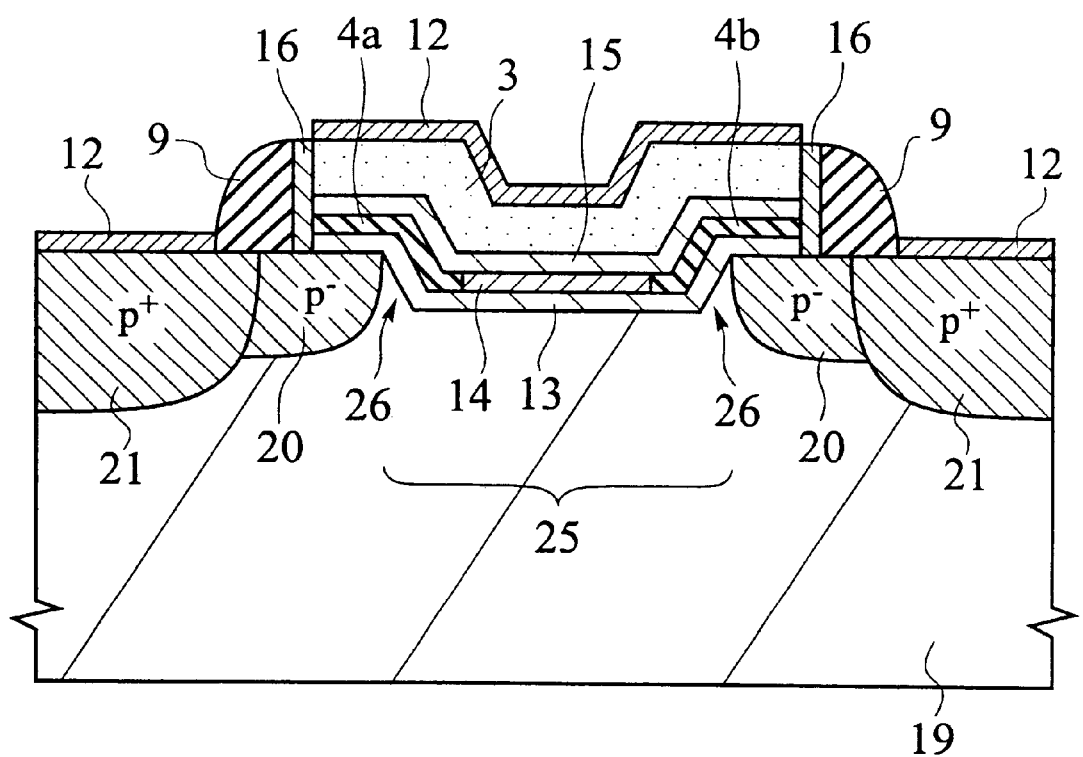
FIG. 23 is a sectional view showing a memory cell structure of a nonvolatile semiconductor memory according to a tenth embodiment of the present invention.

A tenth embodiment of the present invention will be described below. FIG. 23 is a sectional view showing a memory cell structure of a nonvolatile semiconductor memory according to the tenth embodiment of the present invention. In the eighth and ninth embodiments, the channel area is convex with respect to the semiconductor substrate to then mount the step structures at both the ends of the channel area. However, in this tenth embodiment, the channel area is concave with respect to the semiconductor substrate to then mount the step structure in the channel area. Then, this tenth embodiment is also intended to mount the step structure and the slope structure in the channel area of the memory cell to accordingly improve the electron injection efficiency in the writing operation.

As shown in FIG. 23, this memory cell is provided with the p-type MOS transistor. In the memory cell structure according to the tenth embodiment, a second gate insulation film 14 is formed on a surface of an n-type semiconductor substrate 19 through a first gate insulation film 13. Charge trapping layers 4a, 4b are formed on both ends of the second gate insulation film 14. A gate electrode 3 is formed on the second gate insulation film 14 and the charge trapping layers 4a, 4b through a third gate insulation film 15. A side wall spacer 9 is formed on a side of the gate electrode 3 through an oxide film 16. A p$^-$-type diffusion layer 20 of a low impurity concentration adjacent to the channel area and a p$^+$-type diffusion layer 21 of a high impurity concentration located outside this p$^-$-type diffusion layer 20 are formed in the n-type semiconductor substrate 19 below this side wall spacer 9. Conductive layers 12 are formed on the respective surfaces of the gate electrode 3 and the p$^+$-type diffusion layer 21.

Moreover, in the memory cell structure of the nonvolatile semiconductor memory according to the tenth embodiment of the present invention, a step structure 26 is formed in a channel area 25. Due to this step structure 26, the charge trapping layers 4 are located in the scattering direction of electrons within the p-type semiconductor substrate 1 to thereby improve the electron injection efficiency in the writing operation.

The memory cell of the nonvolatile semiconductor memory according to the tenth embodiment of the present invention has the LDD structure in which the source and drain areas are constituted by the p$^-$-type diffusion layers 20 of the low impurity concentration and the p$^+$-type diffusion layers 21 of the high impurity concentration. Then, the gate insulation film is constituted by the three-layer stacked film composed of the first gate insulation film 13 (bottom layer), the second gate insulation film 14 (middle layer) and the third gate insulation film 15 (top layer). The charge trapping layers 4a, 4b are formed on both the ends of the second gate insulation film 14. Electrons are trapped in those two charge trapping layers 4a, 4b. Its trapping state may include the following four states: (1) the state that the electrons are not trapped in any one of the charge trapping layers 4a, 4b; (2) the state that the electrons are trapped in only the charge trapping layer 4a; (3) the state that the electrons are trapped in only the charge trapping layer 4b; and (4) the state that the electrons are trapped in both the charge trapping layers 4a, 4b. The change amounts of the threshold voltage caused by the presence or absence of the electrons held in those two charge trapping layers 4a, 4b are correlated with "00", "01", "10" and "11" of a memory information, respectively. In this memory cell structure, the charge trapping layers 4a, 4b are positioned in the upper portion of the end of the channel area. Thus, a threshold voltage at a center of the channel area is determined only by an impurity concentration of the channel area, and does not depend on the trapping state of the electrons in the charge trapping layers 4a, 4b. Hence, the over-erasure caused by the excess or deficiency of the electrons in the charge trapping layers 4a, 4b can be protected so that the leakage trouble, the program defect, the read out error and the like are never induced because of the over-erasure. Also, the leakage current between the source and drain areas can be suppressed only by a gate voltage to thereby attain the nonvolatile semiconductor memory of high reliability. The charge trapping layers 4a, 4b may be made of the silicon nitride film having the high charge trapping ability by using the CVD method. This is because the trapping of the electrons at the discrete charge capture level in the silicon nitride film enables the charge retention capability having little influence on the film quality of the lower insulation film. Also, if it is made of the silicon film or the polysilicon film, it can be manufactured at a low cost. Moreover, if the first gate insulation film 13 and the third gate insulation film 15 are made of the silicon nitride film ($Si_3N_4$ film) having the dielectric constant equal to about two times that of the silicon oxide film ($SiO_2$ film), it is possible to stably form the very thin gate insulation film with the equivalent silicon oxide thickness is about 4 nm to 11 nm. For example, since the substantial film thickness of the silicon nitride film with the equivalent silicon oxide thickness is 5 nm is about 10 nm, the direct tunnel (DT) injection is never induced. Therefore, the voltage at the time of the injection and ejection operation of the electrons is made lower, which not only enables the memory cell to be hyperfine, but also enables the peripheral high voltage operation element to be hyperfine.

In the memory cell of the nonvolatile semiconductor memory according to the tenth embodiment of the present invention, the $p^-$-type diffusion layer 20 is formed, and then the LDD structure is configured, in order to improve the breakdown voltages of the source and drain areas. However, the source and drain areas may be constituted by the single-drain structure or the double-drain structure. Although the second gate insulation film 14 avoids the leakage between the charge trapping layers 4a and 4b, it may be made of, for example, the silicon oxide film. The current transmission characteristic at the center of the channel area can be improved if the metallic oxide film having the high dielectric constant is used for the second gate insulation film 14. The metallic oxide film includes, for example, $TiO_2$, $Ta_2O_5$, $Al_2O_5$, PZT and SBT.

In the tenth embodiment of the present invention, the step structures 26 are formed in both the source and the drain. However, it may be formed in any one of the source and the drain. It is enough that the step structure 26 is formed in one of them, especially in a memory for storing an information corresponding to one bit.

Figure 24A:
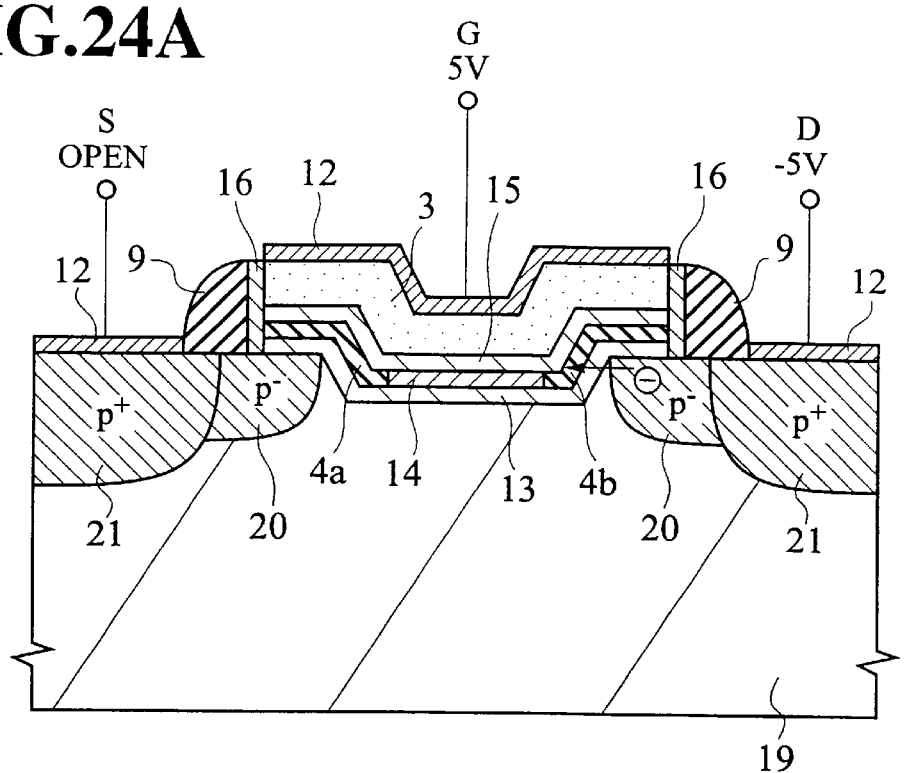
FIGS. 24A and 24B are sectional views showing the operation of the nonvolatile semiconductor memory according to the tenth embodiment of the present invention.
Figure 24B:
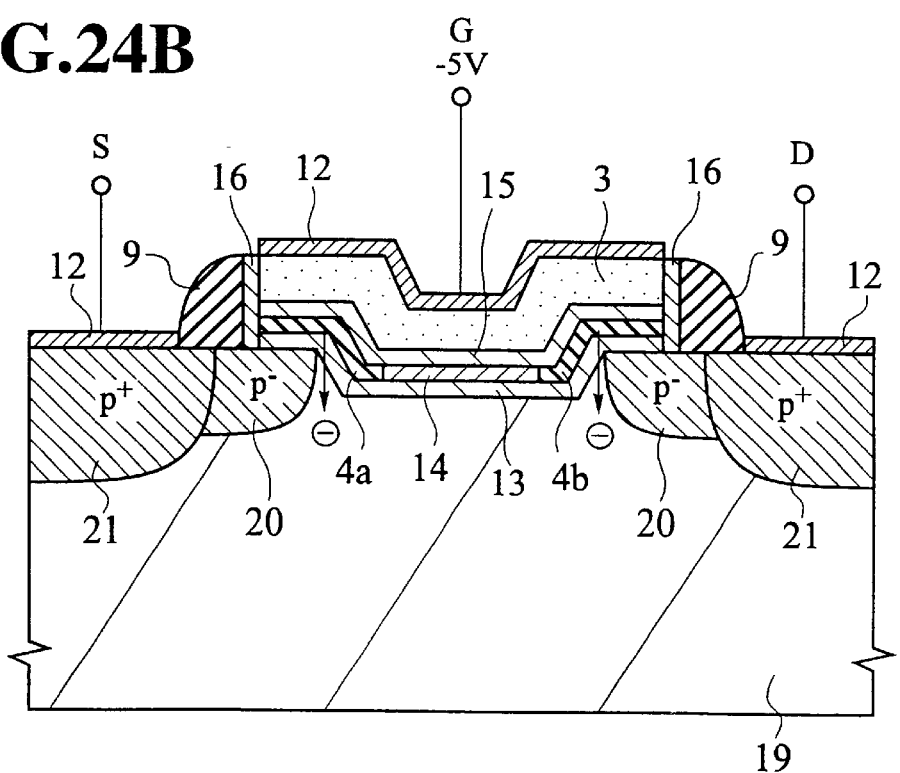

The operation of the nonvolatile memory according to the tenth embodiment of the present invention will be described below with reference to FIGS. 24A and 24B. FIG. 24A is a sectional view of the nonvolatile memory describing the writing operation. FIG. 24B is a sectional view of the nonvolatile memory describing the erasing operation. As shown in FIG. 24A, when the memory cell is written, a voltage of about 5 V is applied to a gate G, a voltage of about −5 V is applied to a drain D, respectively, and a source S is set at the floating potential. In this way, the voltages are applied. Then, energy is given to electrons induced by the band-to-band tunneling phenomenon at electric field in the vicinity of the drain area, and the electrons are implanted into the charge trapping layer 4b on the side of the drain area. Since the step structure 26 is formed in the channel area 25, the charge trapping layer 4b is located in the implanting direction of the electrons. Thus, the injection efficiency of the electrons to the charge trapping layer 4b can be improved to thereby make the injection speed faster and also reduce the applied voltage. If the electrons are implanted into the charge trapping layer 4a on the side of the source area, the respective voltages applied to the drain D and the source S may be interchanged from the above-mentioned case. On the other hand, as shown in FIG. 24B, the memory cell is erased by applying a negative voltage (~−5V) to the gate G, using the FOWLER NORDHEIM (FN) type tunnel current, and pulling out the electrons from the charge trapping layers 4a, 4b. Also, if the gate electrode 3 is shared by a plurality of memory cells, the electrons can be simultaneously pulled out from those memory cells. In this case, potentials of the source S and the drain D may be equal to that of the n-type semiconductor substrate 19. If the positive voltage different from the potential of the p-type semiconductor substrate 1 is applied to the drain D and then the source S is set at the floating potential, the electrons can be also pulled out only from the charge trapping layer 4a on the side of the drain D. If the electrons are pulled out only from the charge trapping layer 4b on the side of the source S, the positive voltage may be applied to the source S to then set the drain D at the floating potential.

Although not shown, the memory cell can be read out by detecting the read out current flowing between the source S and the drain D. This uses the fact that the current transmission characteristic (channel conductance) in the vicinity of the source and drain areas is modulated depending on the trapping states of the charge trapping layers 4a, 4b. Which of the source S or the drain D is biased may be selected depending on the one which demonstrates larger variations in current transmission characteristic. The four different current transmission characteristics are obtained depending on the four trapping states with regard to the charge trapping layers 4a, 4b. Accordingly, the information corresponding to the two bits can be stored in one cell.

Figure 25A:
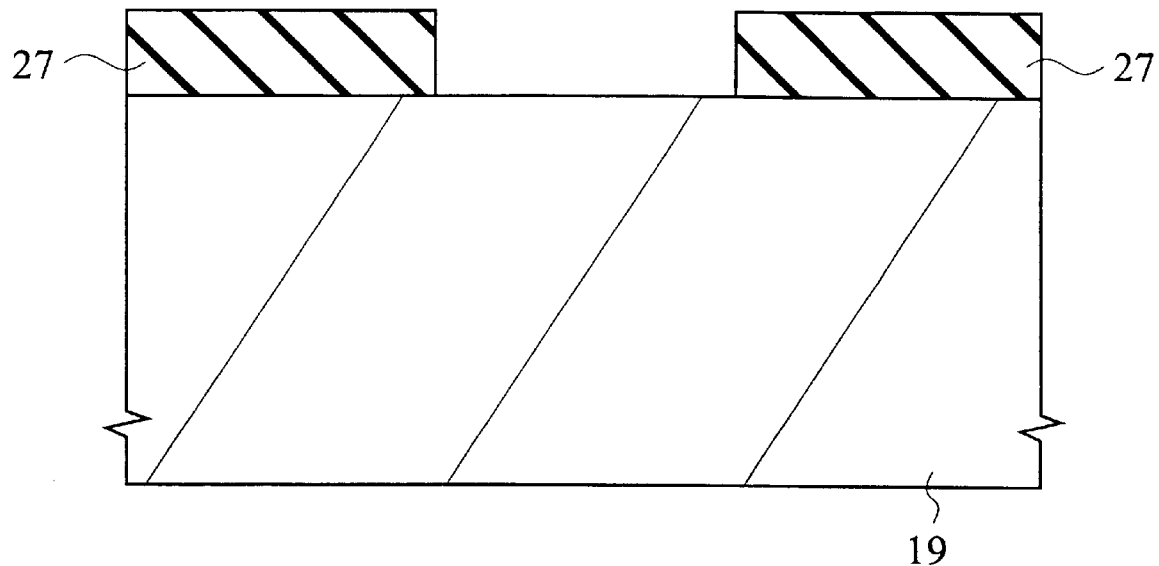
FIGS. 25A to 25I are sectional views showing the steps of manufacturing a memory cell of the nonvolatile semiconductor memory according to the tenth embodiment of the present invention.
Figure 25B:
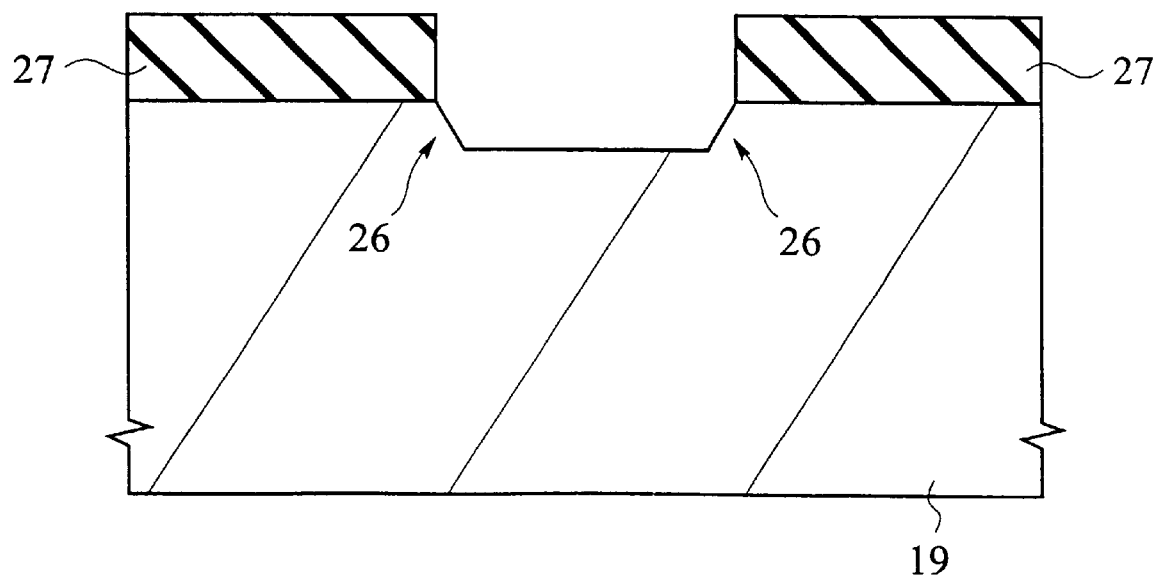

The method for manufacturing the memory cell of the nonvolatile memory according to the tenth embodiment of the present invention will be described below with reference to FIGS. 25A to 25I. As shown in FIG. 25A, a photo resist pattern 27 that coats an area except an area in which a channel area 25 is formed is firstly formed on the n-type semiconductor substrate 19. Then, as shown in FIG. 25B, a step structure, 26 is formed by etching the n-type semiconductor substrate 19 by using, for example, the RIE method.

Figure 25C:
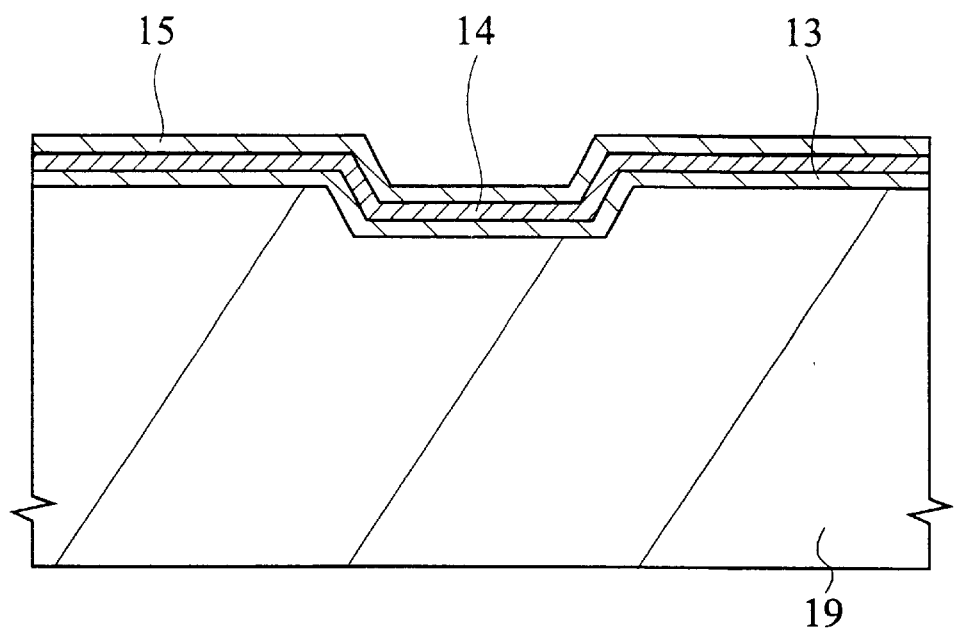

Next, as shown in FIG. 25C, the silicon nitride film having the low charge trapping ability is deposited on the whole surface of the n-type semiconductor substrate 19 to accordingly form a first gate insulation film 13 of about 10 nm. The silicon nitride film having the low charge trapping ability is deposited by using, for example, the JVD method. After the formation of the first gate insulation film 13, silicon oxide film is deposited by using the CVD method to accordingly form a second gate insulation film 14 of about 5 to 10 nm. In succession, the silicon nitride film having the low charge trapping ability is deposited by using the JVD method to accordingly form a third gate insulation film 15 of about 10 nm.

Figure 25D:
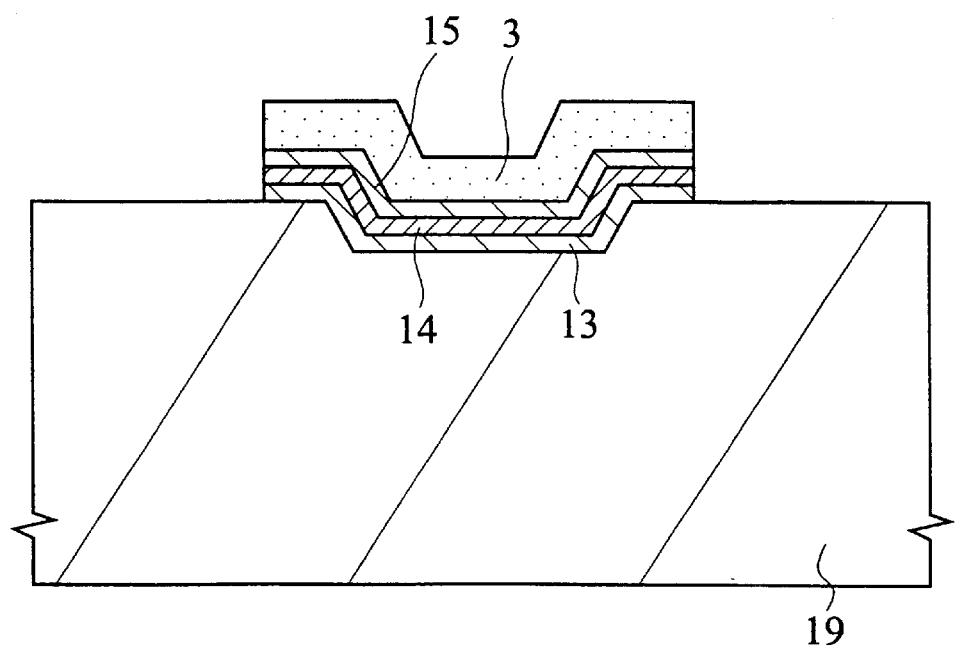

Next, as shown in FIG. 25D, the polysilicon film of about 50 to 250 nm doped with the n-type or p-type impurity is deposited on the whole surface of the n-type semiconductor substrate 19 by using the LPCVD method. After that, it is patterned by using the exposure and etching techniques to accordingly form the gate electrode 3. In succession, the dry etching is performed in the self-alignment manner on the first gate insulation film 13, the second gate insulation film 14 and the third gate insulation film 15 on the surface of the n-type semiconductor substrate 19 in the area, in which the source and drain areas are formed, with the gate electrode 3 as mask.

Figure 25E:
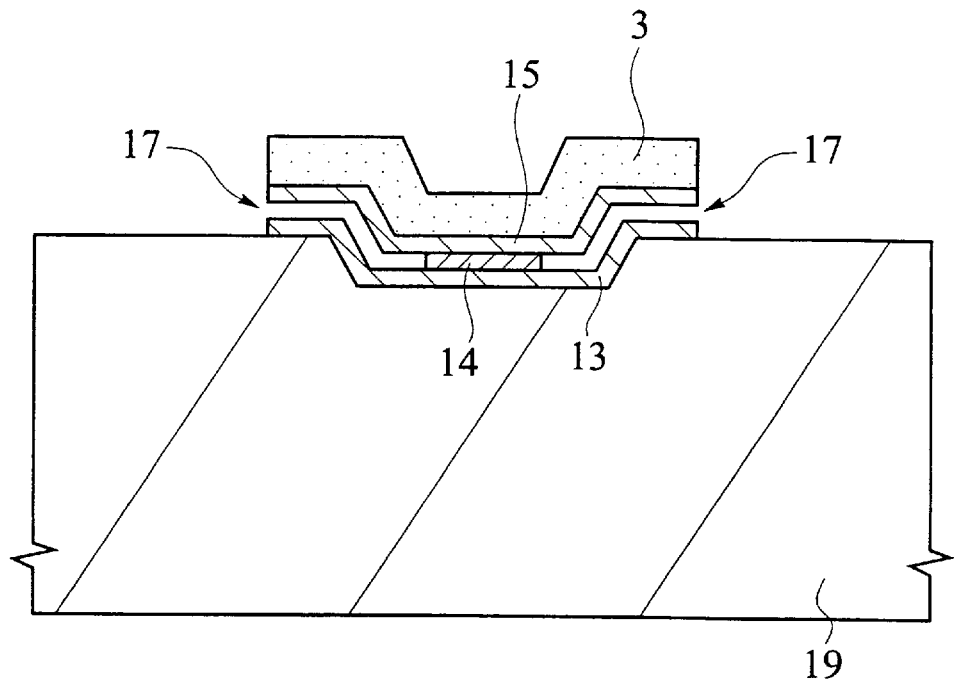

Next, as shown in FIG. 25E, a space 17 is created to form the charge trapping layer. This space 17 is created by using the etching solution, in which an etching speed of the second gate insulation film 14 is faster than those of the first gate oxide film 13 and the third gate insulation film 15, and selectively performing the wet etching on an end of the second gate insulation film 14. In the tenth embodiment of the present invention, the first gate oxide film 13 and the third gate insulation film 15 are made of the silicon nitride film, and the second gate insulation film 14 is made of the silicon oxide film. Thus, for example, the hydrofluoric acid system may be used as the etching solution. Also, the space 17 to form the charge trapping layer may be formed by using the plasma dry etching method of using the gas containing the HF gas, instead of the wet etching method of using the etching solution.

Figure 25F:
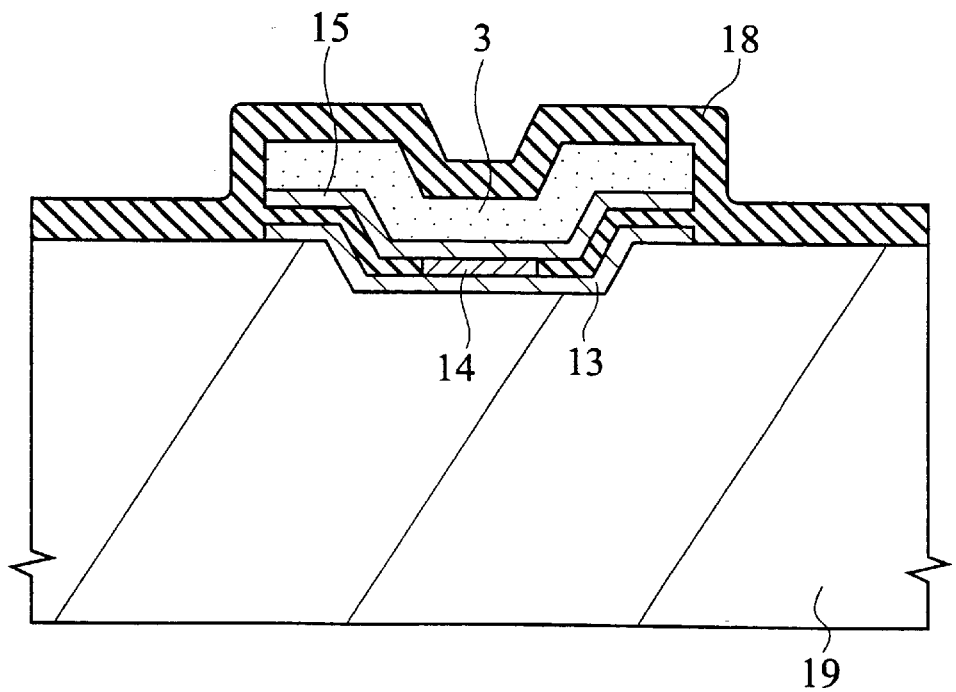
Figure 25G:
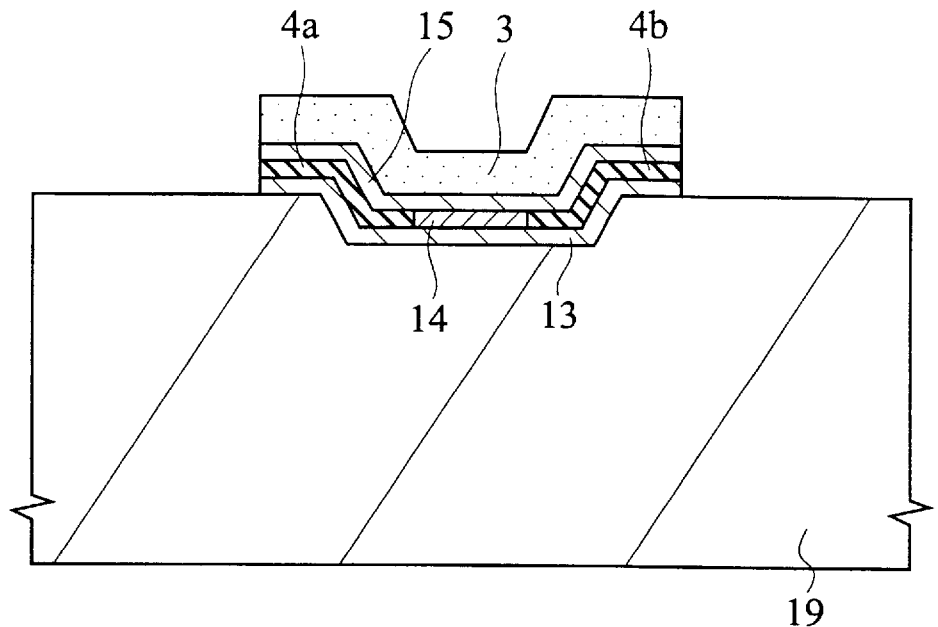

Next, as shown in FIG. 25F, a silicon nitride film 18 having a high charge trapping ability is deposited on the whole surface of the n-type semiconductor substrate 19 by using the LPCVD method so that the silicon nitride film 18 is completely embedded in the space 17 to form the charge trapping layer. Then, as shown in FIG. 25G, the anisotropic etching is performed on the whole surface of the n-type semiconductor substrate 19 by using the RIE method, which accordingly forms the charge trapping layers 4a, 4b made of the silicon nitride film having the high charge trapping ability.

Figure 25H:
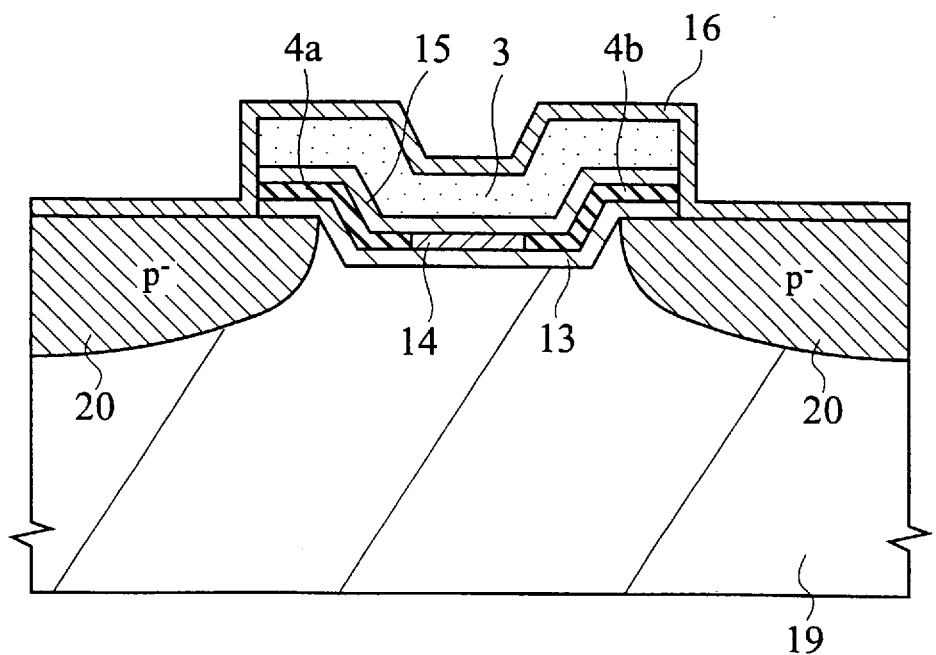

Next, as shown in FIG. 25H, a p⁻-type diffusion layer 20 of the low impurity concentration is formed after an oxide film 16 is formed on the whole surface of the n-type semiconductor substrate 19. The p⁻-type diffusion layer 20 is formed by implanting the p-type impurity, with the gate electrode 3 as mask, by using the ion implantation technique, and then activating the impurity implanted by the thermal treatment after the ion implantation.

Figure 25I:
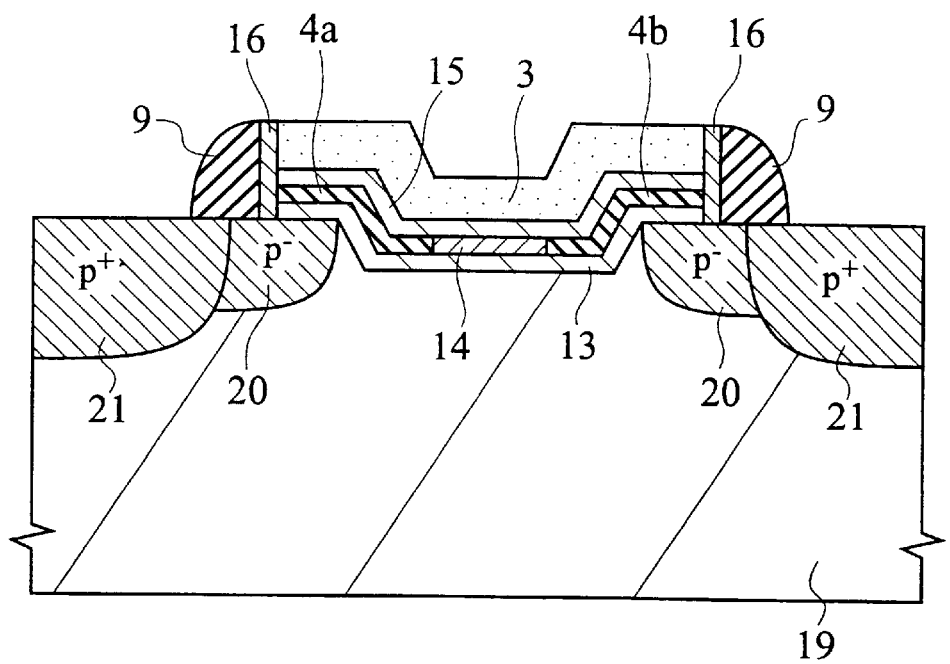

Next, as shown in FIG. 25I, a p⁺-type diffusion layer 21 of the high impurity concentration is formed after a side wall spacer 9 is formed on a side wall of the gate electrode 3. The p⁺-type diffusion layer 21 is formed by implanting the p-type impurity, with the gate electrode 3 and the side wall spacer 9 as mask, by using the ion implantation technique, and then activating the impurity implanted by the thermal treatment after the ion implantation.

Next, the high melting point metallic film, such as tungsten, titanium, cobalt and the like, is deposited on the whole surface of the n-type semiconductor substrate 19 by using the CVD method or the sputtering method. In succession, the thermal treatment in the inactive atmosphere is performed on the n-type semiconductor substrate 19. Accordingly, conductive layers 12 made of the high melting point metallic silicide are formed on the respective surfaces of the gate electrode 3 and the p⁺-type diffusion layer 21. The memory cell structure shown in FIG. 23 is completed if the non-reacted high melting point metal which remains in areas other than the above-mentioned areas is removed after the formation of the conductive layers 12.

In addition, although not shown, the final nonvolatile memory cell is completed through the normal steps of manufacturing CMOS, such as the step of forming the inter-layer insulation film, the step of forming the contact hole, the step of forming the wiring, the step of forming the passivation film and the like, in succession, after the completion of the memory cell structure in FIG. 23.

As mentioned above, in the tenth embodiment of the present invention, the charge trapping layers 4a, 4b can be formed in the self-alignment manner below both ends of the gate electrode 3. Thus, a cell transistor can be made hyperfine in a gate length direction, which can accordingly provide the nonvolatile semiconductor memory having a large capacitance and a high density. Moreover, a cell area per bit can be substantially halved as compared with the conventional technique to thereby attain the nonvolatile semiconductor memory which is largely scaled down.

Also, widths of the channel length directions in the charge trapping layers 4a, 4b can be easily controlled by adjusting an etching time and a difference between etching speeds of the first gate insulation film 13 and the third gate insulation film 15 and an etching speed of the second gate insulation film 14. Accordingly, the charge trapping layers 4a, 4b can be arranged in symmetry. So, the mutual action between the charge trapping layers 4a, 4b never occurs since the charge trapping layers 4a, 4b are perfectly electrically separated from each other through the second gate insulation film 14. Moreover, the nonvolatile semiconductor memory having the excellent charge retention capability can be provided since the charge trapping layers 4a, 4b are perfectly insulated from the source area, the drain area, the gate area 3 and the channel area through the first insulation film 13, the third insulation film 15 and the oxide film 16. The charge trapping layers 4a, 4b are formed extensionally from the end of the gate electrode 3 to a channel area direction. The current transmission characteristic of the memory cell is substantially determined in accordance with the charge trapping state in the portion on the channel area side of the charge trapping layers 4a, 4b. Hence, if a length of a gate length direction in this portion is reduced to the limit, it is possible to provide the further minute nonvolatile semiconductor memory.

Moreover, the cell structure can be easily attained by the normal CMOS step. Thus, the existing manufacturing line can be used to manufacture the nonvolatile semiconductor memory at a low cost.

Then, the tenth embodiment of the present invention can improve the electron injection efficiency in the writing operation to thereby make the writing speed faster and also reduce the applied voltage in the writing operation.

Eleventh Embodiment

Figure 26:
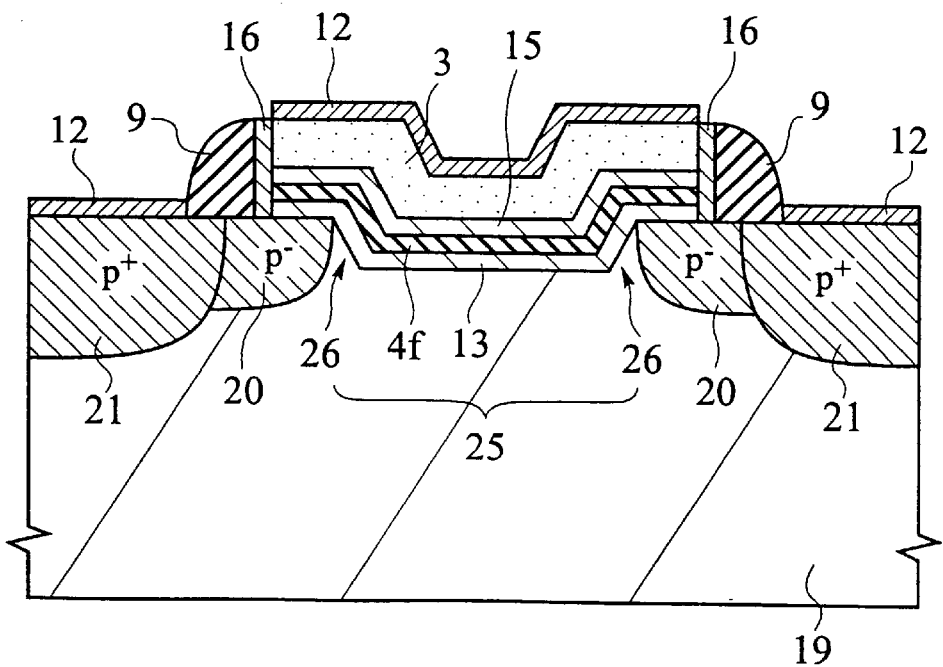
FIG. 26 is a sectional view showing a memory cell structure of a nonvolatile semiconductor memory according to an eleventh embodiment of the present invention.

An eleventh embodiment of the present invention will be described below. The eleventh embodiment of the present invention employs the configuration that it does not require the second insulation film 14 formed between the charge trapping layers 4a, 4b of FIG. 23 in the tenth embodiment and then the two charge trapping layers 4a, 4b are integrated into the single charge trapping layer. FIG. 26 is a sectional view showing a memory cell structure of a nonvolatile semiconductor memory according to the eleventh embodiment of the present invention. As shown in FIG. 26, in this memory cell structure, a charge trapping layer 4f is formed instead of the charge trapping layers 4a, 4b and the second gate insulation film 14 in the tenth embodiment.

Figure 27A:
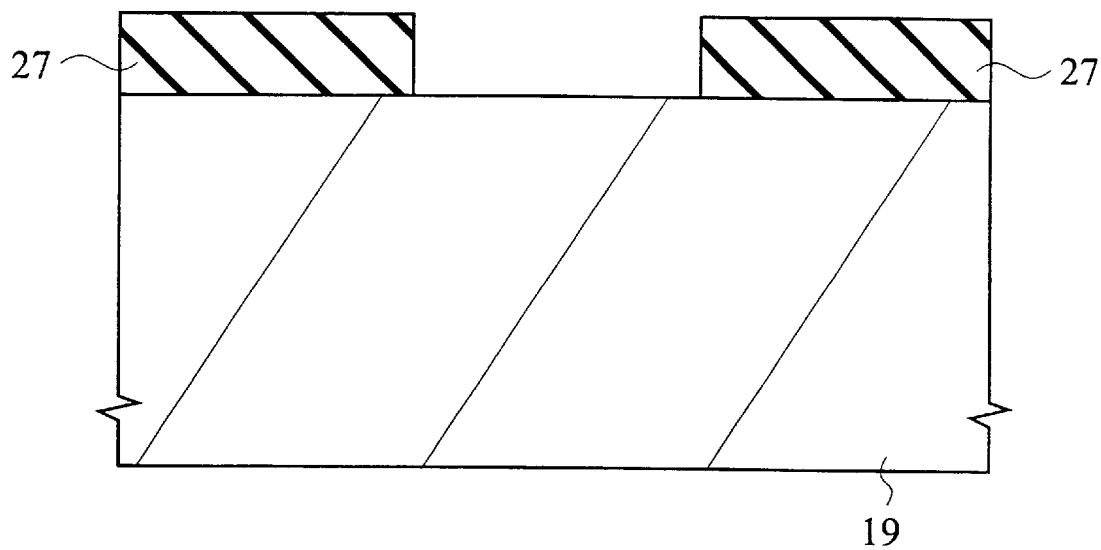
FIGS. 27A to 27F are sectional views showing the steps of manufacturing a memory cell of the nonvolatile semiconductor memory according to the eleventh embodiment of the present invention.
Figure 27B:
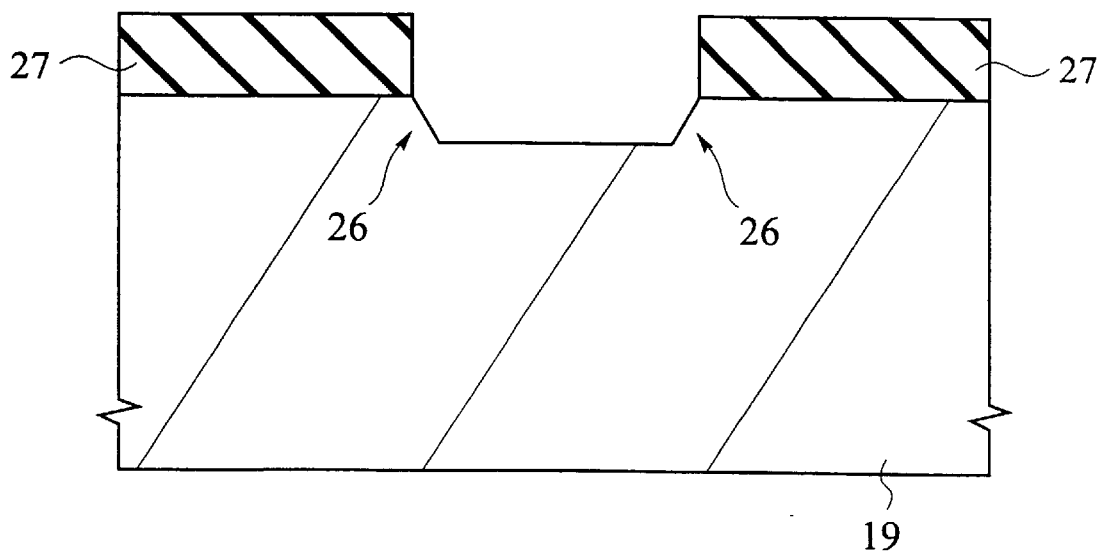

Next, the method for manufacturing the memory cell of the nonvolatile memory according to the eleventh embodiment of the present invention will be described below with reference to FIGS. 27A to 27F. Similarly to the tenth embodiment, the photo resist pattern 27 that coats an area except an area in which the channel area 25 is formed is firstly formed on the n-type semiconductor substrate 19, as shown in FIG. 27A. Then, as shown in FIG. 27B, the step structure 26 is formed by etching the n-type semiconductor substrate 19 by using, for example, the RIE method.

Figure 27C:
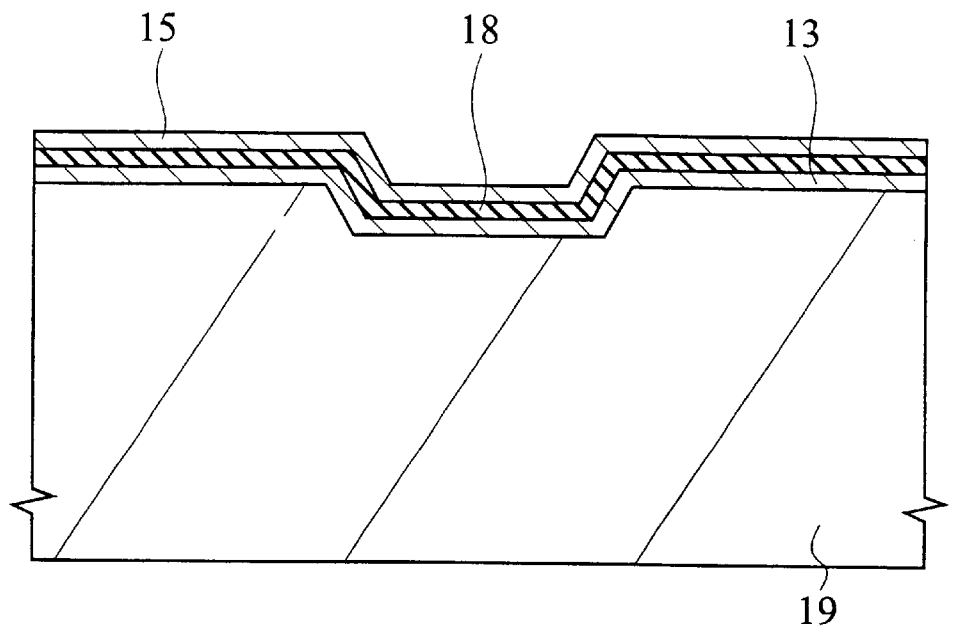

Next, as shown in FIG. 27C, the silicon nitride film having the low charge trapping ability is deposited on the whole surface of the n-type semiconductor substrate 19 to accordingly form a first gate insulation film 13 of about 10 nm. The silicon nitride film of the low charge trapping ability is deposited by using, for example, the JVD method. After the formation of the first gate insulation film 13, the LPCVD method is used to form a silicon nitride film 18 having a high charge trapping ability of about 5 to 10 nm. In succession, a silicon nitride film having a low charge trapping ability is deposited by using the JVD method to accordingly form a third gate insulation film 15 of about 10 nm.

Figure 27D:
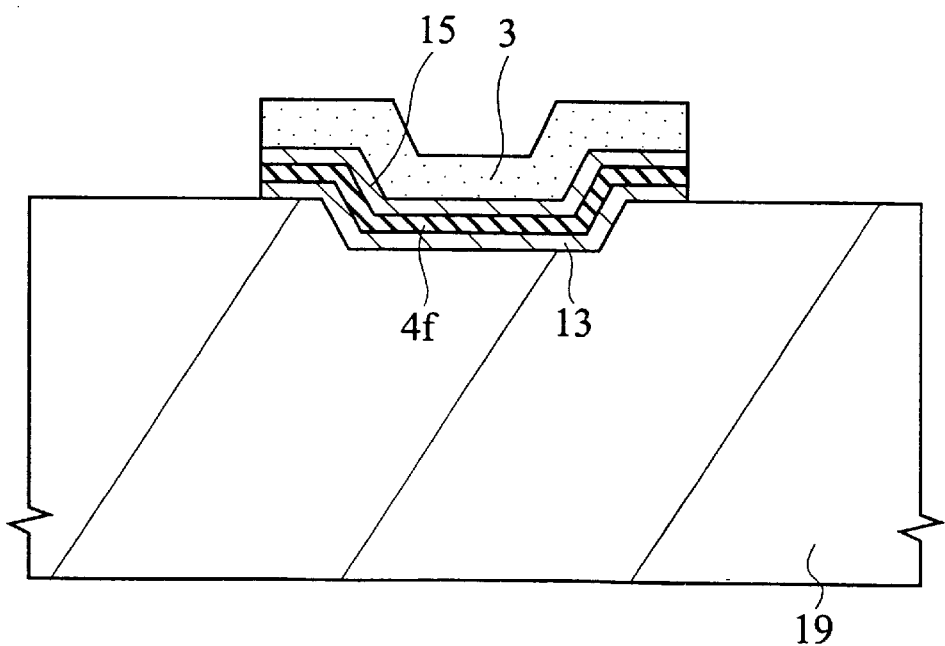

Next, as shown in FIG. 27D, the polysilicon film of about 50 to 250 nm doped with the n-type or p-type impurity is deposited on the whole surface of the n-type semiconductor substrate 19 by using the LPCVD method. After that, it is patterned by using the exposure and etching techniques to accordingly form a gate electrode 3. In succession, the dry etching is performed in the self-alignment manner on the first gate insulation film 13, the silicon nitride film 18 and the third gate insulation film 15 on the surface of the n-type semiconductor substrate 19 in the area, in which the source and drain areas are formed, with the gate electrode 3 as mask. Here, the charge trapping layer 4 is formed.

Figure 27E:
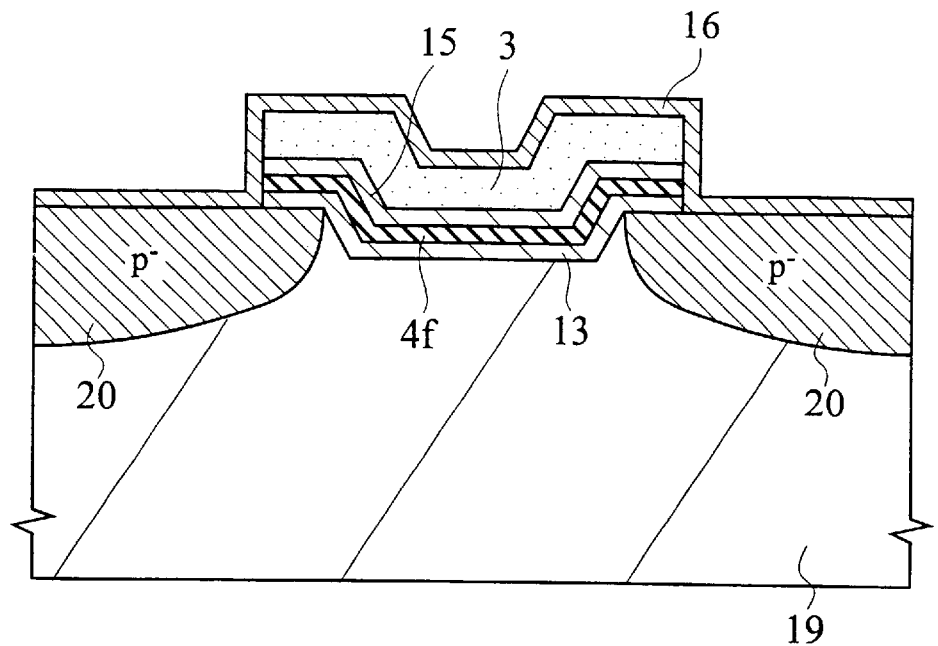

Next, as shown in FIG. 27E, a $p^-$-type diffusion layer 20 of the low impurity concentration is formed after an oxide film 16 is formed on the whole surface of the n-type semiconductor substrate 19. The $p^-$-type diffusion layer 20 is formed by implanting the p-type impurity, with the gate electrode 3 as mask, by using the ion implantation technique and then activating the impurity implanted by the thermal treatment after the ion implantation.

Figure 27F:
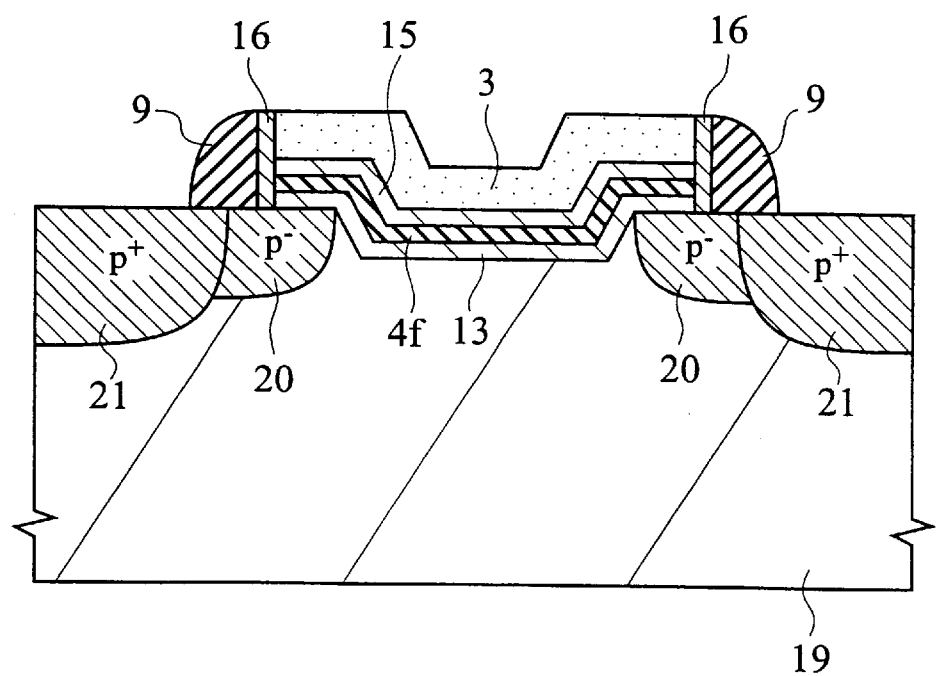

Next, as shown in FIG. 27F, a $p^+$-type diffusion layer 21 of the high impurity concentration is formed after a side wall spacer 9 is formed on a side wall of the gate electrode 3. The $p^+$-type diffusion layer 21 is formed by implanting the p-type impurity, with the gate electrode 3 and the side wall spacer 9 as mask, by using the ion implantation technique, and then activating the impurity implanted by the thermal treatment after the ion implantation.

Next, the high melting point metallic film, such as tungsten, titanium, cobalt and the like, is deposited on the whole surface of the n-type semiconductor substrate 19 by using the CVD method or the sputtering method. In succession, the thermal treatment in the inactive atmosphere is performed on the n-type semiconductor substrate 19. Accordingly, conductive layers 12 made of the high melting point metallic silicide are formed on the respective surfaces of the gate electrode 3 and the $p^+$-type diffusion layer 21. The memory cell structure shown in FIG. 26 is completed if the non-reacted high melting point metal which remains in areas other than the above-mentioned areas is removed after the formation of the conductive layers 12.

In addition, although not shown, the final nonvolatile memory cell is completed through the normal steps of manufacturing CMOS, such as the step of forming the inter-layer insulation film, the step of forming the contact hole, the step of forming the wiring, the step of forming the passivation film and the like, in succession, after the completion of the memory cell structure in FIG. 26.

Twelfth Embodiment

Figure 28:
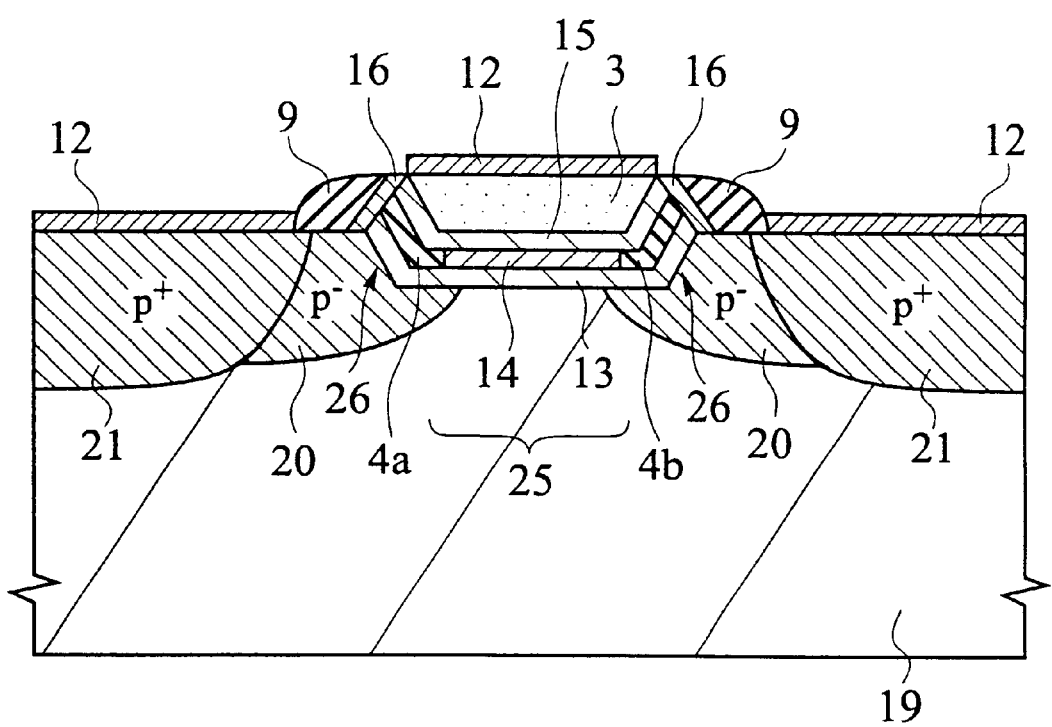
FIG. 28 is a sectional view showing a memory cell structure of a nonvolatile semiconductor memory according to a twelfth embodiment of the present invention.

A twelfth embodiment of the present invention will be described below. FIG. 28 shows a sectional view showing a memory cell structure of a nonvolatile semiconductor memory according to the twelfth embodiment of the present invention. In the tenth embodiment, the exposure and etching techniques are used to pattern the gate electrode 3. However, this twelfth embodiment shows an example that a chemically mechanically polishing method is used to pattern a gate electrode 3.

Figure 29A:
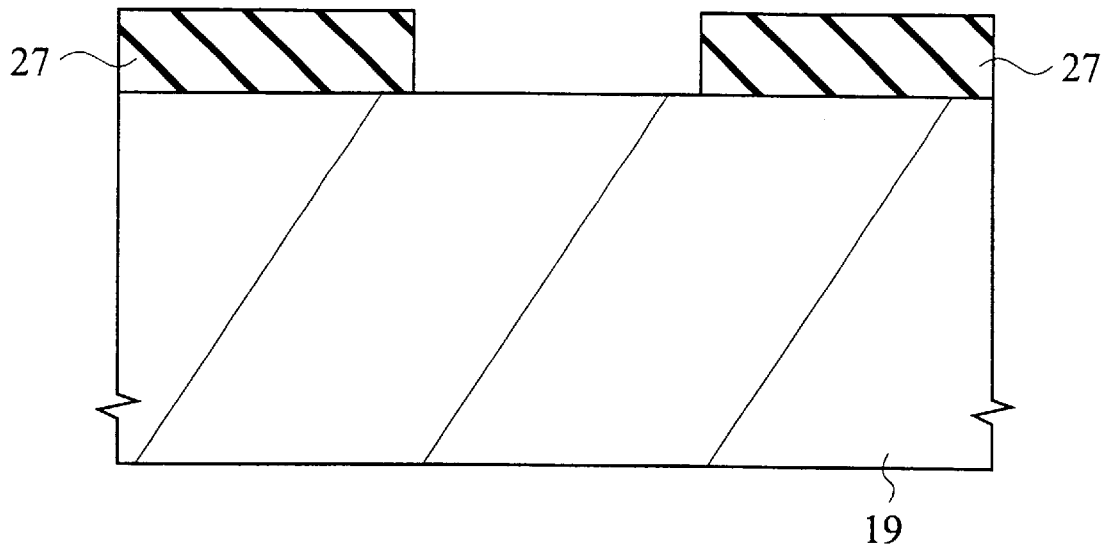
FIGS. 29A to 29I are sectional views showing the steps of manufacturing a memory cell of the nonvolatile semiconductor memory according to the twelfth embodiment of the present invention.
Figure 29B:
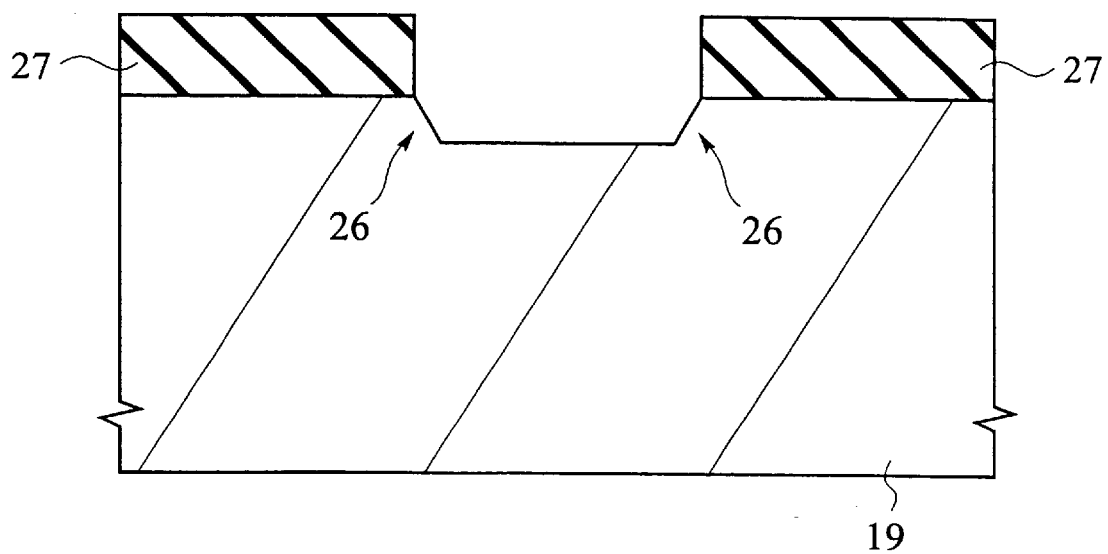

The method for manufacturing the memory cell of the nonvolatile memory according to the twelfth embodiment of the present invention will be described below with reference to FIGS. 29A to 29I. As shown in FIG. 29A, a photo resist pattern 27 that coats an area except an area in which a channel area 25 is formed is firstly formed on an n-type semiconductor substrate 19. As shown in FIG. 29B, a step structure 26 is formed by etching the n-type semiconductor substrate 19 by using, for example, the RIE method.

Figure 29C:
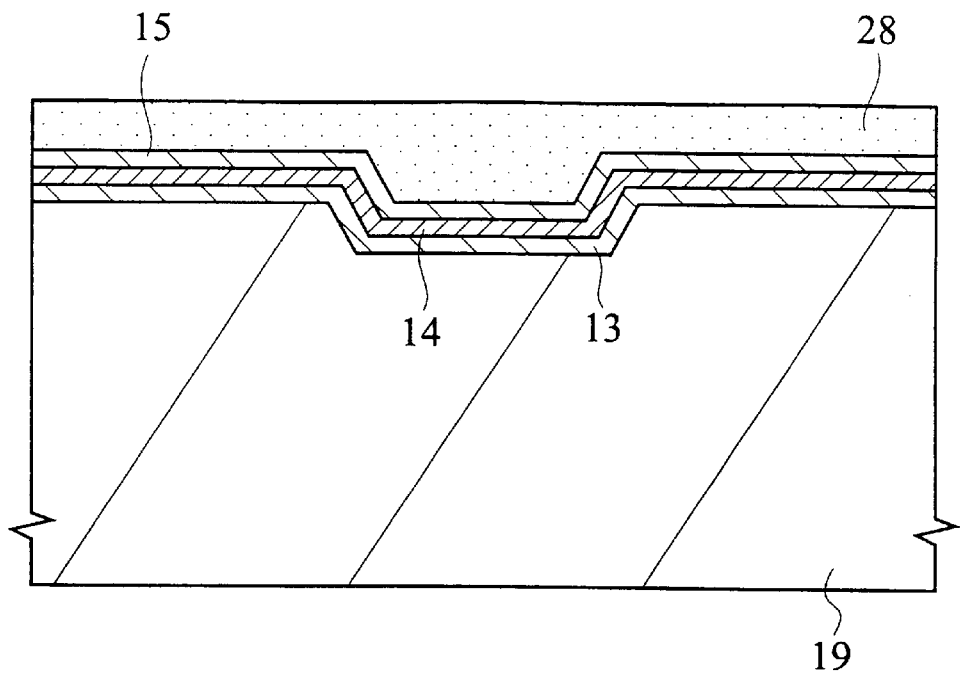

Next, as shown in FIG. 29C, the silicon nitride film having the low charge trapping ability is deposited on the whole surface of the n-type semiconductor substrate 19 to accordingly form a first gate insulation film 13 of about 10 nm. The silicon nitride film of the low charge trapping ability is deposited by using, for example, the JVD method. After the formation of the first gate insulation film 13, silicon oxide film is deposited by using the CVD method to accordingly form a second gate insulation film 14 of about 5 to 10 nm. In succession, the silicon nitride film having the low charge trapping ability is deposited by using the JVD method to accordingly form a third gate insulation film 15 of about 10 nm. Moreover, a polysilicon film 28 of about 50 to 500 nm doped with the n-type or p-type impurity is deposited on the whole surface of the n-type semiconductor substrate 19 by using the LPCVD method.

Figure 29D:
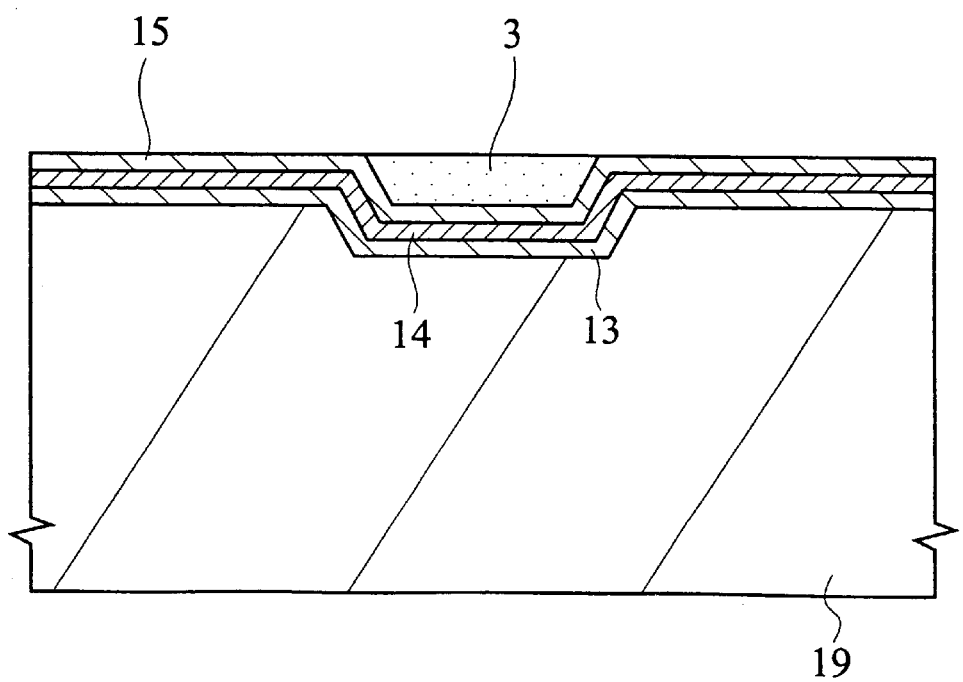

Next, as shown in FIG. 29D, the chemically mechanically polishing method is used to embed the polysilicon film 19 to accordingly form a gate electrode 3. In addition, the first gate insulation film 13, the second gate insulation film 14 and the third gate insulation film 15, which normally remain on the n-type semiconductor substrate 19, are removed by using, for example, the wet etching.

Figure 29E:
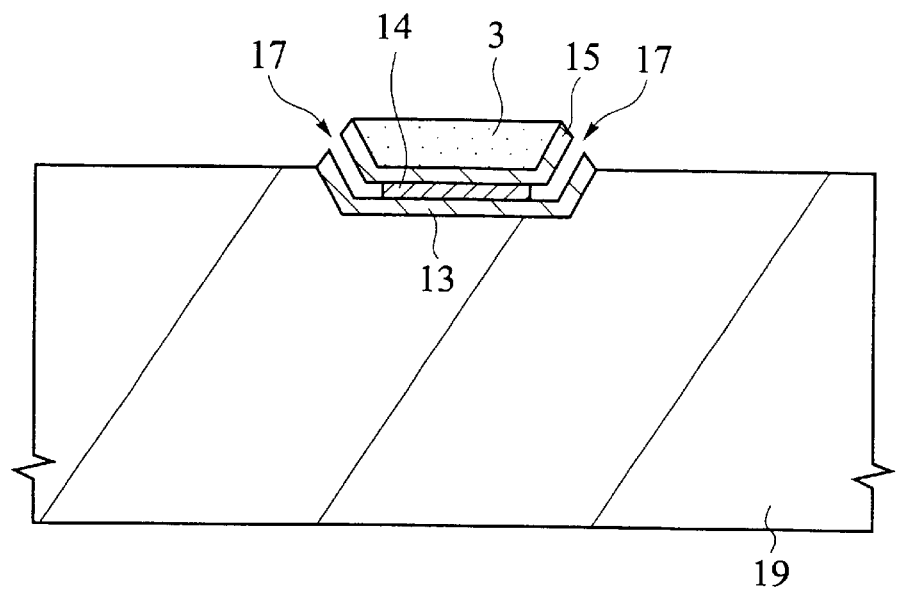

Next, as shown in FIG. 29E, a space 17 is created to form the charge trapping layer. This space 17 is created by using the etching solution, in which an etching speed of the second gate insulation film 14 is faster than those of the first gate oxide film 13 and the third gate insulation film 15, and selectively performing the wet etching on an end of the second gate insulation film 14. In the twelfth embodiment of the present invention, the first gate oxide film 13 and the third gate insulation film 15 are made of the silicon nitride film, and the second gate insulation film 14 is made of the silicon oxide film. Thus, for example, the hydrofluoric acid system may be used as the etching solution. Also, the space 17 to form the charge trapping layer may be formed by using the plasma dry etching method of using the gas containing the HF gas, instead of the wet etching method of using the etching solution.

Figure 29F:
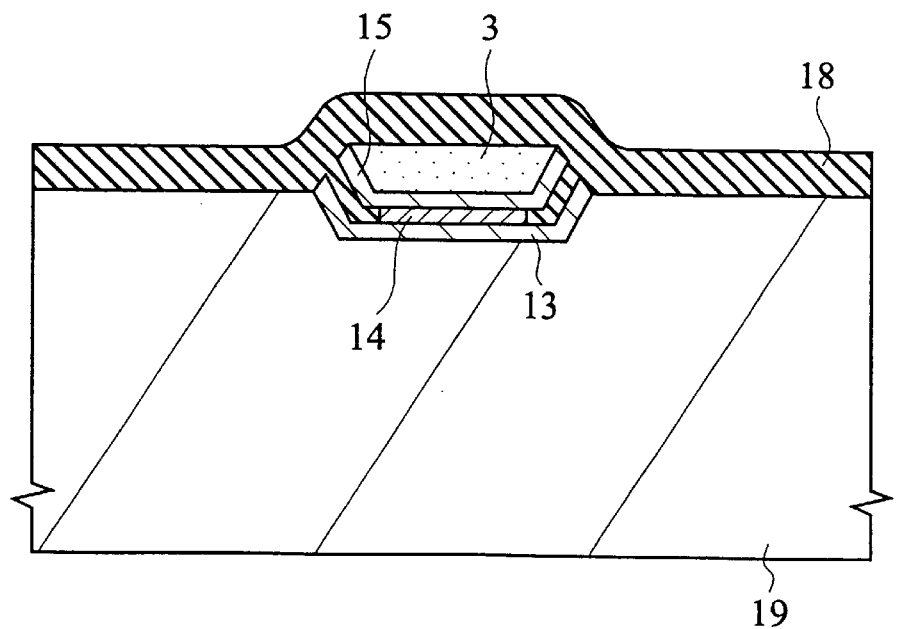
Figure 29G:
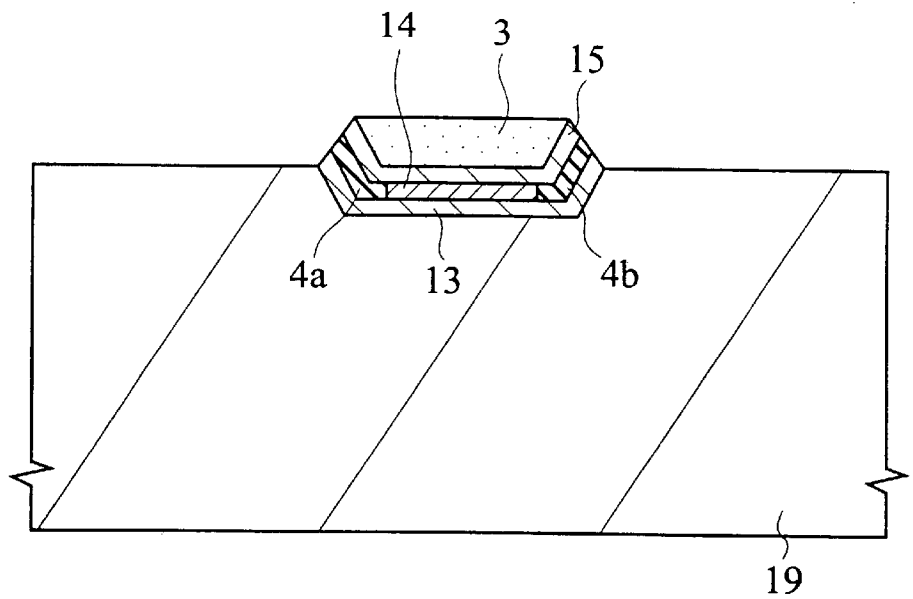

Next, as shown in FIG. 29F, a silicon nitride film 18 having a high charge trapping ability is deposited on the whole surface of the n-type semiconductor substrate 19 by using the LPCVD method so that the silicon nitride film 18 is completely embedded in the space 17 to form the charge trapping layer. Then, as shown in FIG. 29G, the anisotropic etching is performed on the whole surface of the n-type semiconductor substrate 19 by using the RIE method, which accordingly forms the charge trapping layers 4a, 4b made of the silicon nitride film having the high charge trapping ability.

Figure 29H:
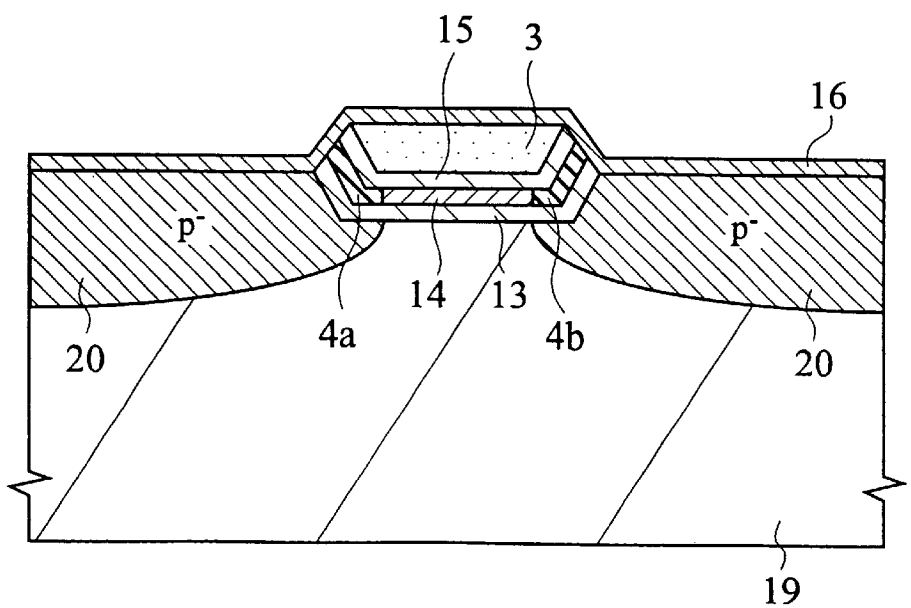

Next, as shown in FIG. 29H, a p$^-$-type diffusion layer 20 of the low impurity concentration is formed after an oxide film 16 is formed on the whole surface of the n-type semiconductor substrate 19. The p$^-$-type diffusion layer 20 is formed by implanting the p-type impurity, with the gate electrode 3 as mask, by using the ion implantation technique, and then activating the impurity implanted by the thermal treatment after the ion implantation.

Figure 29I:
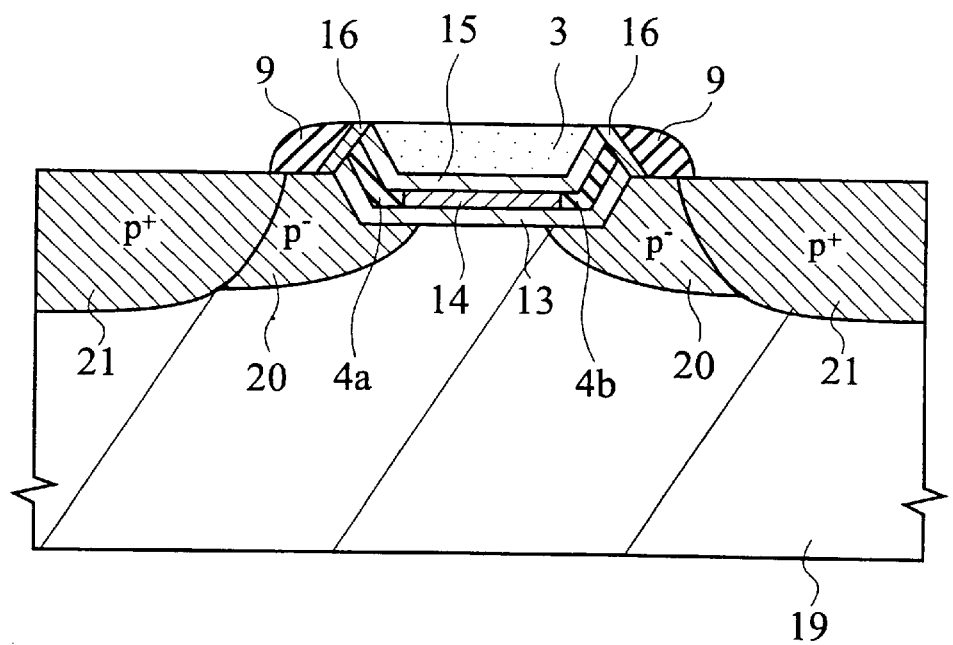

Next, as shown in FIG. 29I, a p$^+$-type diffusion layer 21 of the high impurity concentration is formed after a side wall spacer 9 is formed on a side wall of the gate electrode 3. The p$^+$-type diffusion layer 21 is formed by implanting the p-type impurity, with the gate electrode 3 and the side wall spacer 9 as mask, by using the ion implantation technique, and then activating the impurity implanted by the thermal treatment after the ion implantation.

Next, the high melting point metallic film, such as tungsten, titanium, cobalt and the like, is deposited on the whole surface of the n-type semiconductor substrate 19 by using the CVD method or the sputtering method. In succession, the thermal treatment in the inactive atmosphere is performed on the n-type semiconductor substrate 19. Accordingly, conductive layers 12 made of the high melting point metallic silicide are formed on the respective surfaces of the gate electrode 3 and the p$^+$-type diffusion layer 21. The memory cell structure shown in FIG. 28 is completed if the non-reacted high melting point metal which remains in areas other than the above-mentioned areas is removed after the formation of the conductive layers 12.

In addition, although not shown, the final nonvolatile memory cell is completed through the normal steps of manufacturing CMOS, such as the step of forming the inter-layer insulation film, the step of forming the contact hole, the step of forming the wiring, the step of forming the passivation film and the like, in succession, after the completion of the memory cell structure in FIG. 28.

Thirteenth Embodiment

A thirteenth embodiment of the present invention will be described below. In the first to twelfth embodiments, sufficient consideration is not done so as to improve a speed of a transistor other than those of the memory cells. On the other hand, as a structure of a fast CMOS transistor, a method is tried for forming a concave notch between a gate electrode and a source and drain diffusion layer, and accordingly reducing a capacitance between the gate electrode and the diffusion layer, and further making a speed of logic gate faster (T. Ghani et al., IDEM99, p415). In this thirteen embodiment, this structure is used for the nonvolatile semiconductor memory to largely improve a speed of a semiconductor device in which a normal transistor and a nonvolatile semiconductor memory are mixed without a memory function.

Figure 30:
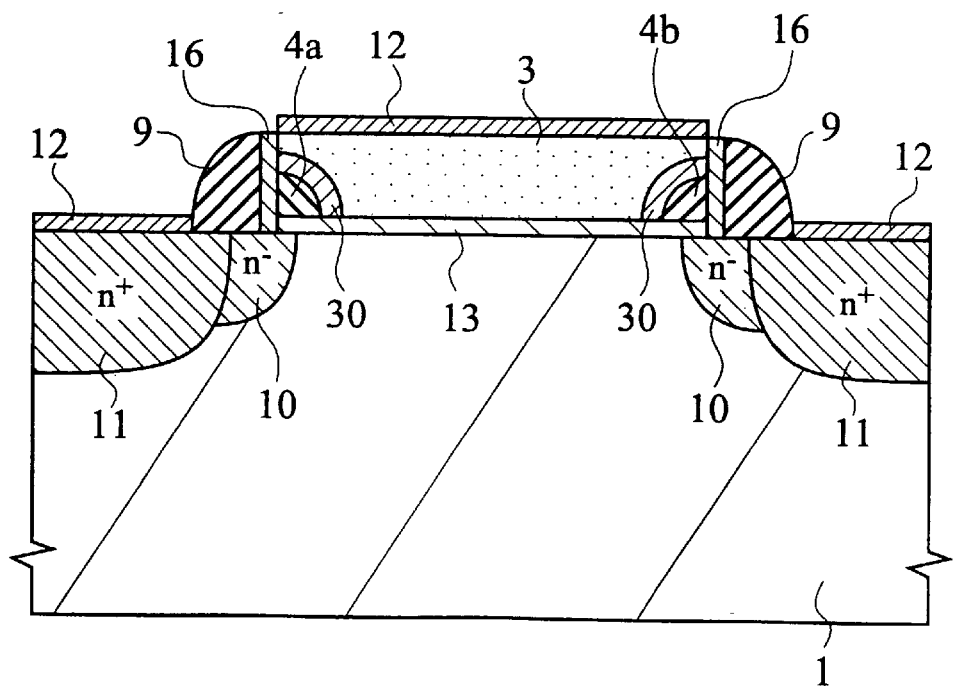
FIG. 30 is a sectional view showing a memory cell structure of a nonvolatile semiconductor memory according to a thirteenth embodiment of the present invention.

FIG. 30 is a sectional view showing a memory cell structure of a nonvolatile semiconductor memory according to the thirteenth embodiment of the present invention. This memory cell is constituted by the n-type MOS transistor. In the memory cell structure of the nonvolatile semiconductor memory according to the thirteenth embodiment of the present invention, a gate electrode 3 is formed on a surface of a p-type semiconductor substrate 1 through a first gate insulation film 13. Concave portions are formed at both ends of the gate electrode 3. Charge trapping layers 4 (4a, 4b) are formed on the respective concave portions. An oxide film 30 is formed between the charge trapping layer 4 and the gate electrode 3. A side wall spacer 9 is formed on a side of the gate electrode 3 through an oxide film 16. An n$^-$-type diffusion layer 10 of a low impurity concentration adjacent to the channel area and an n$^+$-type diffusion layer 11 of a high impurity concentration located outside this n$^-$-type diffusion layer 10 are formed on a main surface of a p-type semiconductor substrate 1 below this side wall spacer 9. Conductive layers 12 are formed on the respective surfaces of the gate electrode 3 and the n$^+$-type diffusion layer 11.

The memory cell of the nonvolatile memory according to the thirteenth embodiment of the present invention has the LDD structure in which the source and drain areas are constituted by the n$^-$-type diffusion layers 10 of the low impurity concentration and the n$^+$-type diffusion layers 11 of the high impurity concentration. Then, the charge trapping layers 4 (4a, 4b) are formed on both ends of the gate electrode 3. Electrons are trapped in those two charge trapping layers 4a, 4b. Its trapping state may include the following four states: (1) the state that the electrons are not trapped in any one of the charge trapping layers 4a, 4b; (2) the state that the electrons are trapped in only the charge trapping layer 4a; (3) the state that the electrons are trapped in only the charge trapping layer 4b; and (4) the state that the electrons are trapped in both the charge trapping layers 4a, 4b. The change amounts of the threshold voltage caused by the presence or absence of the electrons held in those two charge trapping layers 4a, 4b are correlated with "00", "01", "10" and "11" of a memory information, respectively. In this memory cell structure, the charge trapping layers 4 are positioned in the upper portion of the end of the channel area. Thus, a threshold voltage at a center of the channel area is determined only by an impurity concentration of the channel area, and does not depend on the trapping state of the electrons in the charge trapping layers 4. Hence, the over-erasure caused by the excess or deficiency of the electrons in the charge trapping layers 4 can be protected so that the leakage trouble, the program defect, the read out error and the like are never induced because of the over-erasure. Also, the leakage current between the source and drain areas can be suppressed only by a gate voltage to thereby attain the nonvolatile semiconductor memory of high reliability. The charge trapping layers 4 may be made of the silicon nitride film having the high charge trapping ability by using the CVD method. This is because the trapping of the electrons at the discrete charge capture level in the silicon nitride film enables the charge retention capability having little influence on the film quality of the lower insulation film. Also, if it is made of the silicon film or the polysilicon film, it can be manufactured at a low cost. Moreover, if the first gate insulation film 13 is made of the silicon nitride film ($Si_3N_4$ film) having the dielectric constant equal to about two times that of the silicon oxide film ($SiO_2$ film), it is possible to stably form the very thin gate insulation film with the equivalent silicon oxide thickness is about 4 nm to 11 nm. For example, since the substantial film thickness of the silicon nitride film with the equivalent silicon oxide thickness is 5 nm is about 10 nm, the direct tunnel (DT) injection is never induced. Therefore, the voltage at the time of the injection and ejection operation of the electrons is made lower, which not only enables the memory cell to be hyperfine, but also enables the peripheral high voltage operation element to be hyperfine.

In the memory cell of the nonvolatile memory according to the thirteenth embodiment of the present invention, the $n^-$-type diffusion layer 10 is formed, and then the LDD structure is configured, in order to improve the breakdown voltages of the source and drain areas. However, the source and drain areas may be constituted by the single-drain structure or the double-drain structure.

Figure 31A:
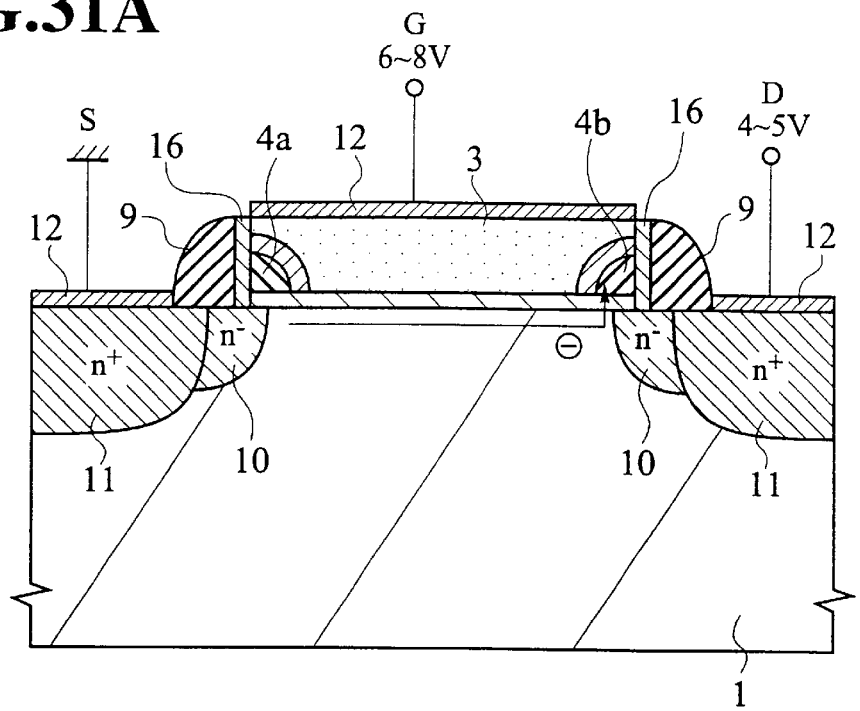
FIGS. 31A and 31B are sectional views showing the operations of the nonvolatile semiconductor memory, according to the thirteenth embodiment of the present invention, which is provided with n-type MOS transistors.
Figure 31B:
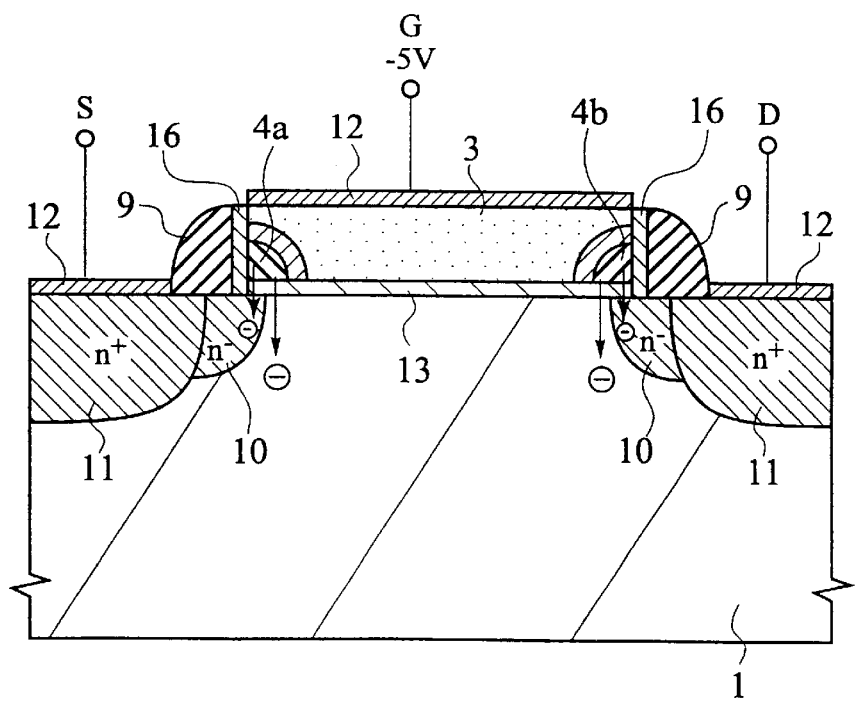

The operation of the nonvolatile memory according to the thirteenth embodiment of the present invention will be described below with reference to FIGS. 31A and 31B. FIG. 31A is a sectional view of the nonvolatile memory describing the writing operation. FIG. 31B is a sectional view of the nonvolatile memory describing the erasing operation. The memory cell in FIGS. 31A and 31B is constituted by the n-type MOS transistor. As shown in FIG. 31A, when the memory cell is written, a voltage of about 6 to 8 V is applied to a gate G, a voltage of about 4 to 5 V is applied to a drain D, respectively, and a source S is grounded. In this way, the voltages are applied. So, through the channel hot electron (CHE), electrons are implanted into the charge trapping layer 4b on the side of the drain area. If the electrons are implanted into the charge trapping layer 4a on the side of the source area, the respective voltages applied to the drain D and the source S may be interchanged from the above-mentioned case. On the other hand, as shown in FIG. 31B, the memory cell is erased by applying a negative voltage (~–5V) to the gate G, using the FOWLER NORDHEIM (FN) type tunnel current, and pulling out the electrons from the charge trapping layers 4a, 4b. Also, if the gate G is shared by a plurality of memory cells, the electrons can be simultaneously pulled out from those memory cells. In this case, potentials of the source S and the drain D may be equal to that of the p-type semiconductor substrate 1. If the positive voltage different from the potential of the p-type semiconductor substrate 1 is applied to the drain electrode and then the source electrode is set at the floating potential, the electrons can be also pulled out only from the charge trapping layer 4a on the side of the drain electrode. If the electrons are pulled out only from the charge trapping layer 4b on the side of the source electrode, the positive voltage may be applied to the source electrode to then set the drain electrode at the floating potential.

Although not shown, the memory cell can be read out by detecting the read out current flowing between the source S and the drain D. This uses the fact that the current transmission characteristic (channel conductance) in the vicinity of the source and drain areas is modulated depending on the trapping states of the charge trapping layers 4a, 4b. Which of the source S or the drain D is biased may be selected depending on the one which demonstrates larger variations in current transmission characteristic. The four different current transmission characteristics are obtained depending on the four trapping states with regard to the charge trapping layers 4a, 4b. Accordingly, the information corresponding to the two bits can be stored in one cell.

Figure 32A:
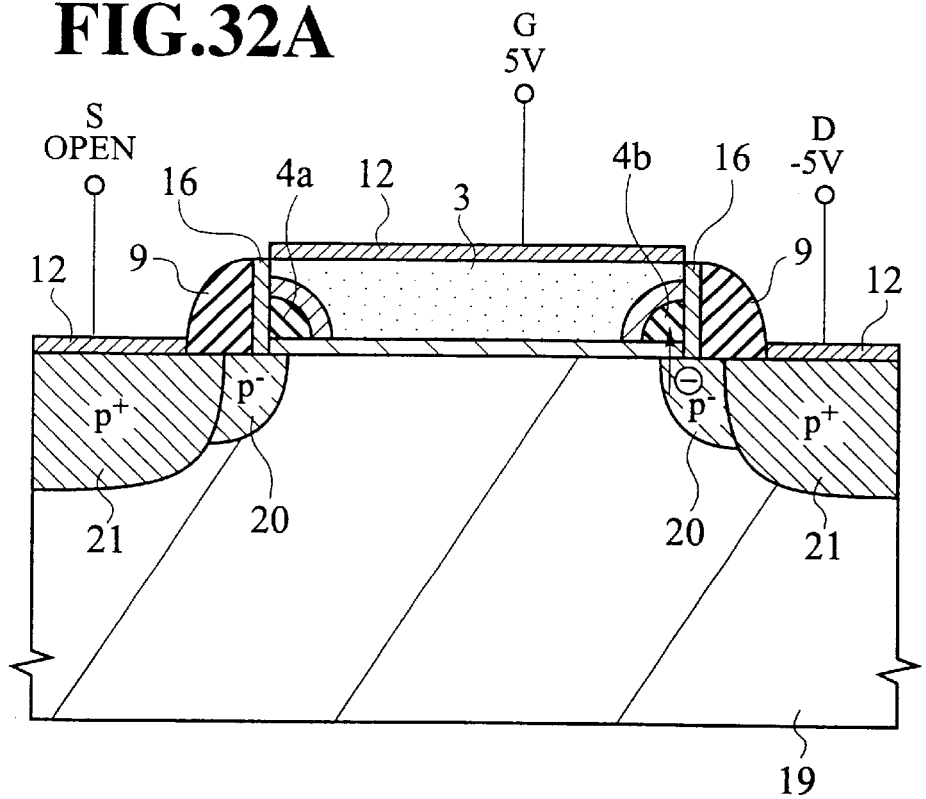
FIGS. 32A and 32B are sectional views showing the operations of the nonvolatile semiconductor memory, according to the thirteenth embodiment of the present invention, which is provided with p-type MOS transistors.
Figure 32B:
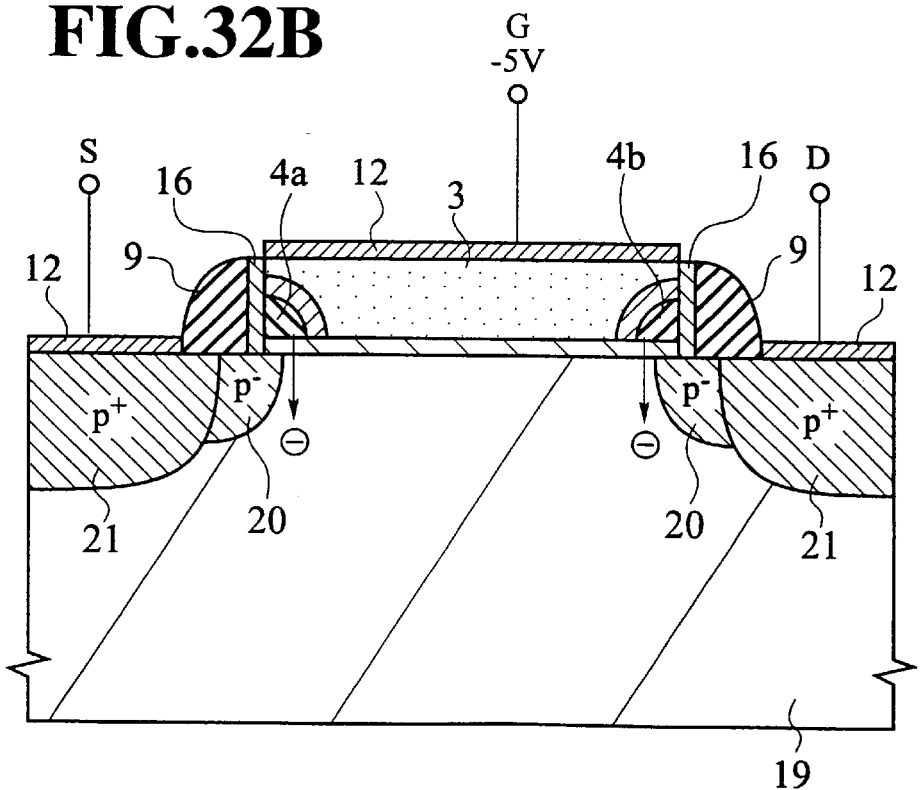

The operation of the nonvolatile memory according to the thirteenth embodiment of the present invention, which is constituted by the p-type MOS transistor, will be described below with reference to FIGS. 32A and 32B. FIG. 32A is a sectional view of the nonvolatile memory describing the writing operation. FIG. 32B is a sectional view of the nonvolatile memory describing the erasing operation. The memory cell in FIGS. 32A and 32B is constituted by the p-type MOS transistor. As shown in FIG. 32A, when the memory cell is written, a voltage of about 5 V is applied to a gate G, a voltage of about –5 V is applied to a drain D, respectively, and a source S is set at the floating potential. In this way, the voltages are applied. Then, energy is given to electrons induced by the band-to-band tunneling phenomenon at the electric field in the vicinity of the drain area, and the electrons are implanted into the charge trapping layer 4b on the side of the drain area. If the electrons are implanted into the charge trapping layer 4a on the side of the source area, the respective voltages applied to the drain D and the source S may be interchanged from the above-mentioned case. On the other hand, as shown in FIG. 32B, the memory cell is erased by applying a negative voltage (~–5V) to the gate G, using the FN current, and pulling out the electrons from the charge trapping layers 4a, 4b. Also, if the gate G is shared by a plurality of memory cells, the electrons can be simultaneously pulled out from those memory cells. In this case, potentials of the source S and the drain D may be equal to that of the n-type semiconductor substrate 19 or the floating potential.

Although not shown, the memory cell can be read out by detecting the read out current flowing between the source S and the drain D. This uses the fact that the current transmission characteristic (channel conductance) in the vicinity of the source and drain areas is modulated depending on the trapping states of the charge trapping layers 4a, 4b. Which of the source S or the drain D is biased may be selected depending on the one which demonstrates larger variations in current transmission characteristic. The four different current transmission characteristics are obtained depending on the four trapping states with regard to the charge trapping layers 4a, 4b. Accordingly, the information corresponding to the two bits can be stored in one cell.

Figure 33:
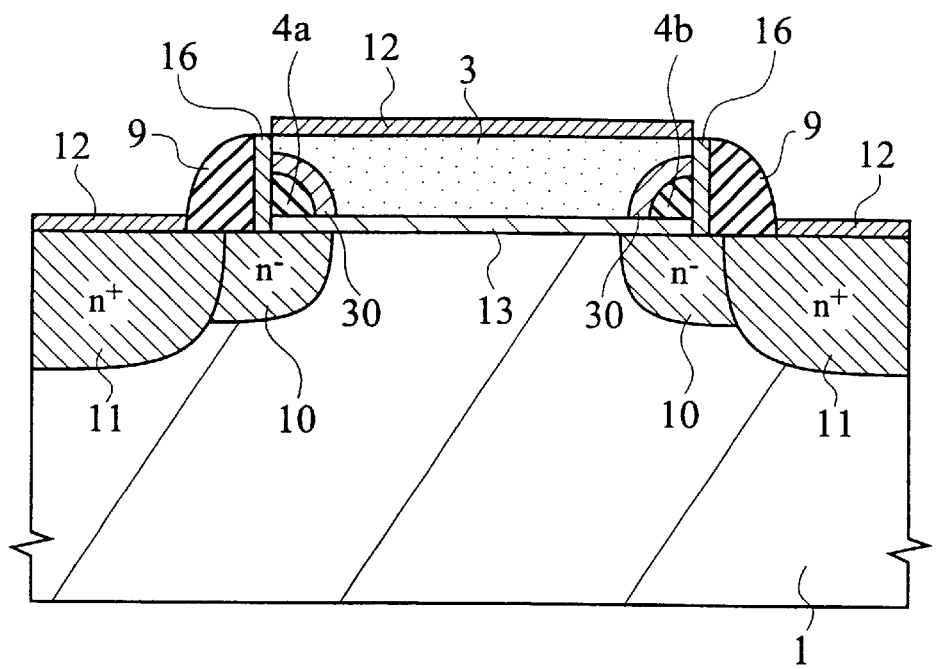
FIG. 33 is a sectional view showing a structure of a MOS transistor having the same gate structure as the memory cell of the nonvolatile semiconductor memory according to the thirteenth embodiment of the present invention.

The thirteenth embodiment of the present invention can also attain the normal MOS transistor without the memory function, as shown in FIG. 33. This is because in this MOS transistor, the charge trapping layers 4 are formed only on the source and drain areas 10, 11 and it is not formed on the channel area. For this reason, the maintenance condition of the charge in the charge trapping layer 4 has no influence on the transmission performance of this MOS transistor. Moreover, the existence of the concave portion in the gate electrode 3 reduces a parasitic capacitance between the gate, the source and the drain. Thus, this has a merit that a fast operation of the MOS transistor is possible.

Fourteenth Embodiment

Figure 34:
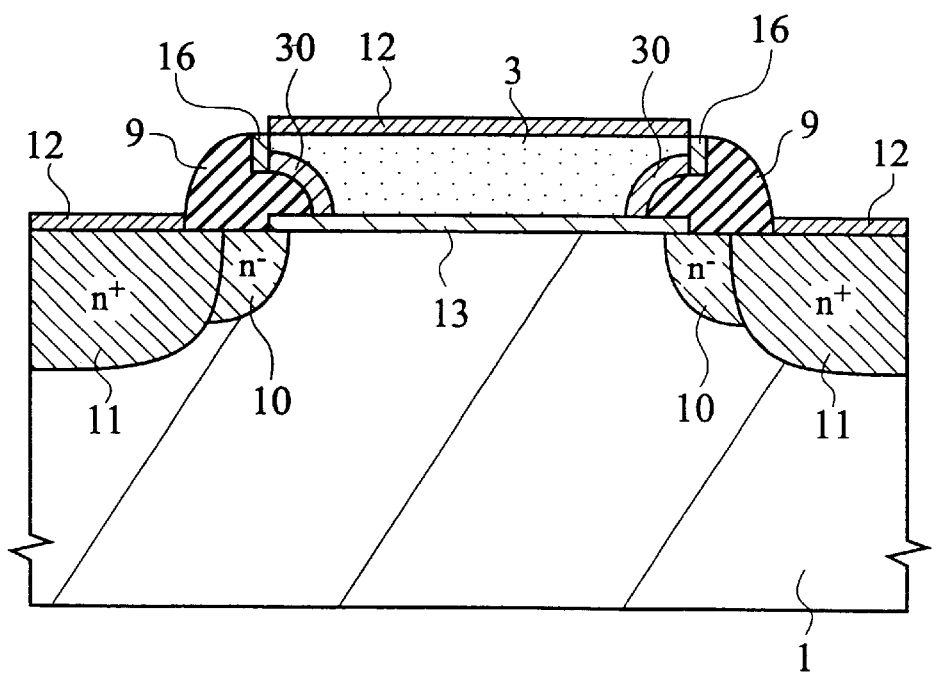
FIG. 34 is a sectional view showing a memory cell structure of a nonvolatile semiconductor memory according to a fourteenth embodiment of the present invention.

A fourteenth embodiment of the present invention will be described below. This fourteenth embodiment has a configuration that in the thirteenth embodiment, the charge trapping layer 4 and the side wall spacer 9 are integrated into a single unit. FIG. 34 is a sectional view showing a memory cell structure of a nonvolatile semiconductor memory according to the fourteenth embodiment of the present invention. This memory cell is constituted by the n-type MOS transistor. In the memory cell structure of the nonvolatile semiconductor memory according to the fourteenth embodiment of the present invention, a gate electrode 3 is formed on a surface of a p-type semiconductor substrate 1 through a first gate insulation film 13. Concave portions are formed at both ends of the gate electrode 3. Charge trapping layers 4 (4a, 4b) are formed on the respective concave portions. An oxide film 30 is formed between the charge trapping layer 4 and the gate electrode 3. A side wall spacer 9 is formed on a side of the gate electrode 3 through an oxide film 16. A part of this side wall spacer 9 constitutes the charge trapping layer 4. An n$^-$-type diffusion layer 10 of a low impurity concentration adjacent to the channel area and an n$^+$-type diffusion layer 11 of a high impurity concentration located outside this n$^-$-type diffusion layer 10 are formed on a main surface of a p-type semiconductor substrate 1 below this side wall spacer 9. Conductive layers 12 are formed on the respective surfaces of the gate electrode 3 and the n$^+$-type diffusion layer 11.

In the fourteenth embodiment of the present invention, the side wall spacer 9 and the charge trapping layer 4 may be made of the silicon nitride film having the high charge trapping ability by using the CVD method. This is because the trapping of the electrons at the discrete charge capture level in the silicon nitride film enables the charge retention capability having little influence on the film quality of the lower insulation film. Also, if it is made of the silicon film or the polysilicon film, it can be manufactured at a low cost.

Figure 35:
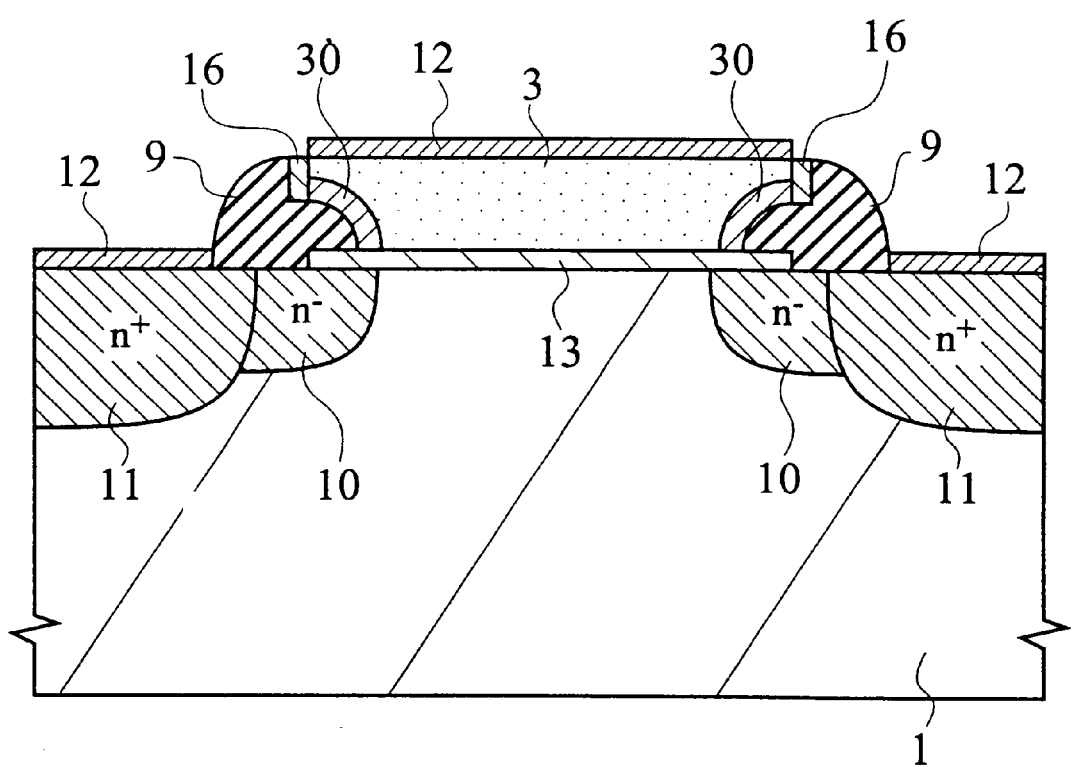
FIG. 35 is a sectional view showing a structure of a MOS transistor having the same gate structure as the memory cell of the nonvolatile semiconductor memory according to the fourteenth embodiment of the present invention.

The fourteenth embodiment of the present invention can attain the normal MOS transistor, as shown in FIG. 35, similarly to the thirteenth embodiment.

Various modifications will become possible for those skilled in the art after receiving the teachings of the present disclosure without departing from scope thereof.

What is claimed is:

1. A method for manufacturing a nonvolatile semiconductor memory comprising the steps of:
    forming a gate insulation film on a main surface of a semiconductor substrate;
    delineating a first gate electrode on the a gate insulation film;
    selectively forming a charge trapping layer at a side of the first gate electrode;
    delineating a second gate electrode electrically isolated from the first gate electrode on a side face of the charge trapping layer so that the charge trapping layer is sandwiched in between the first and second gate electrodes; and
    forming a conductive layer on the first gate electrode and the second gate electrode so that the first and second gate electrodes are electrically connected.

2. A method for manufacturing a nonvolatile semiconductor memory comprising the steps of:
    sequentially forming first, second and third insulation films on a main surface of a semiconductor substrate, and forming a gate insulation film composed of the first, second and third insulation films;
    depositing a gate electrode configuration material on an upper portion of the gate insulation film, and then patterning the gate electrode configuration material and the gate insulation film, and accordingly forming a gate electrode;
    selectively removing an end of said second insulation film, and accordingly forming a space; and
    forming a charge trapping layer in the space.

3. A method for manufacturing a nonvolatile semiconductor memory according to claim 2, wherein said step of forming the space comprises a step of using a difference between etching speeds of said first and third insulation films and an etching speed of said second insulation film, and selectively etching only said second insulation film.

4. A method for manufacturing a nonvolatile semiconductor memory according to claim 2, wherein said step of forming the charge trapping layer comprises a step of depositing the charge trapping layer configuration material so as to coat said gate electrode, and a step of anisotropically etching the charge trapping layer configuration material.

5. A method for manufacturing a nonvolatile semiconductor memory according to claim 2, wherein:
    said step of forming the space comprises a step of selectively removing each end of said second insulation film, to form a space at each of the selectively removed ends; and
    said step of forming the charge trapping layer comprises a step of forming the charge trapping layer in each of the spaces formed at the selectively removed ends.

6. A method for manufacturing a semiconductor memory comprising the steps of:
    forming a first insulation film on a part of a main surface of a semiconductor substrate;
    sequentially forming second and third insulation films on an upper portion of the first insulation film and another part of the main surface of said semiconductor substrate;
    depositing a gate electrode configuration material on an upper portion of the third insulation film;
    forming a first gate electrode by patterning the gate electrode configuration material, said third insulation film, said second insulation film and said first insulation film;
    forming a second gate electrode by patterning said gate electrode configuration material, said third insulation film and said second insulation film;
    selectively removing ends of the second insulation films on both the first and second gate electrodes, and forming a space; and
    forming a charge trapping layer in the space.

7. A method for manufacturing a semiconductor memory according to claim 6, wherein said step of forming the space comprises a step of selectively etching only said second insulation film by using a difference between etching speeds of said first and third insulation films and an etching speed of said second insulation film.

8. A method for manufacturing a semiconductor memory according to claim 6, wherein said step of forming the charge trapping layer comprises a step of depositing a charge trapping layer configuration material so as to coat the first and second gate electrodes, and a step of anisotropically etching the charge trapping layer configuration material.

9. A method for manufacturing a semiconductor memory according to claim 6, wherein:
    said step of forming the space comprises a step of selectively removing each end of the second insulation film on each of the first and second gate electrodes, to form a space at each of the selectively removed ends; and
    said step of forming the charge trapping layer comprises a step of forming the charge trapping layer in each of the spaces formed at the selectively removed ends.

10. A method for manufacturing a semiconductor memory comprising the steps of:
    sequentially forming first, second and third insulation films on a main surface of a semiconductor substrate;

depositing a first gate electrode configuration material on an upper portion of the third insulation film, and then patterning the gate electrode configuration material, said third insulation film, said second insulation film and said first insulation film, and accordingly forming a first gate electrode;

forming a second gate electrode formation area, on a part of the main surface of said semiconductor substrate, by removing said gate electrode configuration material, said third insulation film, said second insulation film and said first insulation film, simultaneously with the step of forming the first gate electrode;

selectively removing an end of said second insulation film of the first gate electrode, and accordingly forming a space;

forming an extremely thin insulation film on the main surface of said semiconductor substrate;

depositing a material constituting a charge trapping layer on the main surface of said semiconductor substrate, and then anisotropically etching the charge trapping layer configuration material, and accordingly forming the charge trapping layer in the space of the first gate electrode; and depositing a fourth insulation film and a second gate electrode configuration material, on the main surface of said semiconductor substrate, and then patterning the second gate electrode configuration material, said fourth insulation film, said charge trapping layer configuration material and said extremely thin insulation film, and accordingly forming a second gate electrode.

11. A method for manufacturing a semiconductor memory according to claim 10, wherein:

said step of forming the space comprises a step of selectively removing each end of said second insulation film of the first gate electrode, to form a space at each of the selectively removed ends; and said step of forming the charge trapping layer comprises a step of forming the charge trapping layer in each of the spaces formed at the selectively removed ends.

12. A method for manufacturing a nonvolatile semiconductor memory comprising the steps of:

forming a convex portion on a main surface of a semiconductor substrate;

sequentially forming first, second and third insulation films on the main surface of said semiconductor substrate including the convex portion, and forming a gate insulation film composed of the first, second and third insulation films;

depositing a gate electrode configuration material on an upper portion of the gate insulation film, and then patterning the gate electrode configuration material and the gate insulation film, and accordingly forming a gate electrode;

selectively removing an end of said second insulation film, and forming a space; and forming a charge trapping layer in the space.

13. A method for manufacturing a nonvolatile semiconductor memory according to claim 12, wherein said step of forming the space comprises a step of selectively etching only said second insulation film by using a difference between etching speeds of said first and third insulation films and an etching speed of said second insulation film.

14. A method for manufacturing a nonvolatile semiconductor memory according to claim 12, wherein said step of forming the charge trapping layer comprises a step of depositing the charge trapping layer configuration material so as to coat said gate electrode and a step of anistropically etching the charge trapping layer configuration material.

15. A method for manufacturing a nonvolatile semiconductor memory according to claim 12, wherein:

said step of forming the space comprises a step of selectively removing each end of said second insulation film, to form a space at each of the selectively removed ends; and said step of forming the charge trapping layer comprises a step of forming the charge trapping layer in each of the spaces formed at the selectively removed ends.

16. A method for manufacturing a nonvolatile semiconductor memory comprising the steps of:

forming a convex portion on a main surface of a semiconductor substrate;

sequentially forming a first insulation film, a charge trapping layer configuration material and a third insulation film on the main surface of said semiconductor substrate including the convex portion; and patterning the first insulation film, the charge trapping layer configuration material and the third insulation film, and accordingly forming a gate electrode.

17. A method for manufacturing a nonvolatile semiconductor memory comprising the steps of:

forming a concave portion on a main surface of a semiconductor substrate;

sequentially forming first, second and third insulation films on the main surface of said semiconductor substrate including the concave portion, and forming a gate insulation film composed of the first, second and third insulation films;

depositing a gate electrode configuration material on an upper portion of the gate insulation film, and then patterning the gate electrode configuration material and the gate insulation film, and accordingly forming a gate electrode;

selectively removing an end of said second insulation film, and forming a space; and forming a charge trapping layer in the space.

18. A method for manufacturing a nonvolatile semiconductor memory according to claim 17, wherein said step of forming the space comprises a step of selectively etching only said second insulation film by using a difference between etching speeds of said first and third insulation films and an etching speed of said second insulation film.

19. A method for manufacturing a nonvolatile semiconductor memory according to claim 17, wherein said step of forming the charge trapping layer comprises a step of depositing a charge trapping layer configuration material so as to coat said gate electrode, and a step of anistropically etching the charge trapping layer configuration material.

20. A method for manufacturing a nonvolatile semiconductor memory according to claim 17, wherein:

said step of forming the space comprises a step of selectively removing each end of said second insulation film, to form a space at each of the selectively removed ends; and said step of forming the charge trapping layer comprises a step of forming the charge trapping layer in each of the spaces formed at the selectively removed ends.

21. A method for manufacturing a nonvolatile semiconductor memory comprising the steps of:

forming a concave portion on a main surface of a semiconductor substrate;

sequentially forming a first insulation film, a charge trapping layer configuration material and a third insulation film on the main surface of said semiconductor substrate including the concave portion; and patterning the first insulation film, the charge trapping layer configuration material and the third insulation film, and accordingly forming a gate electrode.

22. A method for manufacturing a nonvolatile semiconductor memory comprising the steps of:

forming a concave portion on a main surface of a semiconductor substrate;

sequentially forming first, second and third insulation films on the main surface of said semiconductor substrate including the concave portion, and forming a gate insulation film composed of the first, second and third insulation films;

depositing a gate electrode configuration material on an upper portion of the gate insulation film, and then removing the gate electrode configuration material by means of a chemically mechanically polishing method, and accordingly forming a gate electrode;

selectively removing an end of said second insulation film, and forming a space; and forming a charge trapping layer in the space.

23. A method for manufacturing a nonvolatile semiconductor memory according to claim 22, wherein:

said step of forming the space comprises a step of selectively removing each end of said second insulation film, to form a space at each of the selectively removed ends; and said step of forming the charge trapping layer comprises a step of forming the charge trapping layer in each of the spaces formed at the selectively removed ends.

24. A method for manufacturing a nonvolatile semiconductor memory comprising the steps of:

forming a concave portion on a main surface of a semiconductor substrate;

sequentially forming a first insulation film, a charge trapping layer configuration material and a third insulation film on the main surface of said semiconductor substrate including the concave portion; and depositing a gate electrode configuration material on an upper portion of the third insulation film, and then removing the gate electrode configuration material by means of a chemically mechanically polishing method, and accordingly forming a gate electrode embedded in said concave portion.

25. A method for manufacturing a nonvolatile semiconductor memory comprising the steps of:

forming a gate insulation film on a main surface of a semiconductor substrate;

delineating a first gate electrode on the a gate insulation film;

selectively forming the charge trapping layers on both side faces of the first gate electrode;

delineating second gate electrodes electrically isolated from the first gate electrode on side faces of the charge trapping layers so that the charge trapping layers are respectively sandwiched in between the first and second gate electrodes; and forming a conductive layer on the first gate electrode and the second gate electrodes so that the first gate electrode and the second gate electrodes are electrically connected.

26. A method for manufacturing a nonvolatile semiconductor memory according to claim 25, further comprising selectively forming source and drain diffusion layers in the semiconductor substrate by using the first gate electrode, the charge trapping layer and the second gate electrode as an ion implantation mask, before forming the conductive layer.

* * * * *

UNITED STATES PATENT AND TRADEMARK OFFICE
CERTIFICATE OF CORRECTION

PATENT NO. : 6,632,714 B2  Page 1 of 1
DATED : October 14, 2003
INVENTOR(S) : Yoshikawa It is certified that error appears in the above-identified patent and that said Letters Patent is hereby corrected as shown below:

Column 45,
Line 38, change "the a gate" to -- the gate --.

Column 50,
Line 17, change "the a gate" to -- the gate --.

Signed and Sealed this

Sixteenth Day of December, 2003

JAMES E. ROGAN
*Director of the United States Patent and Trademark Office*